(12) United States Patent
Song et al.

(10) Patent No.: US 12,159,957 B2
(45) Date of Patent: Dec. 3, 2024

(54) DISPLAY DEVICE INCLUDING INSULATION LAYER HAVING A PLURALITY OF PATTERNS TO MITIGATE DISCONNECTION OF LIGHTS EMITTING ELEMENTS

(71) Applicant: Samsung Display Co., LTD., Yongin-si (KR)

(72) Inventors: Myeong Hun Song, Pyeongtaek-si (KR); Hyun Kim, Seoul (KR); Jeong Su Park, Asan-si (KR); Jong Chan Lee, Suwon-si (KR); Hyun Wook Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 458 days.

(21) Appl. No.: 17/533,835

(22) Filed: Nov. 23, 2021

(65) Prior Publication Data

US 2022/0238758 A1    Jul. 28, 2022

(30) Foreign Application Priority Data

Jan. 27, 2021   (KR) .......... 10-2021-0011245

(51) Int. Cl.
   *H01L 33/38*     (2010.01)
   *H01L 27/15*     (2006.01)
   *H01L 33/62*     (2010.01)
(52) U.S. Cl.
   CPC .......... *H01L 33/382* (2013.01); *H01L 27/156* (2013.01); *H01L 33/62* (2013.01)

(58) Field of Classification Search
CPC ........ H10K 59/131–1315; H01L 33/62; H01L 25/075–0753; H01L 25/167; H01L 27/156; H01L 33/38–387; H01L 25/08
See application file for complete search history.

(56) References Cited

U.S. PATENT DOCUMENTS

2017/0236977 A1*  8/2017  Oh .............. H01L 27/156
                                                            257/13

FOREIGN PATENT DOCUMENTS

| KR | 10-2019-0029831 | 3/2019 |
| KR | 10-2020-0088934 | 7/2020 |
| KR | 10-2020-0088947 | 7/2020 |

* cited by examiner

*Primary Examiner* — Steven M Christopher
*Assistant Examiner* — Tyler J Wiegand
(74) *Attorney, Agent, or Firm* — KILE PARK REED & HOUTTEMAN PLLC

(57) ABSTRACT

A display device includes an electrode layer including a first electrode; and a second electrode; light emitting elements on the electrode layer; an insulating layer on the light emitting elements and including openings exposing at least one of ends of a part of the light emitting elements; and a contact electrode corresponding to each of the openings, the insulating layer includes a fixing pattern between the first electrode and the second electrode; a division pattern intersecting the fixing pattern; a connection pattern connecting a first end of the fixing pattern to a first end of the division pattern; and a base portion surrounding the fixing pattern, the division pattern, and the connection pattern, the base portion is connected to a second end of the fixing pattern and a second end of the division pattern and spaced apart from the connection pattern.

24 Claims, 22 Drawing Sheets

SLU: SLU1, SLU2, SLU3, SLU4

520: 521, 522, 523, 525
521: 521A, 521B
525: 525A, 525B, 525C, 525D
AA_2: AA1, AA2
ED: ED_A, ED_B
ED_A: ED1, ED2, ED3, ED4
ED_B: ED_B1, ED_B2

OP_2: OP1, OP2, OP3, OP4, OP5
OP3: OP3_A, OP3_B, OP3_C
OP3_C: OP3_C1, OP3_C2
700_2: 710, 720, 730, 740, 750
CA: CA1, CA2
730: 731, 732, 733

DISPLAY DEVICE INCLUDING INSULATION LAYER HAVING A PLURALITY OF PATTERNS TO MITIGATE DISCONNECTION OF LIGHTS EMITTING ELEMENTS

CROSS-REFERENCE TO RELATED APPLICATION(S)

This application claims priority to and benefits of Korean Patent Application No. 10-2021-0011245 under 35 U.S.C. § 119 filed on Jan. 27, 2021 in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and may include a display panel, such as an organic light emitting display panel or a liquid crystal display panel. The light emitting display panel may include light emitting elements, for example, light emitting diodes (LED), and examples of the light emitting diode include an organic light emitting diode (OLED) using an organic material as a light emitting material and an inorganic light emitting diode using an inorganic material as a light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that prevents the separation of light emitting elements arranged or disposed in an alignment area while maintaining the number of series connections between the light emitting elements.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment a display device may include an electrode layer including a first electrode; and a second electrode, wherein the first electrode and the second electrode extend in a first direction and are spaced apart from each other in a second direction intersecting the first direction; light emitting elements disposed on the electrode layer in an area where the first electrode and the second electrode face each other; an insulating layer disposed on the light emitting elements and including openings exposing at least one of ends of a part of the light emitting elements; and a contact electrode corresponding to each of the openings, wherein the insulating layer may include a fixing pattern extending in the first direction between the first electrode and the second electrode; a division pattern intersecting the fixing pattern and extending in the second direction; a connection pattern connecting a first end of the fixing pattern to a first end of the division pattern; and a base portion surrounding the fixing pattern, the division pattern, and the connection pattern, the base portion is connected to a second end of the fixing pattern and a second end of the division pattern and spaced apart from the connection pattern.

The openings may include a first opening formed by a sidewall of the fixing pattern, a sidewall of the division pattern, and a sidewall of the base portion; a second opening formed by the sidewall of the fixing pattern, the sidewall of the division pattern, and a sidewall of the connection pattern; and a third opening surrounding the second opening and formed by the sidewall of the fixing pattern, the sidewall of the division pattern, the sidewall of the connection pattern, and the sidewall of the base portion.

The contact electrode may include a first contact electrode disposed in the first opening; a second contact electrode disposed in the second opening; and a third contact electrode disposed in the third opening of the insulating layer.

The first contact electrode may contact a sidewall of the insulating layer forming the first opening, the second contact electrode may contact a sidewall of the insulating layer forming the second opening, and the third contact electrode may contact a sidewall of the insulating layer forming the third opening.

The first opening may be disposed at a side in the first direction with respect to the division pattern and overlaps the first electrode, the second opening may be disposed at another side in the first direction with respect to the division pattern and overlaps the second electrode, and the third opening may include a first area disposed at a side in the first direction with respect to the division pattern and overlaps the second electrode, a second area disposed at another side in the first direction with respect to the division pattern and overlaps the first electrode, and a third area connecting the first area of the third opening to the second area of the third opening of the insulating layer.

The contact electrode may include a first contact electrode disposed in the first opening and electrically contacting a first end of a light emitting element of the light emitting elements, a second contact electrode disposed in the second opening and electrically contacting a second end of another light emitting element of the light emitting elements, and a third contact electrode disposed in the third opening, and the third contact electrode may include a first area disposed in the first area of the third opening and electrically contacting a second end of the light emitting element of the light emitting elements, a second area disposed in the second area of the third opening and electrically contacting a first end of the another light emitting element of the light emitting elements, and a third area electrically connecting the first area of the third contact electrode to the second area of the third contact electrode.

The light emitting elements may include a first type light emitting element having ends electrically contacting the contact electrode; and a second type light emitting element having ends not electrically contacting the contact electrode.

The fixing pattern may expose ends of the first type light emitting element, the first type light emitting element may include a first light emitting element having a first end electrically contacting the first contact electrode; and a second light emitting element having a second end electrically contacting the second contact electrode, and the second type light emitting element completely overlaps the fixing pattern and the division pattern.

The first light emitting element and the second light emitting element are electrically connected in series.

A second end of the first light emitting element may electrically contact the first area of the third contact electrode, and a first end of the second light emitting element may electrically contact the second area of the third contact electrode.

According to an embodiment a display device may include pixels disposed on a substrate, each pixel including a sub-emission area including a first sub-emission area and a second sub-emission area spaced apart from the first sub-emission area in a first direction, and a sub-area surrounding the sub-emission area, wherein each of the pixels may include an electrode layer including a first electrode and a second electrode spaced apart from each other in a second direction intersecting the first direction, wherein the first electrode and the second electrode extend in the first direction and traverse the first sub-emission area and the second sub-emission area; light emitting elements disposed between the first electrode and the second electrode in an alignment area extending in the first direction and traversing the first sub-emission area and the second sub-emission area; an insulating layer disposed on the light emitting elements and including openings spaced apart from each other; and a contact electrode corresponding to each of the openings, wherein the insulating layer may include a fixing pattern extending in the first direction in the alignment area; a division pattern disposed in the sub-area between the first sub-emission area and the second sub-emission area and extending in the second direction; a connection pattern connecting a first end of the fixing pattern to a first end of the division pattern in the sub-area; and a base portion surrounding the fixing pattern, the division pattern, and the connection pattern, connected to a second end of the fixing pattern and a second end of the division pattern, and spaced apart from the connection pattern.

The fixing pattern may be continuous in the first direction in the alignment area.

The openings may include a first opening overlapping the first electrode in the first sub-emission area and exposing a first end of the light emitting element of the light emitting elements; a second opening overlapping the second electrode in the second sub-emission area and exposing a second end of another light emitting element of the light emitting elements; and a third opening including a third opening first area overlapping the second electrode in the first sub-emission area and exposing the second end of the light emitting element of the light emitting elements; a third opening second area overlapping the first electrode in the second sub-emission area and exposing a first end of the another light emitting element of the light emitting elements; and a third opening third area connecting the third opening first area to the third opening second area.

The third opening third area may not overlap the alignment area.

The third opening third area may surround an outside of the second opening of the insulating layer.

The contact electrode may include a first contact electrode disposed in the first opening and electrically contacting the first end of the light emitting element of the light emitting elements, a second contact electrode disposed in the second opening and electrically contacting the second end of the another light emitting element of the light emitting elements, and a third contact electrode disposed in the third opening, and the third contact electrode may include a third contact electrode first area disposed in the third opening first area and electrically contacting the second end of the light emitting element of the light emitting elements; a third contact electrode second area disposed in the third opening second area and electrically contacting the first end of the another light emitting element of the light emitting elements; and a third contact electrode third area disposed in the third opening third area and electrically connecting the third contact electrode first area to the third contact electrode second area.

The third contact electrode third area may not be disposed in the alignment area.

The electrode layer may include a third electrode disposed between the first electrode and the second electrode; and a fourth electrode disposed between the second electrode and the third electrode, and the alignment area may include a first alignment area disposed between the first electrode and the third electrode; and a second alignment area disposed between the fourth electrode and the second electrode.

The light emitting elements may include a first type light emitting element having ends electrically contacting the contact electrode; and a second type light emitting element having ends not electrically contacting the contact electrode, and the first type light emitting element may include a first light emitting element disposed in the first alignment area in the first sub-emission area; a second light emitting element disposed in the second alignment area in the second sub-emission area; a third light emitting element disposed in the second alignment area in the first sub-emission area; and a fourth light emitting element disposed in the first alignment area in the second sub-emission area.

The openings may include a fourth opening disposed between the first opening and the third opening first area in the first sub-emission area, and exposing a second end of the first light emitting element and a first end of the third light emitting element, and a fifth opening disposed between the second opening and the third opening second area in the second sub-emission area and exposing a second end of the fourth light emitting element and a first end of the second light emitting element.

The contact electrode may include a fourth contact electrode disposed in the fourth opening and electrically contacting the second end of the first light emitting element and the first end of the third light emitting element, and a fifth contact electrode disposed in the fifth opening and electrically contacting the second end of the fourth light emitting element and the first end of the second light emitting element.

The first light emitting element, the second light emitting element, the third light emitting element, and the fourth light emitting element may be electrically connected in series.

The fixing pattern may include a first fixing pattern disposed in the first alignment area; and a second fixing pattern disposed in the second alignment area.

The fixing pattern and the division pattern may intersect each other, ends of the light emitting elements disposed in the sub-emission area may be exposed by the fixing pattern, and the light emitting elements disposed in the sub-area may completely overlap the fixing pattern and the division pattern.

The display device according to an embodiment may include a first sub-emission area and a second sub-emission area spaced apart from each other in a first direction, and the light emitting elements may be concentrated in the alignment area disposed across the first sub-emission area and the second sub-emission area. By forming a fixing pattern to extend in a direction in the alignment area where the light emitting elements are aligned, it is possible to prevent the light emitting elements from being separated from the alignment area. Further, although the fixing pattern may be formed to extend in a direction in the alignment area, a first light emitting element disposed in the first sub-emission area and a second light emitting element disposed in the second sub-emission area may be electrically connected in series through a contact electrode formed to bypass the outside of the sub-emission area. Therefore, the contact electrode that electrically connects the first light emitting element disposed in the first sub-emission area to the second light emitting element disposed in the second sub-emission area may be formed not to overlap the alignment area, so that it is possible to prevent the separation of the light emitting elements while maintaining the number of series connections of the light emitting elements.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
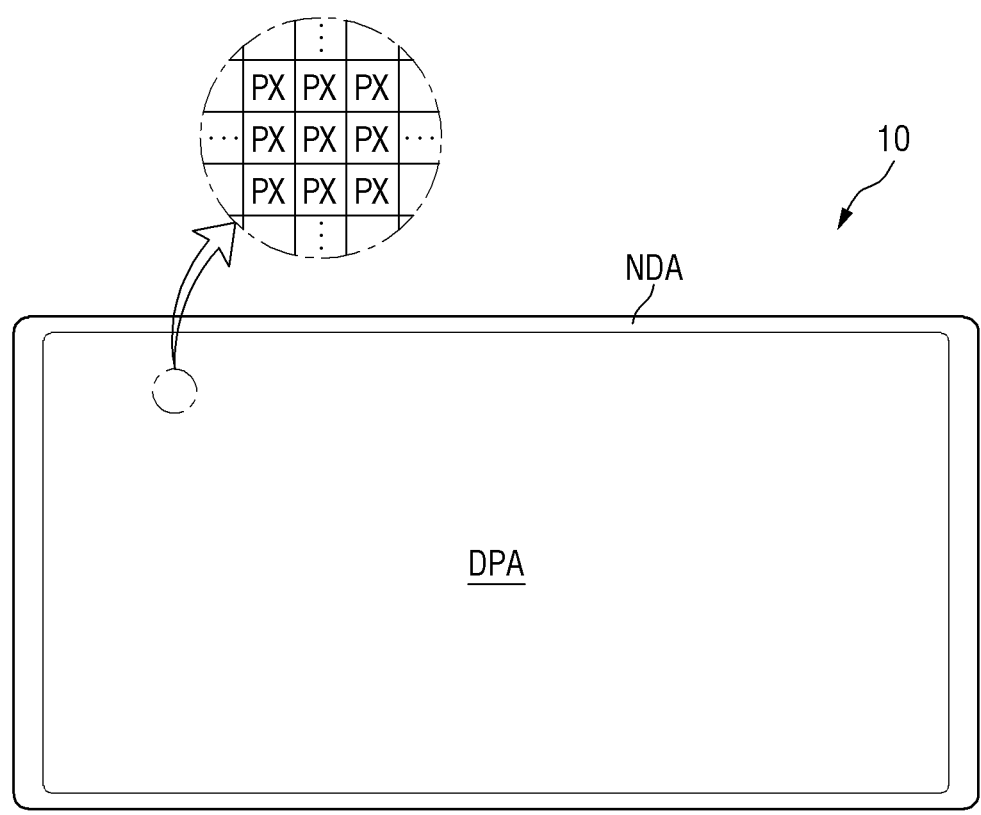
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to an embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described, but the disclosure is not limited thereto, and other display panels may be applied within the same scope of the technical spirit.

Hereinafter, a first direction DR1, a second direction DR2, and a third direction DR3 are defined in drawings of an embodiment describing the display device 10. The first direction DR1 and the second direction DR2 may be directions perpendicular to each other in one plane. The third direction DR3 may be a direction perpendicular to a plane on which the first direction DR1 and the second direction DR2 are located or disposed. The third direction DR3 is perpendicular to each of the first direction DR1 and the second direction DR2. In the embodiment describing the display device 10, the third direction DR3 indicates a thickness direction (or display direction) of the display device 10.

The display device 10 may have a substantially rectangular shape including long and short sides such that the side in the first direction DR1 may be longer than the side in the second direction DR2 in a plan view. A corner portion where the long side and the short side of the display device 10 meet may be right-angled in a plan view. However, the disclosure is not limited thereto, and it may be rounded to have a substantially curved shape. The shape of the display device 10 is not limited to the illustrated one and may be variously modified. For example, the display device 10 may have other shapes such as substantially a square shape, substantially a quadrilateral shape with substantially rounded corners (vertices), other polygonal shapes and a substantially circular shape in a plan view.

A display surface of the display device 10 may be disposed on one side or a side of the third direction DR3 which is the thickness direction. In embodiments, unless otherwise stated, in the description of the display device 10, the term "upward" refers to one side of the third direction DR3, which is a display direction, and the term "top surface" refers to a surface toward one side or a side of the third direction DR3. The term "downward" refers to the other side or another side of the third direction DR3, which is an opposite direction to the display direction, and the term "bottom surface" refers to a surface toward the other side or another side of the third direction DR3. Further, "left", "right", "upper" and "lower" indicate directions when the display panel is viewed from above. For example, "right side" indicates one side or a side of the first direction DR1, "left side" indicates the other side or another side of the first direction DR1, "upper side" indicates one side or a side of the second direction DR2, and "lower side" indicates the other side or another side of the second direction DR2.

The display device 10 may include the display area DPA and a non-display area NDA. The display area DPA is an area where a screen can be displayed, and the non-display area NDA is an area where a screen is not displayed.

The shape of the display area DPA may substantially follow the shape of the display device 10. For example, the shape of the display area DPA may have a substantially rectangular shape similar to the overall shape of the display device 10 in a plan view. The display area DPA may substantially occupy the center of the display device 10.

The display area DPA may include pixels PX. The pixels PX may be arranged or disposed in a matrix. The shape of each pixel PX may be a substantially rectangular or substantially square shape in a plan view. The pixels PX may be alternately disposed in a stripe type or a PenTile® type. Each pixel PX may include a light emitting element made of inorganic particles.

The non-display area NDA may be disposed around the display area DPA. The non-display area NDA may completely or partially surround or may be adjacent to the display area DPA. The non-display area NDA may form a bezel of the display device 10.

Figure 2:
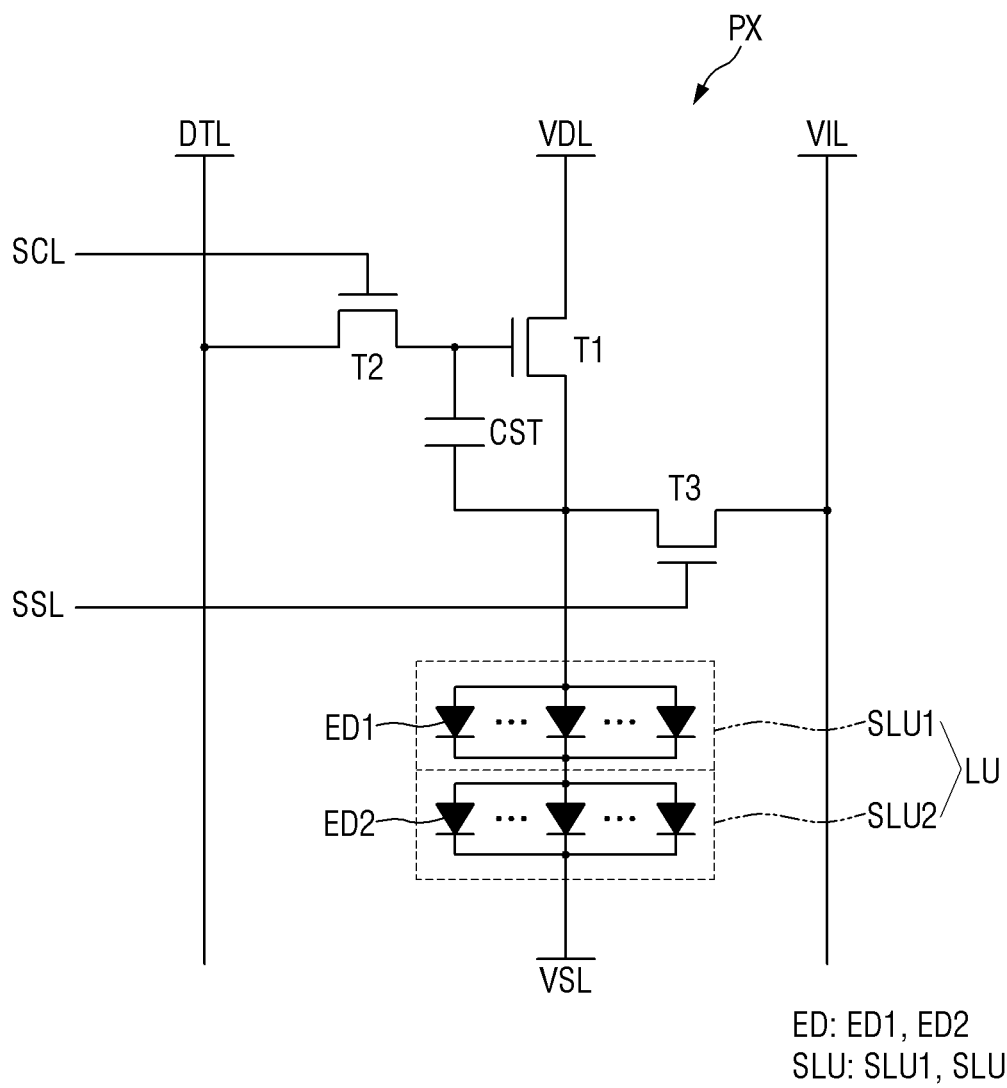
FIG. 2 is a schematic diagram of an equivalent circuit of a pixel of a display device according to an embodiment.

FIG. 2 is a schematic diagram of an equivalent circuit of a pixel of a display device according to an embodiment.

Referring to FIG. 2, each pixel PX of the display device 10 according to an embodiment may include a light source unit LU, transistors T1, T2, and T3, and a capacitor CST. The transistors T1, T2, and T3 may include a first transistor T1, a second transistor T2, and a third transistor T3.

The light source unit LU may include light emitting elements ED and emits light in response to the current supplied through the first transistor T1. One end of the light source unit LU may be electrically connected to the source electrode of the first transistor T1, and the other end of the light source unit LU may be electrically connected to a second voltage line VSL to which a low potential voltage (hereinafter, referred to as "second power voltage") lower than a high potential voltage (hereinafter, referred to as "first power voltage") of a first voltage line VDL is supplied.

The light source unit LU may include a first electrode, a second electrode, and light emitting groups SLU (SLU1 and SLU2) arranged therebetween and electrically connected in series. In an embodiment, the light source unit LU may include a first light emitting group SLU1 and a second light emitting group SLU2 electrically connected in series. However, the disclosure is not limited thereto, and the light source unit LU may include one light emitting group SLU, or may include a larger number of light emitting groups SLU electrically connected in series.

Each of the light emitting groups SLU (SLU1 and SLU2) may include one or more light emitting elements ED electrically connected in parallel. The light emitting elements ED included in each light emitting group SLU may emit light of a wavelength band by the electrical signals transmitted from the first electrode and the second electrode. For example, the first light emitting group SLU1 may include first light emitting elements ED1 electrically connected in parallel, and the second light emitting group SLU2 may include second light emitting elements ED2 electrically connected in parallel. The first light emitting element ED1 and the second light emitting element ED2 may be electrically connected in series.

On the other hand, although it is illustrated in the drawing that the first light emitting elements ED1 and the second light emitting elements ED2 included in each of the light emitting groups SLU (SLU1 and SLU2) of the light source unit LU are arranged in the same direction and electrically connected in parallel, the disclosure is not limited thereto. For example, a part and another part of the first light emitting elements ED1 included in the first light emitting group SLU1 may be electrically connected to be arranged in opposite directions, or a part and another part of the second light emitting elements ED2 included in the second light emitting group SLU2 may be electrically connected to be arranged in opposite directions.

For example, one end or an end of the first light emitting element ED1 included in the first light emitting group SLU1 of the light source unit LU may be electrically connected to the source electrode of the first transistor T1 through the first electrode of the light source unit LU, and the other end of the first light emitting element ED1 included in the first light emitting group SLU1 of the light source unit LU may be electrically connected to one end or an end of the second light emitting element ED2 included in the second light emitting group SLU2 of the light source unit LU. Further, one end or an end of the second light emitting element ED2 included in the second light emitting group SLU2 of the light source unit LU may be electrically connected to the other end of the first light emitting element ED1 included in the first light emitting group SLU1, and the other end of the second light emitting element ED2 included in the second light emitting group SLU2 of the light source unit LU may be electrically connected to the second voltage line VSL through the second electrode of the light source unit LU.

The first transistor T1 adjusts the current flowing from the first voltage line VDL to which the first power voltage is supplied toward the light source unit LU based on the voltage difference between the gate electrode and the source electrode. In one example, the first transistor T1 may be a driving transistor for driving the light source unit LU. The gate electrode of the first transistor T1 may be electrically connected to the second source or drain electrode of the second transistor T2, the source electrode of the first transistor T1 may be electrically connected to the first electrode of the light source unit LU, and the drain electrode of the first transistor T1 may be electrically connected to the first voltage line VDL to which the first power voltage is applied.

The second transistor T2 is turned on by a scan signal of the scan line SCL to electrically connect the data line DTL to the gate electrode of the first transistor T1. The gate electrode of the second transistor T2 may be electrically connected to the scan line SCL, the second source or drain electrode of the second transistor T2 may be electrically connected to the gate electrode of the first transistor T1, and the first source or drain electrode of the second transistor T2 may be electrically connected to the data line DTL.

The third transistor T3 is turned on by a sensing signal of a sensing line SSL to electrically connect an initialization voltage line VIL to the source electrode of the first transistor T1. The gate electrode of the third transistor T3 may be electrically connected to the sensing line SSL, the first source or drain electrode of the third transistor T3 may be electrically connected to the initialization voltage line VIL, and the second source or drain electrode of the third transistor T3 may be electrically connected to the source electrode of the first transistor T1.

In an embodiment, the first source or drain electrode and the second source or drain electrode of each of the second and third transistors T2 and T3 may be the source electrode and the drain electrode, respectively. However, the disclosure is not limited thereto, and the first source or drain electrode and the second source or drain electrode thereof may be the drain electrode and the source electrode, respectively.

The capacitor CST is formed between the gate electrode of the first transistor T1 and the source electrode of the first transistor T1. The capacitor CST stores the difference voltage between the gate voltage and the power voltage of the first transistor T1.

Each of the first to third transistors T1, T2, and T3 may be formed as a thin film transistor. Although FIG. 2 describes the case where the first to third transistors T1, T2, and T3 are formed as an N-type metal oxide semiconductor field effect transistor (MOSFET), the disclosure is not limited thereto. For example, the first to third transistors T1, T2, and T3 may be formed as a P-type MOSFET, or a part of the first to third transistors T1, T2, and T3 may be formed as the N-type MOSFET, and another part of the first to third transistors T1, T2, and T3 may be formed as the P-type MOSFET.

Figure 3:
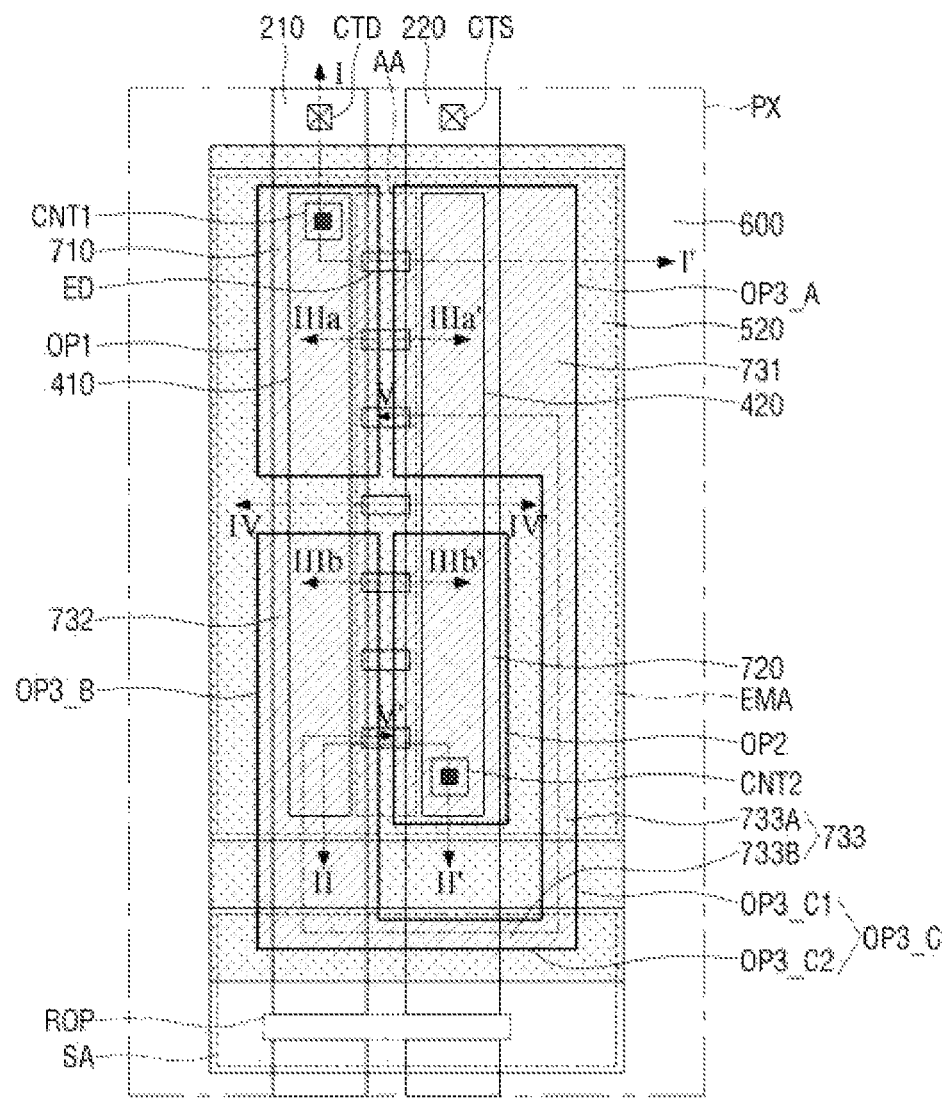
FIG. 3 is a schematic plan view illustrating one pixel of FIG. 2.
Figure 4:
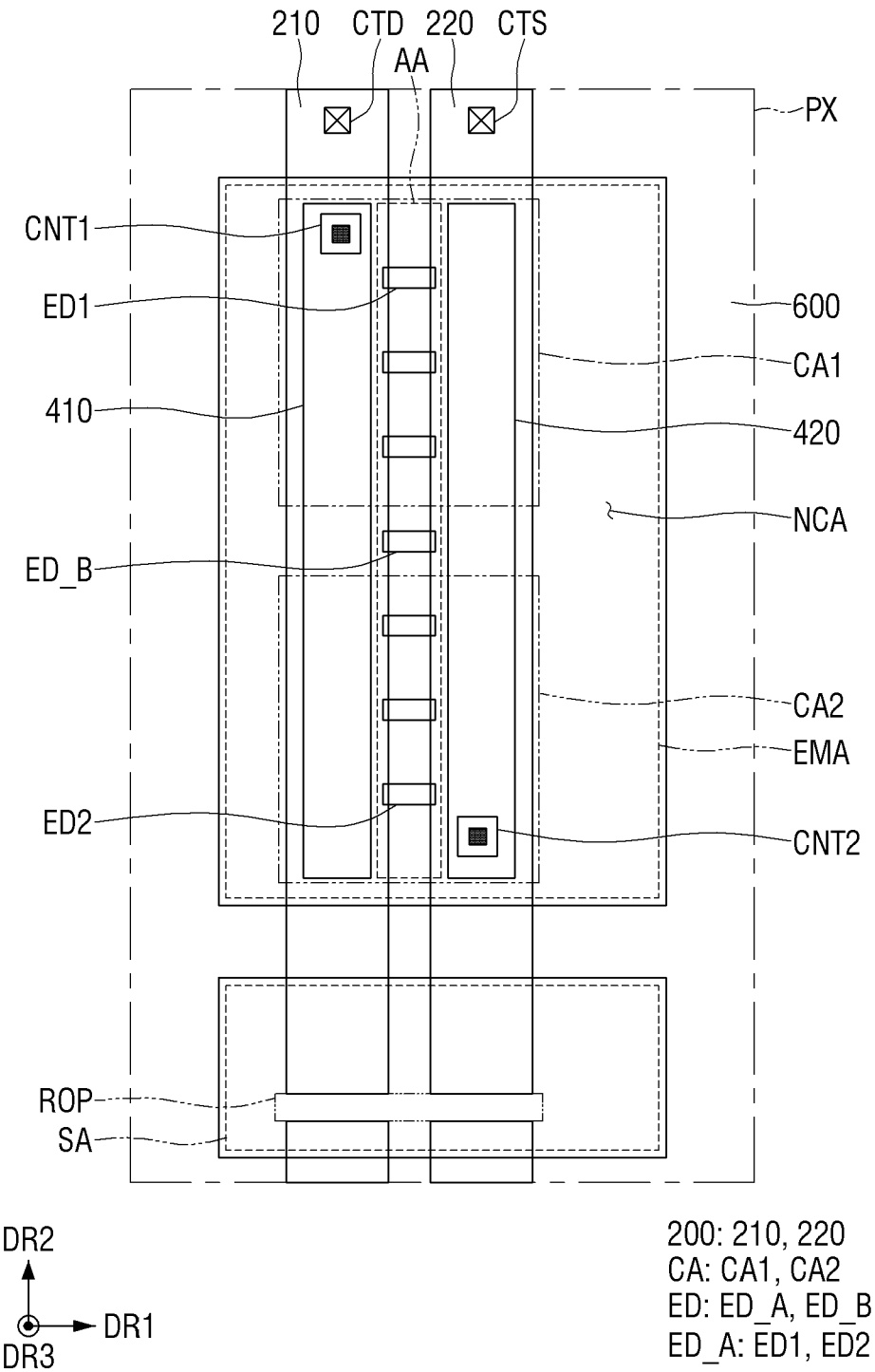
FIG. 4 is a schematic plan view illustrating areas included in one pixel of the display device shown in FIG. 3.
Figure 5:
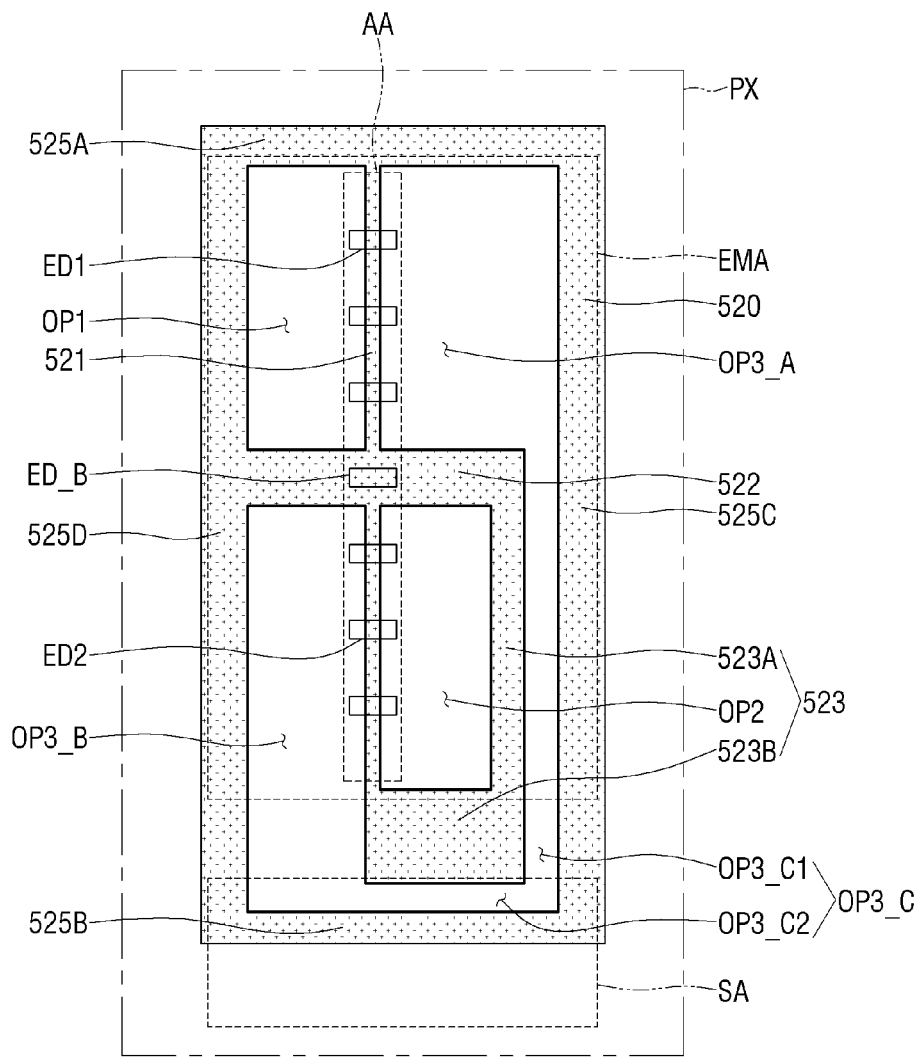
FIG. 5 is a schematic plan view illustrating a first insulating layer and openings of the first insulating layer included in one pixel of the display device shown in FIG. 3.
Figure 6:
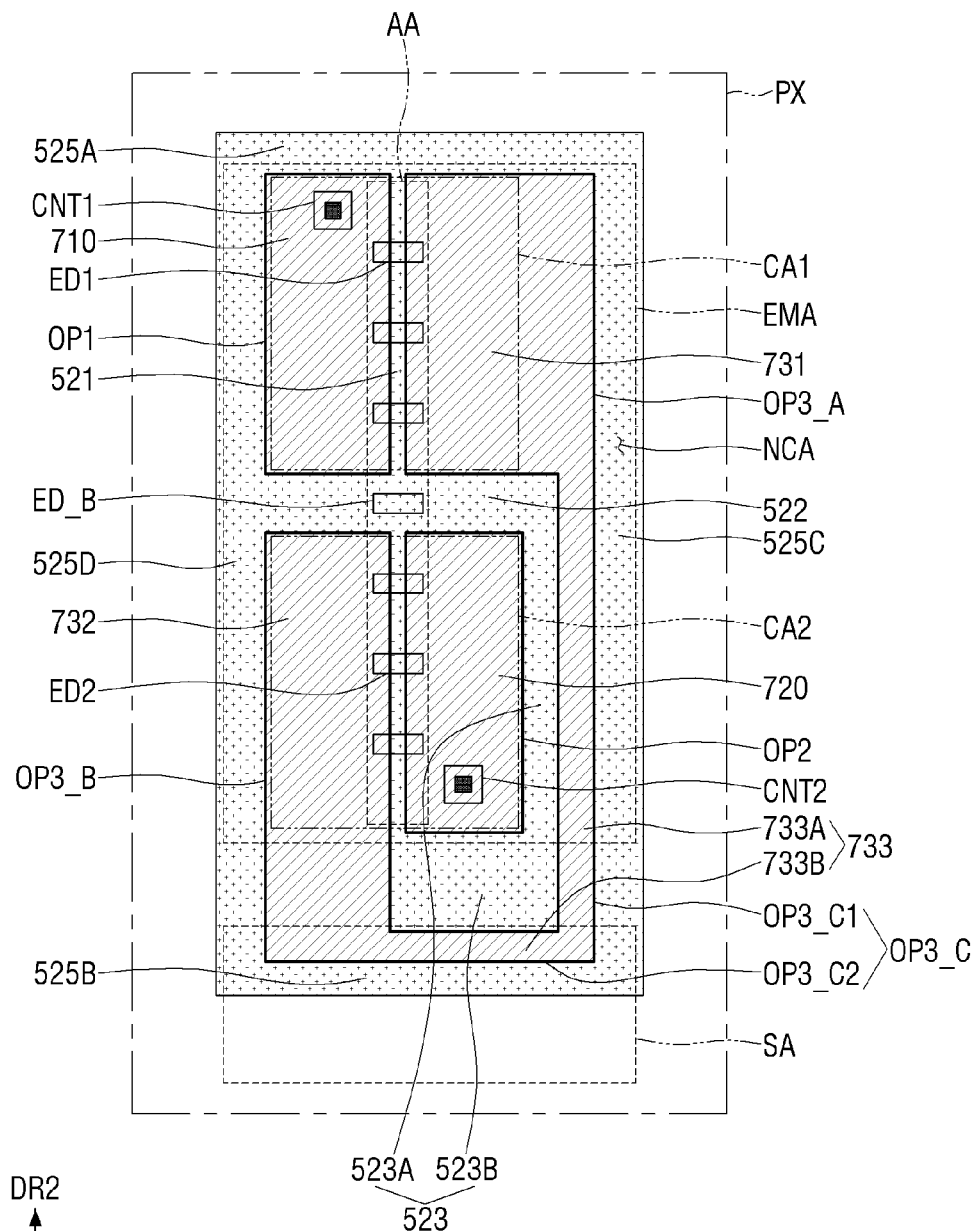
FIG. 6 is a schematic plan view illustrating a relative plan layout between contact electrodes and the first insulating layer included in one pixel of the display device shown in FIG. 3.

FIG. 3 is a plan view illustrating one pixel of FIG. 2. FIG. 4 is a schematic plan view illustrating areas included in one pixel of the display device shown in FIG. 3. FIG. 5 is a plan view illustrating a first insulating layer and openings of the first insulating layer included in one pixel of the display device shown in FIG. 3. FIG. 6 is a plan view illustrating a relative plan layout between contact electrodes and the first insulating layer included in one pixel of the display device shown in FIG. 3.

Referring to FIG. 3, one pixel PX of the display device 10 according to the embodiment may include a first bank 400, an electrode layer 200, a second bank 600, light emitting elements ED, a first insulating layer 520, and a contact electrode 700.

Hereinafter, the plan layout of members arranged in one pixel PX of the display device 10 according to the embodiment will be briefly described with reference to FIGS. 3 to 6.

First, the areas included in one pixel PX will be described with reference to FIGS. 3 and 4.

Each pixel PX of the display device 10 may include an emission area EMA and a non-emission area (not shown). The emission area EMA is an area where the light emitted from the light emitting element ED is emitted, and the non-emission area is an area where no light is emitted because the light emitted from the light emitting element ED does not reach. The non-emission area may include a first sub-area SA. The emission area EMA and the first sub-area SA of the non-emission area may be defined as areas partitioned by the second bank 600 to be described later.

The emission area EMA may include an area in which the light emitting element ED is disposed and an area adjacent thereto. The emission area may further include a region in which the light emitted from the light emitting element ED is reflected or refracted by another member and emitted in the display direction of the display device 10.

The emission area EMA may include an alignment area AA where the light emitting elements ED are aligned. The alignment area AA may be an area where the light emitting elements ED are concentrated in the emission area EMA. The alignment area AA may be an imaginary area defined by the electrode layer 200 and the first bank 400.

The emission area EMA may further include a sub-emission area CA and a second sub-area NCA. The sub-emission area CA is an area where the light emitting groups SLU (SLU1 and SLU2) including the light emitting elements ED described with reference to FIG. 2 are arranged, and the second sub-area NCA may be an area other than the sub-emission area CA in the emission area EMA. The second sub-area NCA may be disposed to surround the sub-emission area CA in the emission area EMA.

The areas of the emission area EMA, for example, the alignment area AA, the sub-emission area CA, and the second sub-area NCA, may be defined by the substantially planar shape of the members included in one pixel PX.

The light emitting element ED may not be disposed in the first sub-area SA located in the non-emission area. The first sub-area SA may be disposed below the emission area EMA (or the other side or another side in the second direction DR2) in one pixel PX. The first sub-area SA may be disposed between the emission areas EMA of the pixels PX adjacent to each other in the second direction DR2.

The first sub-area SA may include a separation portion ROP. The separation portion ROP of the first sub-area SA may be an area where electrodes 210 and 220 of the electrode layers 200 included in different pixels PX adjacent to each other along the second direction DR2 are separated from each other.

Hereinafter, the substantially planar shapes of the members included in the one pixel PX will be described.

The second bank 600 may include portions extending in the first direction DR1 and the second direction DR2 in a plan view to be arranged in a grid pattern over the entire surface of the display area DPA. The second bank 600 may be disposed across the boundary of each of the pixels PX to delimit the neighboring pixels PX. The second bank 600 may be disposed to surround the emission area EMA and the first sub-area SA in each pixel PX to distinguish them. For example, the emission area EMA and the first sub-area SA of each pixel PX may be defined by the second bank 600.

Since the emission area EMA and the first sub-area SA are distinguished by the second bank 600, the light emitting elements ED may be arranged in the emission area EMA and may not be arranged in the first sub-area SA. For example, in the manufacturing process of the display device 10, the step of aligning the light emitting elements ED may be executed by an inkjet printing step of injecting ink in which the light emitting elements ED are dispersed. Since the second bank 600 distinguishes the emission area EMA and the first sub-area SA, the ink in which the light emitting elements ED are dispersed may be injected into the emission area EMA in the inkjet printing step. Therefore, the light emitting elements ED may be arranged in the emission area EMA and may not be arranged in the first sub-area SA.

The alignment area AA may be defined by the first bank 400, the electrode layer 200, and the light emitting elements ED. In order to explain the alignment area AA, the plan layout of the first bank 400, the electrode layer 200, and the light emitting elements ED arranged in one pixel PX will be described.

The first bank 400 may be disposed in the emission area EMA. The first bank 400 may include sub-banks 410 and 420 spaced apart from each other. The sub-banks 410 and 420 may assist the electrode layer 200 in the process of aligning the light emitting elements ED in the manufacturing process of the display device 10 so that the light emitting elements ED may be arranged in the alignment area AA. The separation space between the sub-banks 410 and 420 of the first bank 400 may provide an area where the light emitting elements ED are arranged.

Each of the sub-banks 410 and 420 of the first bank 400 may have a shape extending in the second direction DR2 in the emission area EMA. Each of the sub-banks 410 and 420 may extend in the second direction DR2 and may be spaced apart from the second bank 600 surrounding the emission area EMA. The length of each of the sub-banks 410 and 420 in the second direction DR2 may be smaller than the length of the emission area EMA surrounded by the second bank 600 in the second direction DR2. However, the disclosure is not limited thereto, and the length of each of the sub-banks 410 and 420 in the second direction DR2 may be greater than the length of the emission area EMA surrounded by the second bank 600 in the second direction DR2, and parts of the sub-banks 410 and 420 may overlap the second bank 600 in the third direction DR3.

The first bank 400 may include the first sub-bank 410 and the second sub-bank 420 extending in the second direction DR2 and spaced apart from each other in the first direction DR1. For example, the first sub-bank 410 may be located on the left side in the emission area EMA, and the second sub-bank 420 may be located on the right side in the emission area EMA while being spaced apart from the first sub-bank 410 in the first direction DR1. The first sub-bank 410 and the second sub-bank 420 may face each other while being separated from each other in the first direction DR1. The light emitting elements ED may be arranged in the area where the first sub-bank 410 and the second sub-bank 420 face each other while being spaced apart from each other.

The electrode layer 200 may include the electrodes 210 and 220 spaced apart from each other. The electrodes 210 and 220 of the electrode layer 200 may be used for generating an electric field in the pixel PX to align the light emitting elements ED in the manufacturing process of the display device 10. The electrodes 210 and 220 may be formed as alignment lines extending in the second direction DR2 in the manufacturing process of the display device 10 and may be used for generating the electric field in the pixel PX to align the light emitting elements ED. The light emitting element ED may be aligned by a dielectrophoretic force induced by the electric field generated on the alignment lines. After the step of aligning the light emitting elements ED, the alignment lines may be separated at the separation portion ROP of the first sub-area SA to form the electrodes 210 and 220.

Each of the electrodes 210 and 220 of the electrode layer 200 may have a shape extending in the second direction DR2. The electrodes 210 and 220 may extend in the second direction DR2 and may be spaced apart from each other in the first direction DR1. The electrode layer 200 may include a first electrode 210 and a second electrode 220 extending in the second direction DR2 and spaced apart from each other in the first direction DR1.

The first electrode 210 may extend in the second direction DR2 to be disposed across the emission area EMA and the first sub-area SA. The first electrode 210 may be located on the left side of each pixel PX in a plan view. The first electrode 210 may extend in the second direction DR2 in a plan view and may be separated from a first electrode 210 of another pixel PX adjacent thereto in the second direction DR2 at the separation portion ROP of the first sub-area SA.

The first electrode 210 may be disposed on the first sub-bank 410 in the emission area EMA. The first electrode 210 may overlap the first sub-bank 410 in the third direction DR3 in the emission area EMA.

The second electrode 220 may extend in the second direction DR2 to be disposed across the emission area EMA and the first sub-area SA. The second electrode 220 may be located on the right side of each pixel PX in a plan view. The second electrode 220 may extend in the second direction DR2 in a plan view and may be separated from a second electrode 220 of another pixel PX adjacent thereto in the second direction DR2 at the separation portion ROP of the first sub-area SA.

The second electrode 220 may be disposed on the second sub-bank 420 in the emission area EMA. The second electrode 220 may overlap the second sub-bank 420 in the third direction DR3 in the emission area EMA.

The first electrode 210 disposed on the first sub-bank 410 and the second electrode 220 disposed on the second sub-bank 420 may be spaced apart from each other in the first direction DR1 in the emission area EMA. The first electrode 210 and the second electrode 220 may face each other while being spaced apart from each other in the emission area EMA. The gap between the first sub-bank 410 and the second sub-bank 420 in the first direction DR1 may be greater than the gap between the first electrode 210 and the second electrode 220 in the first direction DR1. The light emitting elements ED may be arranged in the area where the first electrode 210 and the second electrode 220 face each other while being spaced apart from each other in the emission area EMA.

The first electrode 210 may be electrically connected to a circuit element layer CCL (see FIG. 7) to be described later through a first electrode contact hole CTD, and the second electrode 220 may be electrically connected to the circuit element layer CCL (see FIG. 7) to be described layer through a second electrode contact hole CTS. For example, the first electrode 210 may be electrically connected to the first transistor T1 through the first electrode contact hole CTD, and the second electrode 220 may be electrically connected to the second voltage line VSL through the second electrode contact hole CTS.

The light emitting elements ED may be arranged in the emission area EMA. The light emitting elements ED may be arranged between the electrodes 210 and 220 arranged on the first bank 400 in the emission area EMA. The light emitting elements ED may be arranged in the area where the first electrode 210 disposed on the first sub-bank 410 and the second electrode 220 disposed on the second sub-bank 420 face each other while being spaced apart from each other.

The light emitting element ED may have a shape extending in one direction, and the extension direction of the light emitting element ED may be substantially perpendicular to the extension direction of the electrodes 210 and 220. However, the disclosure is not limited thereto, and the light emitting element ED may extend in an oblique direction with respect to the extension direction of the electrodes 210 and 220.

The light emitting elements ED may be arranged in the area where the first sub-bank 410 and the second sub-bank 420 face each other while being spaced apart from each other such that at least one of both ends is disposed on the first electrode 210 or the second electrode 220. For example, the light emitting elements ED may be arranged in the area where the first sub-bank 410 and the second sub-bank 420 face each other while being spaced apart from each other such that both ends are disposed on the first electrode 210 and the second electrode 220. The relative plan layout relationship between the light emitting elements ED, the first bank 400, and the electrode layer 200 may be obtained by arranging the light emitting elements ED using the electric field generated between the first electrode 210 and the second electrode 220 by applying alignment signals to the first electrode 210 and the second electrode 220 in the manufacturing process of the display device 10.

As described above, the alignment area AA located in the emission area EMA may be an area where the light emitting elements ED are concentrated in the step of aligning the light emitting elements ED in the manufacturing process of the display device 10. The alignment step of the light emitting elements ED may be executed by injecting the ink in which the light emitting elements ED are dispersed into the emission area EMA partitioned by the second bank 600 and using the electric field generated between the first electrode 210 and the second electrode 220 by applying the alignment signals to the first electrode 210 and the second electrode 220. The light emitting elements ED may be aligned such that both ends are arranged on the first electrode 210 and the second electrode 220 between the first sub-bank 410 and the second sub-bank 420 on which the first electrode 210 and the second electrode 210 are arranged, respectively, by the electric field generated between the first electrode 210 and the second electrode 220 in the emission area EMA. Therefore, the alignment area AA may be defined as an area where the sub-banks 410 and 420 on which the electrodes 210 and 220 are arranged face each other while being spaced apart from each other. The light emitting elements ED may be aligned to be substantially arranged in the alignment area AA in the manufacturing process of the display device 10.

Since the alignment area AA is defined as the area between the sub-banks 410 and 420 in the emission area EMA, the substantially planar shape of the alignment area AA may be substantially similar to the substantially planar shape of the area where the sub-banks 410 and 420 face each other while being spaced apart from each other. In an embodiment in which the first sub-bank 410 and the second sub-bank 420 have substantially planar shapes extending in the second direction DR2 and are spaced apart from each other in the first direction DR1, the substantially planar shape of the area where the first sub-bank 410 and the second sub-bank 420 face each other while being spaced apart from each other may also extend along the second direction DR2. Therefore, the light emitting elements ED may be spaced apart from each other along the second direction DR2 in the alignment area AA. The light emitting elements ED may be arranged in one column across the entire alignment area AA, and the gap between the light emitting elements ED adjacent to each other in the second direction DR2 may be random.

The emission area EMA may include the sub-emission area CA and the second sub-area NCA.

The sub-emission area CA may be an area where the light emitting elements ED and the contact electrode 700 are arranged and the light emitting group SLU of FIG. 2 is formed by the contact between the contact electrode 700 and both ends of the light emitting elements ED. The light emitting elements ED arranged in the sub-emission area CA may be in contact with the contact electrode 700 to receive an electrical signal, or may be electrically connected to each other to emit light of a wavelength band.

The second sub-area NCA may be an area where the light emitting elements ED are not arranged or both ends of the light emitting elements ED are not in contact with the contact electrode 700. For example, the second sub-area NCA may include an area where the light emitting elements ED are not arranged. Or, the light emitting elements ED may be arranged in the second sub-area NCA, but the light emitting elements ED arranged in the second sub-area NCA are not in contact with the contact electrode 700 and thus do not receive an electrical signal. Therefore, the light emitting elements ED arranged in the second sub-area NCA may not emit light.

Since the lights emitted from the light emitting elements ED arranged in the sub-emission area CA reach the second sub-area NCA including the sub-emission area CA, the emission area EMA may include the sub-emission area CA and the second sub-area NCA.

The light emitting elements ED arranged in the alignment area AA may include a first type light emitting element ED_A and a second type light emitting element ED_B. The first type light emitting element ED_A and the second type light emitting element ED_B may be classified based on the contact relationship with the contact electrode 700.

Some or part of the light emitting elements ED that are in electrical contact with the contact electrodes 700 may be the first type light emitting elements ED_A, and some other or other parts of light emitting elements ED that are not in electrical contact with the contact electrode 700 may be the second type light emitting elements ED_B. Therefore, the first type light emitting element ED_A may be disposed in the sub-emission area CA where the light emitting elements ED are in contact with the contact electrode 700, and the second type light emitting element ED_B may be disposed in the second sub-area NCA where the light emitting elements ED are not in contact with the contact electrode 700.

The sub-emission area CA may include the sub-emission areas CA (CA1 and CA2) spaced apart from each other, and the second sub-area NCA may be disposed to surround the sub-emission areas CA (CA1 and CA2) in the emission area EMA. The shapes or the positions of the sub-emission areas CA (CA1 and CA2) and the second sub-area NCA may be related to the shapes or the arrangement of the first insulating layer 520, the contact electrode 700, and the light emitting elements ED.

The sub-emission areas CA may include a first sub-emission area CA1 and a second sub-emission area CA2. The first sub-emission area CA1 and the second sub-emission area CA2 may be arranged along the second direction DR2. The first sub-emission area CA1 and the second sub-emission area CA2 may be spaced apart from each other in the second direction DR2. For example, the first sub-emission area CA1 may be located on the upper side in the emission area EMA, and the second sub-emission area CA2 may be located on the lower side in the emission area EMA. The first sub-emission area CA1 and the second sub-emission area CA2 may be spaced apart from each other with a division pattern (or second pattern) 522 (see FIG. 5) of the first insulating layer 520 to be described later interposed therebetween.

The light emitting group SLU may be disposed in each of the sub-emission areas CA spaced apart from each other. For example, the first light emitting group SLU1 (see FIG. 2) may be disposed in the first sub-emission area CA1, and the second light emitting group SLU2 (see FIG. 2) may be disposed in the second sub-emission area CA2. Therefore, the light emitting elements ED (or the first type light emitting elements ED_A) arranged in each of the sub-emission areas CA may be electrically connected in series. For example, the light emitting element ED (or the first type light emitting element ED_A) disposed in the first sub-emission area CA1 and the light emitting element ED (or the first type light emitting element ED_A) disposed in the second sub-emission area CA2 may be electrically connected in series. Therefore, among the first type light emitting elements ED_A arranged in the sub-emission area CA, the first type light emitting element ED_A disposed in the first sub-emission area CA1 may be defined as the first light emitting element ED_A, and the first type light emitting element ED_A disposed in the second sub-emission area CA2 may be defined as the second light emitting element ED2. The first light emitting element ED1 disposed in the first sub-emission area CA1 and the second light emitting element ED2 disposed in the second sub-emission area CA2 may be electrically connected in series. The light emitting elements ED (or the first type light emitting elements ED_A) arranged in the same sub-emission area CA may be electrically connected in parallel, and the light emitting elements ED (or the first type light emitting elements ED_A) arranged in the sub-emission areas CA adjacent to each other while being spaced apart from each other may be electrically connected in series.

The second sub-area NCA may be disposed to surround the first sub-emission area CA1 and the second sub-emission area CA2. For example, the second sub-area NCA may include the area located between the first sub-emission area CA1 and the second sub-emission area CA2, and the area surrounding the outsides of the first sub-emission area CA1 and the second sub-emission area CA2. The second type light emitting element ED_B may be disposed in the second sub-area NCA located between the first sub-emission area CA1 and the second sub-emission area CA2. The first light emitting element ED1 disposed in the first sub-emission area CA1 and the second light emitting element ED2 disposed in the second sub-emission area CA2 may be electrically connected in series in the second sub-area NCA surrounding the outsides of the first sub-emission area CA1 and the second sub-emission area CA2.

The first insulating layer 520 may be disposed on the light emitting element ED, the electrode layer 200, and the second bank 600. The first insulating layer 520 may be disposed across the emission area EMA and the non-emission area in one pixel PX. The first insulating layer 520 may be disposed on the light emitting elements ED and serve to fix the light emitting elements ED to prevent separation of the light emitting elements ED from the alignment area AA in a subsequent step of the alignment step of the light emitting elements ED in the manufacturing process of the display device 10.

The first insulating layer 520 may include openings OP penetrating the first insulating layer 520 and spaced apart from each other. The openings OP may be patterned. The openings OP may be defined by patterns 521, 522, and 523 and a base portion 525 of the first insulating layer 520. The first insulating layer 520 may include the openings OP and serve to assist a mask step executed in a step of patterning the contact electrode 700 to be described later in the manufacturing process of the display device 10. Further, as described above, the first insulating layer 520 may also serve to divide the sub-emission areas CA included in the emission area EMA and distinguish them.

Hereinafter, the substantially planar shapes of the first insulating layer 520 and the contact electrode 700 will be described in detail with reference to FIGS. 3, 5, and 6. In the following, the substantially planar shapes of the first insulating layer 520 and the contact electrode 700 will be described, and the arrangement relationship between the patterns of the first insulating layer 520 and other members will be described in detail with reference to the schematic cross-sectional view of the display device 10 to be described later.

In accordance with an embodiment, the first insulating layer 520 may include a fixing pattern 521, a division pattern 522, a connection pattern 523, and a base portion 525. Hereinafter, the base portion 525 may also be referred to as a first pattern 525 of the first insulating layer 520, the fixing pattern 521 may also be referred to as a second pattern 521 of the first insulating layer 520, the division pattern 522 may also be referred to as a third pattern 522 of the first insulating layer 520, and the connection pattern 523 may also be referred to as a fourth pattern 523 of the first insulating layer 520.

The fixing pattern 521 may be disposed in the emission area EMA. The fixing pattern 521 may be disposed in the alignment area AA in the emission area EMA. The fixing pattern 521 may have a shape extending in the second direction DR2 in the alignment area AA. The fixing pattern 521 may extend in the second direction DR2 without disconnection (or may be continuous) in the alignment area AA. Therefore, the length of the fixing pattern 521 in the second direction DR2 may be greater than or equal to the length of the alignment area AA in the second direction DR2. Furthermore, the length of the fixing pattern 521 in the second direction DR2 may be greater than or equal to the length of the emission area EMA defined by the second bank 600 in the second direction DR2.

The fixing pattern 521 may be disposed on the light emitting elements ED and the members disposed therebelow and exposed by the light emitting elements ED in the alignment area AA. The fixing pattern 521 may overlap parts of the light emitting elements ED in the third direction DR3. The fixing pattern 521 may be disposed between the first sub-bank 410 and the second sub-bank 420 to partially surround the outer surfaces of the light emitting elements ED.

The fixing pattern 521 may have a shape extending in the second direction DR2 in the alignment area AA. A part of the fixing pattern 521 may overlap the light emitting elements ED in the third direction DR3 in the alignment area AA, and another part of the fixing pattern 521 may overlap the member disposed therebelow and exposed by the light emitting elements ED in the third direction DR3 in the alignment area AA. The fixing pattern 521 may be disposed on the light emitting elements ED and the member disposed therebelow and exposed by the light emitting elements ED and serve to fix the light emitting elements ED to prevent separation of the light emitting elements ED from the alignment area AA.

The fixing pattern 521 may be disposed across the first sub-emission area CA1, the second sub-emission area CA2, and the second sub-area NCA disposed between the first sub-emission area CA1 and the second sub-emission area CA2 that overlap the alignment area AA. The fixing pattern 521 may be disposed across the first light emitting elements ED1, the second light emitting elements ED2, and the second type light emitting element ED_B. Since the fixing pattern 521 extends in the second direction DR2 without disconnection in the alignment area AA, the second type light emitting element ED_B arranged in the second sub-area NCA overlapping the alignment area AA may also be fixed by the fixing pattern 521. Therefore, the light emitting elements ED arranged across the entire alignment area AA are fixed by the fixing pattern 521, so that it is possible to prevent separation of the light emitting elements ED arranged in the alignment area AA in the subsequent step of the alignment step of the light emitting elements ED in the manufacturing process of the display device 10. Accordingly, it is possible to improve the reliability of the display device 10 by preventing damage, contamination, or the like of other members that may occur due to the separation of the light emitting elements ED.

The fixing pattern 521 may expose both ends of the first type light emitting element ED_A disposed in the alignment area AA overlapping the sub-emission area CA. Therefore, the width of the fixing pattern 521 in the first direction DR1 may be smaller than the extension length of the light emitting element ED. Since the fixing pattern 521 is formed to expose both ends of the light emitting element ED in the sub-emission area CA, the contact electrode 700 to be describe later may be in contact with both ends of the light emitting element ED exposed by the fixing pattern 521.

The division pattern 522 may be disposed in the emission area EMA. The division pattern 522 may be disposed between the first sub-emission area CA1 and the second sub-emission area CA2 in the emission area EMA. The first sub-emission area CA1 and the second sub-emission area CA2 may face each other while being spaced apart from each other with the division pattern 522 interposed therebetween. The division pattern 522 may be disposed between the first sub-emission area CA1 and the second sub-emission area CA2 to distinguish them.

The division pattern 522 may extend in the first direction DR1 intersecting the second direction DR2 between the first sub-emission area CA1 and the second sub-emission area CA2. The division pattern 522 may extend in the first direction DR1 to be disposed in the alignment area AA overlapping the second sub-area NCA. The division pattern 522 may intersect the fixing pattern 521 in a plan view, and the division pattern 522 and the fixing pattern 521 may be formed as one integrated pattern. For example, one integrated pattern of the division pattern 522 and the fixing pattern 521 may have a substantially cross shape in a plan view.

The division pattern 522 may be disposed on the electrode layer 200, the first bank 400, and the second type light emitting element ED_B in the second sub-area NCA disposed between the sub-emission areas CA. The division pattern 522 may overlap the electrode layer 200, the first bank 400, and the second type light emitting element ED_B in the third direction DR3 in the second sub-area NCA. The division pattern 522 may completely cover or overlap the second type light emitting element ED_B disposed in the second sub-area NCA. Therefore, the width of the division pattern 522 in the second direction DR2 may be greater than the diameter of the light emitting element ED. Although the width of the fixing pattern 521 in the first direction DR1 is smaller than the length of the second type light emitting element ED_B, the second type light emitting element ED_B may be completely covered or overlapped by the fixing pattern 521 and the division pattern 522 because the substantially planar shape of the division pattern 522 extends in the first direction DR1 and the width of the division pattern 522 in the second direction DR2 is greater than the diameter of the light emitting element ED. Therefore, the second type light emitting element ED_B may be stably fixed to the alignment area AA by the first insulating layer 520.

The connection pattern 523 may be disposed between one end or an end of the fixing pattern 521 and one end or an end of the division pattern 522 to connect one end or an end of the fixing pattern 521 to one end or an end of the division pattern 522. For example, the connection pattern 523 may be connected to one of both ends or an end of the fixing pattern 521 in the second direction DR2 and one of both ends or an end of the division pattern 522 in the first direction DR1. Hereinafter, for simplicity of description, one of both ends or an end of the fixing pattern 521 in the second direction DR2, which is connected to the connection pattern 523, will be referred to as a first end of the fixing pattern 521, and the opposite end or another end of the fixing pattern 521 will be referred to as a second end of the fixing pattern 521. Similarly, one of both ends of the division pattern 522 in the first direction DR1, which is connected to the connection pattern 523, will is referred to as a first end of the division pattern 522, and the opposite end of the division pattern 522 will be referred to as a second end of the division pattern 522. For example, the first end of the fixing pattern 521 may be the lower end of the fixing pattern 521, and the first end of the division pattern 522 may be the right end of the division pattern 522 in a plan view.

The connection pattern 523 may be connected to the fixing pattern 521 and the division pattern 522 to form a closed loop in a plan view. For example, the connection pattern 523 may be connected to the first end (lower end in the drawing) of the fixing pattern 521 and the first end (right end in the drawing) of the division pattern 522 in a plan view to form a closed loop together with the fixing pattern 521 and the division pattern 522.

The connection pattern 523 may include a first sub-connection pattern 523A and a second sub-connection pattern 523B. The first sub-connection pattern 523A may have a shape connected to the first end of the division pattern 522 and extending in the second direction DR2. The second sub-connection pattern 523B may have a shape connected to the first end (lower end in the drawing) of the fixing pattern 521 and extending in the first direction DR1. The first sub-connection pattern 523A may extend from the first end of the division pattern 522 in the second direction DR2, and the second sub-connection pattern 523B may extend from the first end of the fixing pattern 521 in the first direction DR1. The first sub-connection pattern 523A extending in the second direction DR2 may face the fixing pattern 521 while being spaced apart therefrom, and the second sub-connection pattern 523B extending in the first direction DR1 may face the division pattern 522 while being spaced apart therefrom.

The fixing pattern 521, the division pattern 522, the first sub-connection pattern 523A, and the second sub-connection pattern 523B may form a closed loop in a plan view. On the other hand, although it is illustrated in the drawing that the fixing pattern 521, the division pattern 522, the first sub-connection pattern 523A, and the second sub-connection pattern 523B form a rectangular closed loop in a plan view, the shape of the closed loop formed by them is not limited thereto. The area partitioned by the closed loop formed by the fixing pattern 521, the division pattern 522, the first sub-connection pattern 523A, and the second sub-connection pattern 523B may be a second opening OP2 among the openings to be described later. For example, the second opening OP2 may be defined by the fixing pattern 521, the division pattern 522, the first sub-connection pattern 523A, and the second sub-connection pattern 523B.

The base portion 525 may be disposed to surround the fixing pattern 521, the division pattern 522, and the connection pattern 523 in a substantially closed loop shape. The base portion 525 may be connected to the fixing pattern 521 and the division pattern 522 and spaced apart from the connection pattern 523. The fixing pattern 521 and the division pattern 522 may be branched from a part of the base portion 525, and the connection pattern 523 may be disposed in the closed loop formed by the base portion 525 to face the base portion 525 while being spaced apart therefrom.

For example, the base portion 525 may include a first base portion 525A disposed on one side or a side in the second direction DR2, a second base portion 525B disposed on the other side or another side in the second direction DR2, a third base portion 525C disposed on one side or a side in the first direction DR1, and a fourth base portion 525D disposed on the other side or another side in the first direction DR1. The first base portion 525A may be located on the upper side, the second base portion 525B may be located on the lower side, the third base portion 525C may be located on the right side, and the fourth base portion 525D may be located on the left side in a plan view.

The first base portion 525A may be located on the upper side of one pixel PX in a plan view and may extend in the first direction DR1. The first base portion 525A may face the division pattern 522 while being spaced apart therefrom in the second direction DR2. The first base portion 525A may cover or overlap the division pattern 522 in the second direction DR2. Therefore, the length of the first base portion 525A in the first direction DR1 may be greater than the length of the division pattern 522 in the first direction DR1.

The fixing pattern 521 may be branched from the first base portion 525A. The second end (upper end in the drawing) of the fixing pattern 521 may be connected to the first base portion 525A, and the first end (lower end in the drawing) of the fixing pattern 521 may be connected to the connection pattern 523. The fixing pattern 521 may be branched downward from the first base portion 525A and extend in the second direction DR2. The fixing pattern 521 may extend in the second direction DR2 and may be spaced apart from the second base portion 525B disposed below the first base portion 525A.

The fourth base portion 525D may be located on the left side of one pixel PX in a plan view and extend in the second direction DR2. The fourth base portion 525D may face the fixing pattern 521 while being spaced apart therefrom in the first direction DR1. The fourth base portion 525D may cover or overlap the fixing pattern 521 in the first direction DR1. Therefore, the length of the fourth base portion 525D in the second direction DR2 may be greater than the length of the fixing pattern 521 in the second direction DR2.

The division pattern 522 may be branched from the fourth base portion 525D. The second end (left end in the drawing) of the division pattern 522 may be connected to the fourth base portion 525D, and the first end (right end in the drawing) of the division pattern 522 may be connected to the connection pattern 523. The division pattern 522 may be branched to the right side from the fourth base portion 525D and extend in the first direction DR1. The division pattern 522 may extend in the first direction DR1 and may be spaced apart from the third base portion 525C located on the right side of the fourth base portion 525D.

The first base portion 525A, the fourth base portion 525D, the fixing pattern 521, and the division pattern 522 may form a closed loop in a plan view. On the other hand, although it is illustrated in the drawing that the first base portion 525A, the fourth base portion 525D, the fixing pattern 521, and the division pattern 522 form a rectangular closed loop in a plan view, the shape of the closed loop formed by them is not limited thereto. The area partitioned by the closed loop formed by the first base portion 525A, the fourth base portion 525D, the fixing pattern 521, and the division pattern 522 may be a first opening OP1 among the openings OP to be described later. For example, the first opening OP2 may be defined by the first base portion 525A, the fourth base portion 525D, the fixing pattern 521, and the division pattern 522.

The third base portion 525C may be located on the right side of one pixel PX in a plan view and extend in the second direction DR2. The third base portion 525C may face the fixing pattern 521 and the first sub-connection pattern 523A of the connection pattern 523 while being spaced apart therefrom. The third base portion 525C may cover or overlap the fixing pattern 521 and the first sub-connection pattern 523A of the connection pattern 523 in the first direction DR1. Therefore, the length of the third base portion 525C in the second direction DR2 may be greater than the length of the fixing pattern 521 in the second direction DR2.

The second base portion 525B may be located on the lower side of one pixel PX in a plan view and extend in the first direction DR1. The second base portion 525B may face the division pattern 522 and the second sub-connection pattern 523B of the connection pattern 523 while being spaced apart therefrom. The second base portion 525B may cover or overlap the division pattern 522 and the second sub-connection pattern 523B of the connection pattern 523 in the second direction DR2. Therefore, the length of the second base portion 525B in the first direction DR1 may be greater than the length of the division pattern 522 in the first direction DR1.

As described above, the first insulating layer 520 may include the openings OP penetrating the first insulating layer 520. The openings OP may be defined as an area partitioned by the inner wall of the first insulating layer 520. For example, the openings OP may be defined by the area partitioned by the patterns 521, 522, 523, and 525 of the first insulating layer 520 (or the closed loop formed by the patterns).

The openings OP may include the first opening OP1, the second opening OP2, and a third opening OP3 spaced apart from each other.

The first opening OP1 may be formed to overlap the first electrode 210 in the third direction DR3 in the first sub-emission area CA1. The first opening OP1 may have a shape extending in the second direction DR2 in the first sub-emission area CA1. The first opening OP1 may expose the end (hereinafter, referred to as "first end") located on the first electrode 210 side between both ends of the first light emitting elements ED1 in the first sub-emission area CA1. The first opening OP1 may not be disposed in the second sub-emission area CA2 and the second sub-area NCA.

The first opening OP1 may be an area partitioned by the first base portion 525A, the fourth base portion 525D, the fixing pattern 521, and the division pattern 522. As shown in the drawings, the inner walls of the first base portion 525A, the fourth base portion 525D, the fixing pattern 521, and the division pattern 522 may form a closed loop in a plan view, and the first opening OP1 may be defined by the inner walls of the first base portion 525A, the fourth base portion 525D, the fixing pattern 521, and the division pattern 522.

The second opening OP2 may be spaced apart from the first opening OP1. The second opening OP2 may be spaced apart from the first opening OP1 in a diagonal direction. The second opening OP2 may be formed to overlap the second electrode 220 in the third direction DR3 in the second sub-emission area CA2. The second opening OP2 may have a shape extending in the second direction DR2 in the second sub-emission area CA2. The second opening OP2 may expose the end (hereinafter, referred to as "second end") located on the second electrode 202 side between both ends of the second light emitting elements ED2 in the second sub-emission area CA2. The second opening OP2 may not be disposed in the first sub-emission area CA1 and the second sub-area NCA.

The second opening OP2 may be an area partitioned by the fixing pattern 521, the division pattern 522, and the connection pattern 523. As shown in the drawings, the inner walls of the fixing pattern 521, the division pattern 522, and the connection pattern 523 may form a closed loop in a plan view, and the second opening OP2 may be defined by the inner walls of the fixing pattern 521, the division pattern 522, and the connection pattern 523.

The third opening OP3 may be spaced apart from the first opening OP1 and the second opening OP2. The third opening OP3 may be formed to surround the second opening OP2. The third opening OP3 may include areas depending on types of patterns of the first insulating layer 520 partitioning the third opening OP3 or positions of areas where they are arranged. The third opening OP3 may include a first area OP3_A overlapping the second electrode 220 in the third direction DR3 in the first sub-emission area CA1, a second area OP3_B overlapping the first electrode 210 in the third direction DR3 in the second sub-emission area CA2, a third area OP3_C that connects the first area OP3_A of the third opening OP3 to the second area OP3_B of the third opening OP3. Hereinafter, throughout this specification, the respective areas of the third opening OP3, for example, the first area OP3_A, the second area OP3_B, and the third area OP3_C of the third opening OP3, will be referred to as a third opening first area OP3_A, a third opening second area OP3_B, a third opening third area OP3_C, respectively.

The third opening first area OP3_A may be spaced apart from the first opening OP1 and the second opening OP2. The third opening first area OP3_A may be located on the right side of the first opening OP1 and on the upper side of the second opening OP2 in a plan view. The third opening first area OP3_A may be formed to overlap the second electrode 220 in the third direction DR3 in the first sub-emission area CA1. The third opening first area OP3_A may have a shape extending in the second direction DR2 in the first sub-emission area CA1. The third opening first area OP3_A may expose the end ("second end") located on the second electrode 220 side between both ends of the first light emitting element ED1 in the first sub-emission area CA1.

The third opening first area OP3_A may be an area partitioned by the first base portion 525A, the third base portion 525C, the fixing pattern 521, and the division pattern 522. The third opening first area OP3_A may be defined by the inner walls of the first base portion 525A, the third base portion 525C, the fixing pattern 521, and the division pattern 522.

The third opening second area OP3_B may be spaced apart from the first opening OP1 and the second opening OP2. The third opening second area OP3_B may be located on the lower side of the first opening OP1 and on the left side of the second opening OP2. The third opening second area OP3_B may be formed to overlap the first electrode 210 in the third direction DR3 in the second sub-emission area CA2. The third opening second area OP3_B may have a shape extending in the second direction DR2 in the second sub-emission area CA2. The third opening second area OP3_B may expose the end ("first end") located on the first electrode 210 side between both ends of the second light emitting element ED2 in the second sub-emission area CA2.

The third opening second area OP3_B may be an area partitioned by the second base portion 525B, the fourth base portion 525D, the fixing pattern 521, and the division pattern 522. The third opening second area OP3_B may be defined by the inner walls of the second base portion 525B, the fourth base portion 525D, the fixing pattern 521, and the division pattern 522.

The third opening third area OP3_C may connect the third opening first area OP3_A to the third opening second area OP3_B. The third opening third area OP3_C may be formed to surround the outside of the second opening OP2. The third opening third area OP3_C may be spaced apart from the second opening OP2. The third opening third area OP3_C may be disposed in the second sub-area NCA. The third opening third area OP3_C may be formed across the second sub-area NCA of the emission area EMA and the non-emission area. The third opening third area OP3_C may not overlap the alignment area AA.

The third opening third area OP3_C may be an area partitioned by the second base portion 525B, the third base portion 525C, and the connection pattern 523. The third opening third area OP3_C may be defined by the inner walls of the second base portion 525B, the third base portion 525C, and the connection pattern 523. For example, an area OP3_C1 where the third base portion 525C and the first sub-connection pattern 523A face each other while being spaced apart from each other and an area OP3_C2 where the second base portion 525B and the second sub-connection pattern 523B face each other while being spaced apart from each other may form the third opening third area OP3_C. The area OP3_C1 where the third base portion 525C and the first sub-connection pattern 523A face each other while being spaced apart from each other may have a shape extending in the second direction DR2 across the second sub-area NCA and the non-emission area, and the area OP3_C2 where the second base portion 525B and the second sub-connection pattern 523B face each other while being spaced apart from each other may have a shape extending in the first direction DR1 in the non-emission area.

The third opening first area OP3_A, the third opening second area OP3_B, and the third opening third area OP3_C may be integrated to form one closed loop. The third opening first area OP3_A, the third opening second area OP3_B, and the third opening third area OP3_C forming one closed loop may form the third opening OP3.

The contact electrode 700 may be disposed in the openings OP of the first insulating layer 520. The contact electrode 700 may include contact electrodes 710, 720, and 730 spaced apart from each other. The contact electrodes 710, 720, and 730 may be arranged to correspond to the openings OP, respectively.

The contact electrode 700 may include a first contact electrode 710, a second contact electrode 720, and a third contact electrode 730.

The first contact electrode 710 may be disposed in the first opening OP1. The planar shape of the first contact electrode 710 may be substantially the same as the planar shape of the first opening OP1. The first contact electrode 710 may have a shape extending in the second direction DR2 in the first sub-emission area CA1.

The first contact electrode 710 may be in contact with the inner wall of the first insulating layer 520 that defines the first opening OP1. For example, the first contact electrode 710 may be disposed in contact with the inner walls of the fixing pattern 521, the division pattern 522, and the base portion 525 that define the first opening OP1. However, the disclosure is not limited thereto, and the first contact electrode 710 may be disposed in contact with the inner walls of the fixing pattern 521 and the division pattern 522 that define the first opening OP1, but may be disposed to be spaced apart from the inner wall of the base portion 522 that defines the first opening OP1 or to cover or overlap a part of the base portion 522.

The first contact electrode 710 may overlap the first electrode 210 in the third direction DR3 in the first sub-emission area CA1. The first contact electrode 710 may be electrically connected to the first electrode 210 through a first contact hole CNT1 penetrating a second insulating layer 510 (see FIG. 7) to be described later in the first sub-emission area CA1. The first contact electrode 710 may overlap the first end of the first light emitting element ED1 exposed by the fixing pattern 521 in the first sub-emission area CA1.

The second contact electrode 720 may be disposed in the second opening OP2. The substantially planar shape of the second contact electrode 720 may be substantially the same as the substantially planar shape of the second opening OP2.

The second contact electrode 720 may have a shape extending in the second direction DR2 in the second sub-emission area CA2.

The second contact electrode 720 may be in contact with the inner wall of the first insulating layer 520 that defines the second opening OP2. For example, the second contact electrode 720 may be disposed in contact with the inner walls of the fixing pattern 521, the division pattern 522, and the connection pattern 523 that define the second opening OP2.

The second contact electrode 720 may overlap the second electrode 220 in the third direction DR3 in the second sub-emission area CA2. The second contact electrode 720 may be spaced apart from the first contact electrode 710. The second contact electrode 720 may be spaced apart from the first contact electrode 710 by the fixing pattern 521 and the division pattern 522. The second contact electrode 720 may be electrically connected to the second electrode 220 through a second contact hole CNT2 penetrating the second insulating layer 510 to be described later in the second sub-emission area CA2. The second contact electrode 720 may overlap the second end of the second light emitting element ED2 exposed by the fixing pattern 521 in the second sub-emission area CA2.

The third contact electrode 730 may be disposed in the third opening OP3. The substantially planar shape of the third contact electrode 730 may be substantially the same as the substantially planar shape of the third opening OP3. Therefore, the third contact electrode 730 may be in contact with the inner wall of the first insulating layer 520 that defines the third opening OP3.

The third contact electrode 730 (730_1 of FIG. 14) may include a first area 731, a second area 732, and a third area 733. Hereinafter, throughout this specification, the respective areas of the third contact electrode 730, for example, the first area 731, the second area 732, and the third area 733 of the third contact electrode 730, will be referred to as a third contact electrode first area 731, a third contact electrode second area 732, and a third contact electrode third area 733, respectively.

The third contact electrode first area 731 may be disposed in the third opening first area OP3_A. The third contact electrode first area 731 may have a shape extending in the second direction DR2 in the first sub-emission area CA1.

The third contact electrode first area 731 may be in contact with the inner wall of the first insulating layer 520 that defines the third opening first area OP3_A. For example, the third contact electrode first area 731 may be disposed in contact with the inner walls of the fixing pattern 521, the division pattern 522, and the base portion 525 that define the third opening first area OP3_A.

The third contact electrode first area 731 may overlap the second electrode 220 in the third direction DR3 in the first sub-emission area CA1. The third contact electrode first area 731 may be spaced apart from the first contact electrode 710 and the second contact electrode 720. The third contact electrode first area 731 may be spaced apart from the first contact electrode 710 by the fixing pattern 521 and may be spaced apart from the second contact electrode 720 by the division pattern 522. For example, the third contact electrode first area 731 may be spaced apart from the first contact electrode 710 with the fixing pattern 521 interposed therebetween, and may be spaced apart from the second electrode 720 with the division pattern 522 interposed therebetween. The third contact electrode first area 731 may overlap the second end of the first light emitting element ED1 exposed by the fixing pattern 521 in the first sub-emission area CA1.

The third contact electrode second area 732 may be disposed in the third opening second area OP3_B. The third contact electrode second area 732 may be spaced apart from the third contact electrode first area 731. The third contact electrode second area 732 may have a shape extending in the second direction DR2 in the second sub-emission area CA2.

The third contact electrode second area 732 may be in contact with the inner wall of the first insulating layer 520 that defines the third opening second area OP3_B. For example, the third contact electrode second area 732 may be disposed in contact with the inner walls of the fixing pattern 521, the division pattern 522, and the base portion 525 that define the third opening second area OP3_B.

The third contact electrode second area 732 may be disposed to overlap the first electrode 210 in the third direction DR3 in the second sub-emission area CA2. The third contact electrode second area 732 may be spaced apart from the first contact electrode 710 and the second contact electrode 720. The third contact electrode second area 732 may be spaced apart from the second contact electrode 720 by the fixing pattern 521, and may be spaced apart from the first contact electrode 710 by the division pattern 522. The third contact electrode second area 732 may overlap the first end of the second light emitting element ED2 exposed by the fixing pattern 521 in the second sub-emission area CA2.

The third contact electrode third area 733 may be disposed in the third opening third area OP3_C. The third contact electrode third area 733 may be disposed between the third contact electrode first area 731 and the third contact electrode second area 732. The third contact electrode third area 733 may be disposed between the third contact electrode first area 731 and the third contact electrode second area 732 to electrically connect them. The third contact electrode third area 733 may be disposed to surround the second contact electrode 720. The third contact electrode third area 733 may be formed across the second sub-area NCA of the emission area EMA and the non-emission area. The alignment area AA may not be disposed in the third contact electrode third area 733.

The third contact electrode third area 733 may be in contact with the inner wall of the first insulating layer 520 that defines the third opening third area OP3_C. For example, the third contact electrode third area 733 may be disposed in contact with the inner walls of the connection pattern 523 and the base portion 525 that define the third opening third area OP3_C.

The third contact electrode third area 733 may be disposed to surround the second contact electrode 720 while being spaced apart from the second contact electrode 720. The third contact electrode third area 733 may be spaced apart from the second contact electrode 720 by the connection pattern 523.

The third contact electrode third area 733 may include a first portion 733A disposed in a partial area OP3_C1 of the third opening OP3_C where the third base portion 525C and the first sub-connection pattern 523A face each other while being spaced apart from each other, and a second portion 733B disposed in another partial area OP3_C2 of the third opening OP3_C where the second base portion 525B and the second sub-connection pattern 523B face each other while being spaced apart from each other. The first portion 733A of the third contact electrode third area 733 may have a shape extending in the second direction DR2 across the second sub-area NCA and the non-emission area, and the second portion 733B of the third contact electrode third area 733 may have a shape extending in the first direction DR1 in the non-emission area (for example, the first sub-area SA).

The contact electrodes 710, 720, and 730 may be in contact with both ends of the first type light emitting element ED_A among the light emitting elements ED to electrically connect the first and second electrode 210 and 220 and the first type light emitting element ED_A or to electrically connect the first light emitting element ED1 and the second light emitting element ED2 in series. For example, the first contact electrode 710 may be in contact with the first electrode 210 and the first end of the first light emitting element ED1 to electrically connect the first electrode 210 and the first light emitting element ED1. The second contact electrode 720 may be in contact with the second electrode 220 and the second end of the second light emitting element ED2 to electrically connect the second electrode 220 and the second light emitting element ED2. The third contact electrode 730 may be in contact with the second end of the first light emitting element ED1 and the first end of the second light emitting element ED2 to electrically connect the first light emitting element ED1 and the second light emitting element ED2 in series.

The first insulating layer 520 disposed in one pixel PX of the display device 10 according to the disclosure may include the openings OP (OP1, OP2, and OP3) penetrating the first insulating layer 520 and spaced apart from each other. The openings OP may be defined by the patterns of the first insulating layer 520. Among the patterns of the first insulating layer 520 that define the openings OP, the fixing pattern 521 may extend in one direction without disconnection in the alignment area AA where the light emitting elements ED are concentrated. Therefore, since the fixing pattern 521 for fixing the light emitting elements ED extends in one direction without disconnection in the alignment area AA, it is possible to prevent separation of the light emission elements ED to the area other than the alignment area AA in the subsequent step of the alignment step of the light emitting elements ED.

Further, since the third contact electrode third area 733 that electrically connects the third contact electrode first area 731 and the third contact electrode second area 732 is not disposed between the first contact electrode 710 and the second contact electrode 720 and is formed to surround the second contact electrode 720, the first light emitting element ED1 and the second light emitting element ED2 may be electrically connected in series through the third contact electrode 730 although the fixing pattern 521 of the first insulating layer 520 extends in one direction in the alignment area AA. Therefore, due to the above-described substantially planar shape of the first insulating layer 520, it is possible to prevent the separation of the light emitting elements ED arranged in the alignment area AA while maintaining the number of series connections between the light emitting elements ED.

Figure 7:
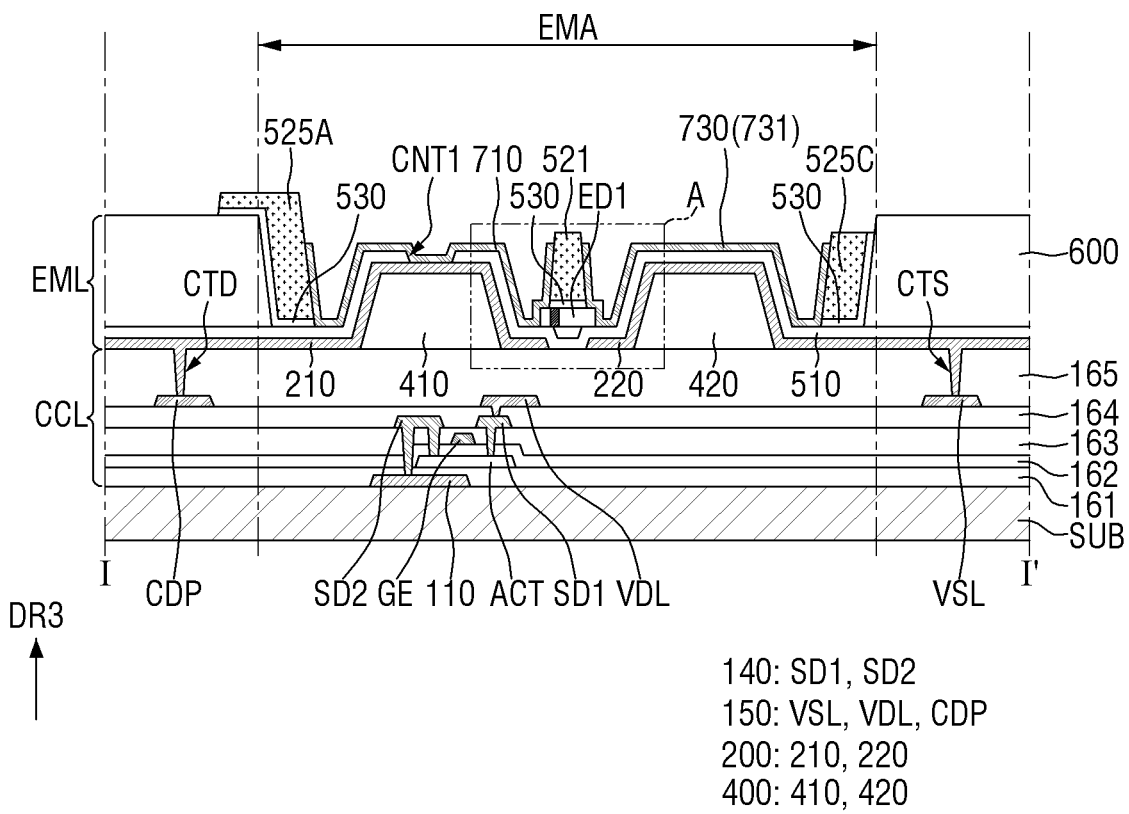
FIG. 7 is a schematic cross-sectional view taken along line I-I' of FIG. 3.
Figure 8:
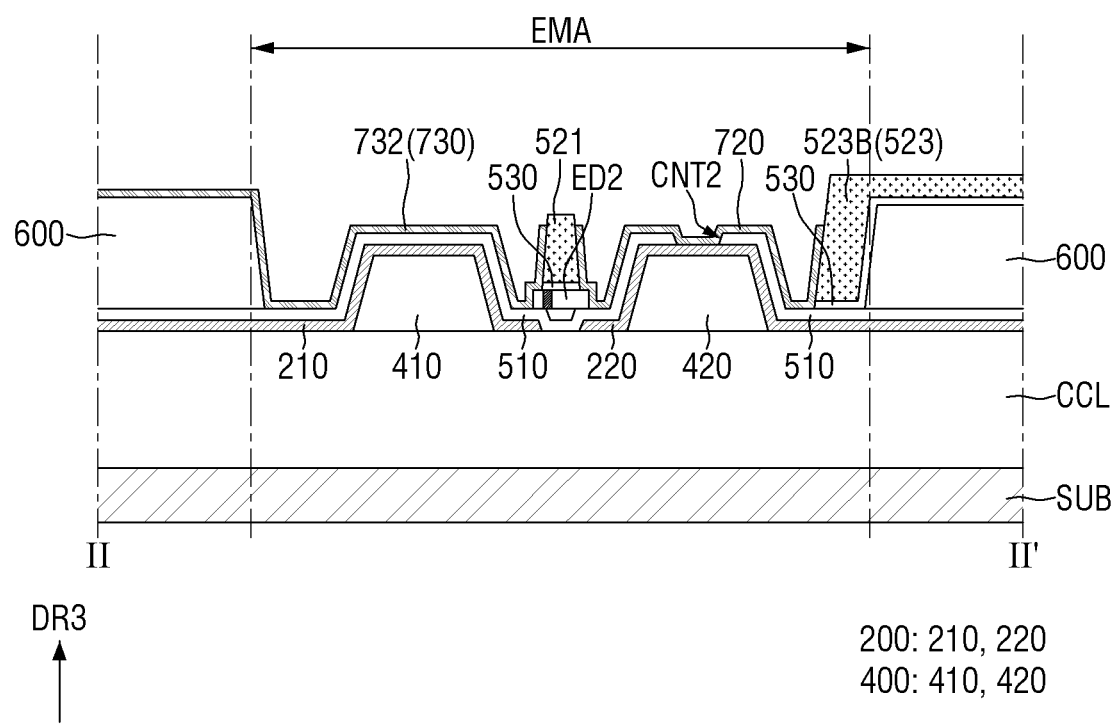
FIG. 8 is a schematic cross-sectional view taken along line II-II' of FIG. 3.
Figure 9:
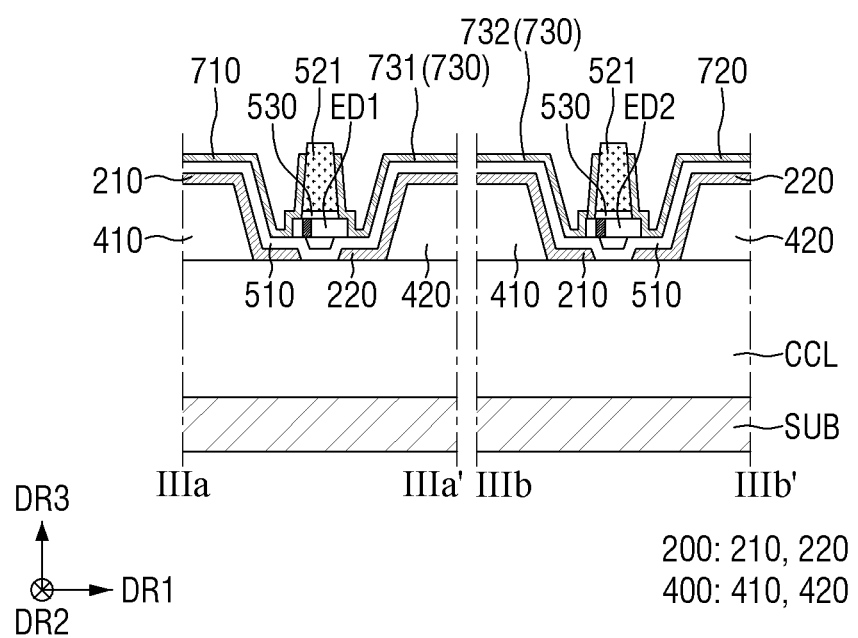
FIG. 9 is a schematic cross-sectional view taken along line IIIa-IIIa' of FIG. 3.
Figure 10:
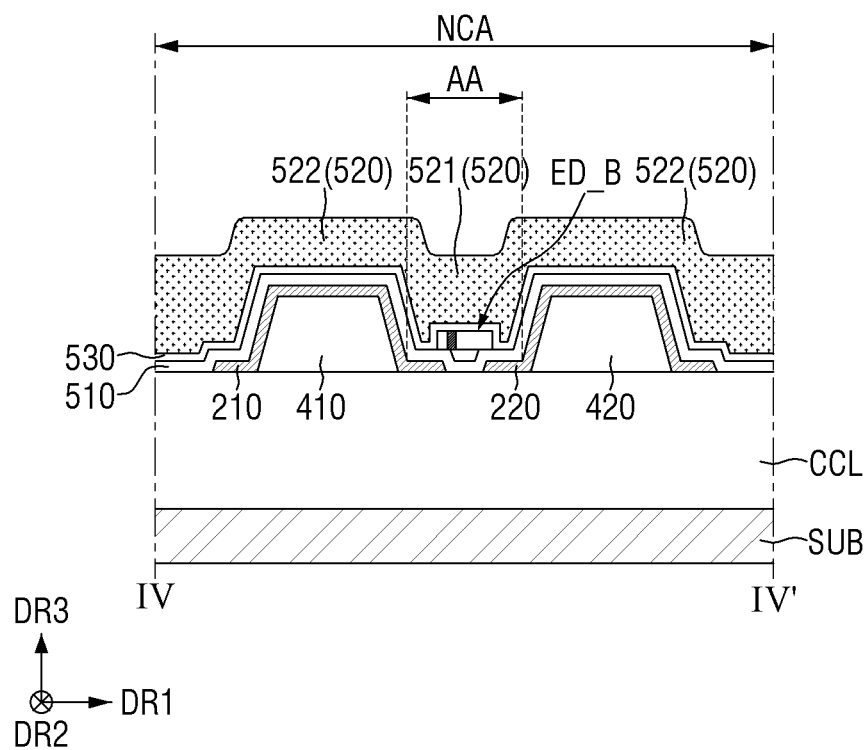
FIG. 10 is a schematic cross-sectional view taken along line IV-IV' of FIG. 3.
Figure 11:
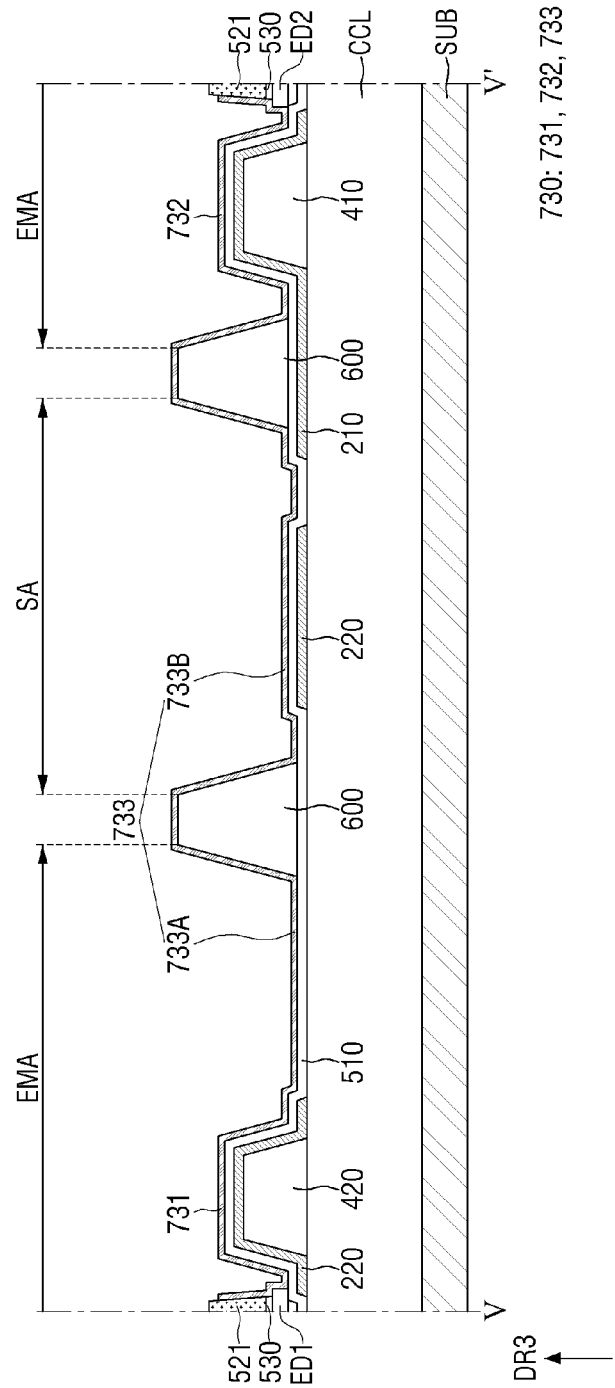
FIG. 11 is a schematic cross-sectional view taken along line V-V of FIG. 3.

FIG. 7 is a schematic cross-sectional view taken along line I-I' of FIG. 3. FIG. 8 is a cross-sectional view taken along line II-II' of FIG. 3. FIG. 9 is a schematic cross-sectional view taken along line of FIG. 3. FIG. 10 is a schematic cross-sectional view taken along line IV-IV' of FIG. 3. FIG. 11 is a schematic cross-sectional view taken along line V-V of FIG. 3.

Referring to FIG. 7, the display device 10 may include a substrate SUB, the circuit element layer CCL disposed on the substrate SUB, and a display element layer EML disposed on the circuit element layer CCL. The display element layer EML may include the first bank 400, the electrode layer 200, the second bank 600, the light emitting elements ED, the first insulating layer 520, the contact electrode 700, the second insulating layer 510, and a third insulating layer 530.

The substrate SUB may be an insulating substrate. The substrate SUB may be made of an insulating material such as glass, quartz, or polymer resin. Further, the substrate SUB may be a rigid substrate, but may also be a flexible substrate which can be bent, folded or rolled.

The circuit element layer CCL may be disposed on the substrate SUB. The circuit element layer CCL may include conductive layers, at least one transistor, insulating layers, the first voltage line VDL, and the second voltage line VSL.

The lower metal layer 110 may be disposed on the substrate SUB. The lower metal layer 110 may be a light blocking layer for protecting an active layer ACT of the transistor. The lower metal layer 110 may be disposed to cover or overlap at least a channel region of the active layer ACT of the transistor at a position therebelow. The lower metal layer 110 may contain a material that blocks light. For example, the lower metal layer 110 may be made of an opaque metal material that blocks transmission of light. However, the disclosure is not limited thereto, and the lower metal layer 110 may be omitted.

A buffer layer 161 may be disposed on the lower metal layer 110. The buffer layer 161 may be disposed to cover or overlap the entire surface of the substrate SUB where the lower metal layer 110 is disposed. The buffer layer 161 may serve to protect transistors from moisture permeating through the substrate SUB that is susceptible to moisture permeation.

A semiconductor layer is disposed on the buffer layer 161. The semiconductor layer may include the active layer ACT of the transistor. The active layer ACT of the transistor may be disposed to overlap the lower metal layer 110 as described above.

The semiconductor layer may include polycrystalline silicon, monocrystalline silicon, oxide semiconductor, and the like within the spirit and the scope of the disclosure. In an embodiment, in case that the semiconductor layer contains polycrystalline silicon, the polycrystalline silicon may be formed by crystallizing amorphous silicon. In case that the semiconductor layer contains polycrystalline silicon, the active layer ACT of the transistor may include doping regions doped with impurities and channel regions disposed therebetween. In an embodiment, the semiconductor layer may contain an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or the like within the spirit and the scope of the disclosure.

A gate insulating layer 162 may be disposed on the semiconductor layer. The gate insulating layer 162 may function as a gate insulating layer of each transistor. The gate insulating layer 162 may be formed as a multilayer in which inorganic layers including an inorganic material, for example, at least one of silicon oxide ($SiO_x$), silicon nitride ($SiN_x$) and silicon oxynitride ($SiO_xN_y$) may be alternately stacked each other.

The first conductive layer may be disposed on the gate insulating layer 162. The first conductive layer may include a gate electrode GE of the transistor. The gate electrode GE of the transistor may be disposed to overlap the channel region of the active layer ACT of the transistor in the third direction DR3 that is the thickness direction.

A first interlayer insulating layer 163 may be disposed on the first conductive layer. The first interlayer insulating layer 163 may be disposed to cover or overlap the gate electrode GE of the transistor. The first interlayer insulating layer 163 may function as an insulating layer between the first conductive layer and other layers disposed thereon, and may protect the first conductive layer.

A second conductive layer 140 may be disposed on the first interlayer insulating layer 163. The second conductive layer 140 may include a drain electrode SD1 and a source electrode SD2 of the transistor.

The drain electrode SD1 and the source electrode SD2 of the transistor may be electrically connected to both ends of the active layer ACT of the transistor through contact holes penetrating the first interlayer insulating layer 163 and the gate insulating layer 162. Further, the source electrode SD2 may be electrically connected to the lower metal layer 110 through another contact hole penetrating the first interlayer insulating layer 163, the gate insulating layer 162, and the buffer layer 161.

The second interlayer insulating layer 164 may be disposed on the second conductive layer 140. The second interlayer insulating layer 164 may function as an insulating layer between the second conductive layer 140 and other layers disposed thereon, and may protect the second conductive layer 140.

A third conductive layer 150 may be disposed on the second interlayer insulating layer 164. The third conductive layer 150 may include the first voltage line VDL, the second voltage line VSL, and a first conductive pattern CDP.

The high potential voltage (or the first power voltage) supplied to the transistor may be applied to the first voltage line VDL, and the low potential voltage (or the second power voltage) lower than the high potential voltage supplied to the first voltage line VDL may be applied to the second voltage line VSL.

The first voltage line VDL may be electrically connected to the drain electrode SD1 of the transistor through the contact hole penetrating the second interlayer insulating layer 164.

The second voltage line VSL may be electrically connected to the second electrode 220 through the second electrode contact hole CTS penetrating a via layer 165 to be described below. The second power voltage applied to the second voltage line VSL may be supplied to the second electrode 220. An alignment signal for aligning the light emitting element ED during the manufacturing process of the display device 10 may be applied to the second voltage line VSL.

The first conductive pattern CDP may be electrically connected to the transistor. Although not shown in the drawing, the first conductive pattern CDP may be electrically connected to the source electrode SD2 of the transistor through the contact hole penetrating the second interlayer insulating layer 164. Further, the first conductive pattern CDP may be electrically connected to the first electrode 210 through the first electrode contact hole CTD penetrating the via layer 165. The transistor may transmit the first power voltage applied from the first voltage line VDL to the first electrode 210 through the first conductive pattern CDP.

The via layer 165 may be disposed on the third conductive layer 150. The via layer 165 may be disposed on the second interlayer insulating layer 164 where the third conductive layer 150 is disposed. The via layer 165 may include an organic insulating material, for example, an organic material such as polyimide (PI). The via layer 165 may function to flatten a surface.

The buffer layer 161, the first gate insulating layer 162, the first interlayer insulating layer 163, and the second interlayer insulating layer 164 described above may be formed of inorganic layers stacked each other in an alternating manner. For example, the buffer layer 161, the first gate insulating layer 162, the first interlayer insulating layer 163, and the second interlayer insulating layer 164 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the disclosure is not limited thereto, and the buffer layer 161, the first gate insulating layer 162, the first interlayer insulating layer 163, and the second interlayer insulating layer 164 may be formed as a single inorganic layer containing the above-described insulating material.

Each of the first conductive layer, the second conductive layer 140 and the third conductive layer 150 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the disclosure is not limited thereto.

The display element layer EML may be disposed on the via layer 165. Hereinafter, the cross-sectional structure of the display element layer EML disposed on the circuit element layer CCL will be described with reference to FIGS. 3 and 6 to 11. In the schematic cross-sectional views of the display device 10 shown in FIGS. 8 to 11, the cross-sectional structure of the display element layer EML is illustrated, and the cross-sectional structure of the circuit element layer CCL is simplified as one layer.

The first bank 400 may be disposed on the via layer 165 in the emission area EMA. As described above, the first bank 400 may include the first sub-bank 410 and the second sub-bank 420 spaced apart from each other, and the first sub-bank 410 and the second sub-bank 420 may be arranged on one surface or a surface of the via layer 165.

Each of the first sub-bank 410 and the second sub-bank 420 may have a shape protruding in the thickness direction of the substrate SUB with respect to one surface or a surface of the via layer 165. Each of the first sub-bank 410 and the second sub-bank 420 may have inclined side surfaces. The inclined side surfaces of the first sub-bank 410 and the second sub-bank 420 may face each other. The separation space between the side surfaces of the first sub-bank 410 and the second sub-bank 420 facing each other may provide an area where the light emitting elements ED are arranged.

For example, the light emitting elements ED may be dispersed in ink and injected into the emission area EMA partitioned by the second bank 600. The light emitting elements ED dispersed in the ink may be aligned by the electric field generated between the first electrode 210 and the second electrode 220 by applying alignment signals to the first electrode 210 and the second electrode 220. Since each of the first sub-bank 410 and the second sub-bank 420 protrudes from the via layer 165 and has the inclined surfaces and the side surfaces of the first sub-bank 410 and the second sub-bank 420 are arranged to face each other, the light emitting elements ED dispersed in the ink may be arranged between the first sub-bank 410 and the second sub-bank 420. For example, the first sub-bank 410 and the second sub-bank 420 may face each other while being spaced apart from each other to form the alignment area AA extending in the second direction DR2 in the emission area EMA. The light emitting elements ED may be arranged in the alignment area AA.

The electrode layer 200 may be disposed on the first bank 400 and the via layer 165 exposed by the first bank 400.

For example, the first electrode 210 may be disposed on the first sub-bank 410 and the via layer 165 exposed by the first sub-bank 410. The first electrode 210 may be electrically connected to the first conductive pattern CDP through the first electrode contact hole CTD penetrating the via layer 165. The first electrode 210 may be in contact with the top surface of the first conductive pattern CDP exposed by the first electrode contact hole CTD. The first electrode 210 may be electrically connected to the first light emitting element ED1 through the first contact electrode 710 to transmit the electrical signal applied from the circuit element layer CCL to the first light emitting element ED1.

The second electrode 220 may be disposed on the second sub-bank 420 and the via layer 165 exposed by the second sub-bank 420. The second electrode 220 may be electrically connected to the second voltage line VSL through the second electrode contact hole CTS penetrating the via layer 165. The second electrode 220 may be in contact with the top surface of the second voltage line VSL exposed by the second electrode contact hole CTS. The second electrode 220 may be electrically connected to the second light emitting element ED2 through the second contact electrode 720 to transmit the electrical signal applied from the circuit element layer CCL to the second light emitting element ED2.

The electrode layer 200 may include a conductive material having high reflectivity. For example, the electrode layer 200 may contain, as a material having high reflectivity, a metal such as silver (Ag), copper (Cu), aluminum (Al), molybdenum (Mo), titanium (Ti), or the like, or an alloy containing aluminum (Al), nickel (Ni), lanthanum (La), or the like within the spirit and the scope of the disclosure. The electrode layer 200 may reflect the light emitted from the light emitting element ED and traveling toward the side surface of the first bank 400 in the upward direction of each pixel PX. However, the disclosure is not limited thereto, and the electrode layer 200 may further include a transparent conductive material. For example, the electrode layer 200 may include a material such as ITO, IZO, and ITZO. In an embodiment, the electrode layer 200 may have a structure in which at least one transparent conductive material and at least one metal layer having high reflectivity may be stacked each other, or may be formed as one layer including them. For example, the electrode layer 200 may have a stacked structure of ITO/Ag/ITO, ITO/Ag/IZO, ITO/Ag/ITZO/IZO, or the like within the spirit and the scope of the disclosure.

The second insulating layer 510 may be disposed on the electrode layer 200. The second insulating layer 510 may be disposed on the electrode layer 200 and the via layer 165 exposed by the electrode layer 200. The second insulating layer 510 may include contact portions that expose a part of the top surfaces of the first electrode 210 and the second electrode 220. The contact portions may include the first contact hole CNT1 and the second contact hole CNT2 penetrating the second insulating layer 510. The first contact hole CNT1 may expose a part of the top surface of the first electrode 210, and the second contact hole CNT2 may expose a part of the top surface of the second electrode 220.

The second insulating layer 510 may serve to protect the electrode layer 200 and to insulate the first electrode 210 and the second electrode 220 from each other. Further, the second insulating layer 510 may prevent the light emitting elements ED to be described later that are arranged on the second insulating layer 510 from being damaged due to direct contact with other members disposed therebelow. Further, the second insulating layer 510 may be interposed between the electrode layer 200 and the third contact electrode 730 to insulate the electrode layer 200 and the third contact electrode 730 from each other.

The second bank 600 may be disposed on the second insulating layer 510. The second bank 600 may be disposed in the form of a grid pattern including portions extending in the first and second directions DR1 and DR2 in a plan view. As described above, the second bank 600 may distinguish the emission area EMA and the sub-area SA of each pixel PX. The second bank 600 has a height greater than that of the first bank 400 and divides the emission area EMA and the sub-area SA. Accordingly, in an inkjet printing step for aligning the light emitting elements ED during the manufacturing process of the display device 10, ink in which the light emitting elements ED are dispersed can be sprayed into the emission area EMA without being mixed with an adjacent pixel PX. The second bank 600 may include an organic insulating material, for example, polyimide (PI), but is not limited thereto.

The light emitting elements ED may be disposed on the second insulating layer 510 in the emission area EMA. For example, the light emitting elements ED may be concentrated in the alignment area AA defined as the area where the first sub-bank 410 and the second sub-bank 420 face each other while being spaced apart from each other in the emission area EMA. The light emitting element ED may be disposed on the second insulating layer 510 such that both ends are located on the first electrode 210 or the second electrode 220 in the alignment area AA.

The first insulating layer 520 may be disposed on the light emitting elements ED and the second insulating layer 510. As described above, the first insulating layer 520 may include the fixing pattern 521, the division pattern 522, the connection pattern 523, and the base portion 525.

The fixing pattern 521 may be disposed on the light emitting elements ED arranged in the alignment area AA and the second insulating layer 510 exposed by the light emitting elements ED in the alignment area AA. The fixing pattern 521 may be disposed to partially cover or overlap the outer surface of the first type light emitting element ED_A without covering or overlapping both ends of the first type light emitting element ED_A in the alignment area AA overlapping the first and second sub-emission areas CA1 and CA2, and the fixing pattern 521 may be disposed to completely cover or overlap the outer surface of the second type light emitting element ED_B in the alignment area AA overlapping the second sub-area NCA. For example, the fixing pattern 521 may be disposed to expose both ends of the first light emitting element ED1 in the alignment area AA overlapping the first sub-emission area CA1, the fixing pattern 521 may be disposed to expose both ends of the second sub-emission element ED2 in the alignment area AA overlapping the second sub-emission area CA2, and the fixing pattern 521 may be disposed to completely cover or overlap the second type light emitting element ED_B together with the division pattern 522 in the second sub-area NCA between the first sub-emission area CA1 and the second sub-emission area CA2. Therefore, the outer surface of the second type light emitting element ED_B may be completely covered or overlapped by the first insulating layer 520.

The division pattern 522 may be disposed between the first sub-emission area CA1 and the second sub-emission area CA2. The division pattern 522 may be disposed on the first bank 400, the electrode layer 200, the second insulating layer 510, and the light emitting element ED in the second sub-area NCA between the first sub-emission area CA1 and the second sub-emission area CA2.

The division pattern 522 may be disposed between the first sub-emission area CA1 and the second sub-emission area CA2 to distinguish them. Further, the division pattern 522 may extend in the first direction DR1 in the second sub-area NCA disposed between the first sub-emission area CA1 and the second sub-emission area CA2 to prevent some or part of the contact electrodes 700 from being arranged in the alignment area AA. As described above, although the width of the fixing pattern 521 in the first direction DR1 is smaller than the length of the second type light emitting element ED_B, the second type light emitting element ED_B may be completely covered or overlapped by the fixing pattern 521 and the division pattern 522 because the substantially planar shape of the division pattern 522 extends in the first direction DR1 and the width of the division pattern 522 in the second direction DR2 is greater than the diameter of the light emitting element ED. Therefore, the second type light emitting element ED_B may be stably fixed to the alignment area AA by the first insulating layer 520.

The connection pattern 523 may be disposed on the second insulating layer 510 and the second bank 600. For example, the first sub-connection pattern 523A may be disposed on the second insulating layer 510 in the second sub-area NCA, and the second sub-connection pattern 523B may be disposed on the second bank 600 in the non-emission area.

Since the second sub-connection pattern 523B of the connection pattern 523 connected to the first end of the fixing pattern 521 is disposed in the non-emission area, the fixing pattern 521 may be disposed without disconnection in the alignment area AA where the light emitting elements ED are concentrated in the emission area EMA. Therefore, the separation of the light emitting elements ED arranged in the alignment area AA may be minimized.

The base portion 525 may be disposed on the second insulating layer 510 and the second bank 600. For example, the first base portion 525A, the third base portion 525C, and the fourth base portion 525D may be arranged on the second insulating layer 510 and the second bank 600 across the emission area EMA and the non-emission area. The second base portion 525B may be disposed on the second insulating layer 510 in the sub-area SA. However, the disclosure is not limited thereto, and the first to fourth base portions 525A, 525B, 525C, and 535D of the base portion 525 may be arranged on the second bank 600.

The third insulating layer 530 may be interposed between the first insulating layer 520 and the second insulating layer 510 or between the first insulating layer 520 and the light emitting elements ED. Although not limited to the following, the third insulating layer 530 may be interposed between the light emitting elements ED and the first insulating layer 520, or between the second insulating layer 510 exposed by the light emitting elements ED and the first insulating layer 520.

The third insulating layer 530 may be formed prior to the first insulating layer 520 in the manufacturing process of the display device 10 to protect the light emitting element ED and fix the light emitting element ED on the second insulating layer 510. For example, in case that the first insulating layer 520 contains an organic insulating material, the light emitting elements ED arranged in the alignment area AA may be separated from the alignment area AA due to the fluidity of the organic insulating material layer. Therefore, it is possible to stably fix the light emitting elements ED on the second insulating layer 510 in the alignment area AA by forming the third insulating layer 530 containing the inorganic insulating material on the light emitting element ED before the step of forming the first insulating layer 520 containing the organic insulating material. Therefore, it is possible to prevent the separation of the light emitting elements ED.

In an embodiment, the third insulating layer 530 may be formed by the same mask step as that of forming the first insulating layer 520. Therefore, the pattern of the third insulating layer 530 may be substantially similar to the pattern of the first insulating layer 520. For example, the third insulating layer 530 may be patterned by completely coating a third insulating material layer on the light emitting elements ED and the second insulating layer 510, patterning the first insulating layer 520 disposed on the third insulating material layer by the mask step, and performing an etching step using the patterned first insulating layer 520 as a mask. Therefore, the third insulating layer 530 may have a pattern substantially similar to the pattern of the first insulating layer 520.

The first insulating layer 520 and the third insulating layer 530 may be patterned to include the openings OP. The contact electrode 700 may be formed in the openings OP formed by the first insulating layer 520 and the third insulating layer 530. The first insulating layer 520 and the third insulating layer 530 including the openings OP may assist the mask step used in the step of forming the contact electrode 700.

The contact electrode 700 may be disposed on the first insulating layer 520. As described above, the contact electrode 700 may include the first to third contact electrodes 710, 720, and 730, and the first to third contact electrodes 710, 720, and 730 may be arranged in the first to third openings OP1, OP2, and OP3 penetrating the first insulating layer 520, respectively.

The first contact electrode 710 may be disposed in the first opening OP1 penetrating the first insulating layer 520 and the third insulating layer 530 in the first sub-emission area CA1. The first contact electrode 710 may be disposed in the first opening OP1 defined by the sidewalls of the first insulating layer 520 and the third insulating layer 530. The first contact electrode 710 may be disposed on the side surface of the fixing pattern 521 in the first sub-emission area CA1, but may not be disposed on the top surface of the fixing pattern 521.

The first contact electrode 710 may be electrically connected to the first electrode 210 through the first contact hole CNT1 penetrating the second insulating layer 510. The first contact electrode 710 may be in contact with the top surface of the first electrode 210 exposed by the first contact hole CNT1. The first contact electrode 710 may be in contact with the first end of the first light emitting element ED1 exposed to the fixing pattern 521 and the third insulating layer 530. For example, the first contact electrode 710 may be in contact with the first electrode 210 and the first end of the first light emitting element ED1 to electrically connect them.

The third contact electrode 730 may be disposed in the third opening OP3 penetrating the first insulating layer 520. The third contact electrode 730 may be disposed in the third opening OP3 defined by the sidewalls of the first insulating layer 520 and the third insulating layer 530. The second insulating layer 510 may be interposed between the third contact electrode 730 and the electrode layer 200. Therefore, the third contact electrode 730 may be insulated from the first electrode 210 or the second electrode 220.

The third contact electrode 730 may be a connection electrode that electrically connects the first light emitting element ED1 and the second light emitting element ED2 in series while being in contact with the second end of the first light emitting element ED1 and the first end of the second light emitting element ED2.

For example, the third contact electrode first area 731 may be disposed in the third opening first area OP3_A penetrating the first insulating layer 520 and the third insulating layer 530 in the third sub-emission area CA1. The third contact electrode first area 731 may be disposed in the third opening first area OP3_A defined by the sidewalls of the first insulating layer 520 and the third insulating layer 530. The third contact electrode first area 731 may be disposed on the side surface of the fixing pattern 521 in the first sub-emission area CA1, but may not be disposed on the top surface of the fixing pattern 521. The third contact electrode first area 731 may face the first contact electrode 710 while being spaced apart therefrom with the fixing pattern 521 interposed therebetween. The third contact electrode first area 731 may be in contact with the second end of the first light emitting element ED1 exposed to the fixing pattern 521 and the third insulating layer 530.

The third contact electrode second area 732 may be disposed in the third opening second area OP3_B penetrating the first insulating layer 520 and the third insulating layer 530 in the second sub-emission area CA2. The third contact electrode second area 732 may be disposed in the third opening second area OP3_B defined by the sidewalls of the first insulating layer 520 and the third insulating layer 530. The third contact electrode second area 732 may be disposed on the side surface of the fixing pattern 521 in the second sub-emission area CA2, but may not be disposed on the top surface of the fixing pattern 521. The third contact electrode second area 732 may face the second contact electrode 720 while being spaced apart therefrom with the fixing pattern 521 interposed therebetween. The third contact electrode second area 732 may be in contact with the first end of the second light emitting element ED2 exposed to the fixing pattern 521 and the third insulating layer 530.

The third contact electrode third area 733 may be disposed between the third contact electrode first area 731 and the third contact electrode second area 732. The third contact electrode third area 733 may be disposed between the third contact electrode first area 731 and the third contact electrode second area 732 to electrically connect them. The third contact electrode third area 733 may be disposed in the second sub-area NCA but may not be disposed in the alignment area AA. The third contact electrode third area 733 may be disposed outside the first and second sub-emission areas CA1 and CA2 to surround the second contact electrode 720. The third contact electrode third area 733 disposed between the third contact electrode first area 731 and the third contact electrode second area 732 may be a connection electrode that electrically connects the first light emitting element ED1 and the second light emitting element ED2 in series by electrically connecting the third contact electrode first area 731 and the third contact electrode second area 732.

The second contact electrode 720 may be disposed in the second opening OP2 penetrating the first insulating layer 520 and the third insulating layer 530 in the second sub-emission area CA2. The second contact electrode 720 may be disposed in the second opening OP2 defined by the sidewalls of the first insulating layer 520 and the third insulating layer 530. The second contact electrode 720 may be disposed on the side surface of the fixing pattern 521 in the second sub-emission area CA2, but may not be disposed on the top surface of the fixing pattern 521.

The second contact electrode 720 may be electrically connected to the second electrode 220 through the second contact hole CNT2 penetrating the second insulating layer 510. The second contact electrode 720 may be in contact with the top surface of the second electrode 220 exposed by the second contact hole CNT2. The second contact electrode 720 may be in contact with the second end of the second light emitting element ED2 exposed to the fixing pattern 521 and the third insulating layer 530. For example, the second contact electrode 720 may be in electrical contact with the second electrode 220 and the second end of the second light emitting element ED2 to electrically connect them.

The first insulating layer 520 and the third insulating layer 530 may be arranged to extend in the first direction DR1 in the second sub-area NCA between the first sub-emission area CA1 and the second sub-emission area CA2. The first insulating layer 520 and the third insulating layer 530 may be arranged to cover or overlap the member disposed therebelow in the second sub-area NCA located between the first sub-emission area CA1 and the second sub-emission area CA2. Therefore, the first insulating layer 520 and the third insulating layer 530 may completely cover or overlap the second type light emitting element ED_B disposed in the alignment area AA overlapping the second sub-area NCA.

For example, the fixing pattern 521 of the first insulating layer 520 may extend in the second direction DR2 without disconnection in the alignment area AA to fix the light emitting elements ED arranged in the alignment area AA. Further, since the division pattern 522 of the first insulating layer 520 is formed to extend in the first direction DR1 between the first sub-emission area CA1 and the second sub-emission area CA2, the division pattern 522 distinguishes the first sub-emission area CA1 and the second sub-emission area CA2 and completely covers or overlaps the second type light emitting element ED_B disposed in the second sub-area NCA to prevent the contact between the second type light emitting element ED_B and the contact electrode 700.

In the display device 10 according to an embodiment, the fixing pattern 521 is disposed without disconnection in the alignment area AA where the light emitting elements ED are arranged to prevent the separation of the light emitting elements ED from the alignment area AA. Further, although the fixing pattern 521 is disposed without disconnection in the alignment area AA, the light emitting elements ED may be electrically connected in series in two stages by forming a part of the third contact electrode 730 that connects the light emitting element ED disposed in the first sub-emission area CA1 located on the upper side in the emission area EMA in a plan view to the light emitting element ED disposed in the second sub-emission area CA2 located on the lower side in the emission area EMA in a plan view to bypass the outside of the sub-emission area CA. Therefore, it is possible to improve the quality of the display device 10 by preventing the separation of the light emitting elements ED arranged in the alignment area AA while maintaining the number of series connections of the light emitting elements ED.

Figure 12:
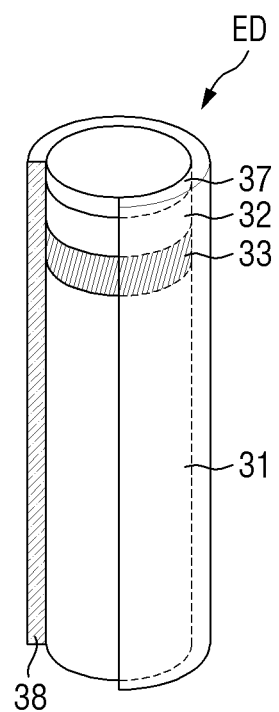
FIG. 12 is a schematic diagram of a light emitting element according to an embodiment.

FIG. 12 is a schematic diagram of a light emitting element according to an embodiment.

Referring to FIG. 12, the light emitting element ED which is a particulate element may have substantially a rod or substantially cylindrical shape having an aspect ratio. The length of the light emitting element ED may be larger than the diameter of the light emitting element ED, and the aspect ratio may be in a range of about 6:5 to about 100:1, but the disclosure is not limited thereto.

The light emitting element ED may have a size of a nanometer scale (equal to or greater than 1 nm and less than 1 μm) to a micrometer scale (equal to or greater than 1 μm and less than 1 mm). In an embodiment, both the diameter and the length of the light emitting element ED may be on a nanometer scale, or on a micrometer scale. In an embodiment, the diameter of the light emitting element ED may be on a nanometer scale, while the length of the light emitting element ED may be on a micrometer scale. In an embodiment, some or part of the light emitting elements ED may have a diameter and/or length on a nanometer scale, while some others of the light emitting elements ED may have a diameter and/or length on a micrometer scale.

In an embodiment, the light emitting element ED may be an inorganic light emitting diode. The inorganic light emitting diode may include semiconductor layers. For example, the inorganic light emitting diode may include a first conductive (for example, n-type) semiconductor layer, a second conductive (for example, p-type) semiconductor layer, and an active semiconductor layer interposed therebetween. The active semiconductor layer may receive holes and electrons from the first conductive semiconductor layer and the second conductive semiconductor layer, respectively, and the holes and electrons that have reached the active semiconductor layer may be coupled to emit light.

In an embodiment, the above-described semiconductor layers may be sequentially stacked each other along the longitudinal direction of the light emitting element ED. As shown in FIG. 12, the light emitting element ED may include a first semiconductor layer 31, an element active layer 33, and a second semiconductor layer 32 that may be sequentially stacked each other in the longitudinal direction. The first semiconductor layer 31, the element active layer 33, and the second semiconductor layer 32 may be the first conductive semiconductor layer, the active semiconductor layer, and the second conductive semiconductor layer described above, respectively.

The first semiconductor layer 31 may be doped with a first conductive dopant. The first conductive dopant may be Si, Ge, Sn, or the like within the spirit and the scope of the disclosure. In an embodiment, the first semiconductor layer 31 may be n-GaN doped with n-type Si.

The second semiconductor layer 32 may be spaced apart from the first semiconductor layer 31 with the element active layer 33 interposed therebetween. The second semiconductor layer 32 may be doped with a second conductive dopant such as Mg, Zn, Ca, Se, Ba, or the like within the spirit and the scope of the disclosure. In an embodiment, the second semiconductor layer 32 may be p-GaN doped with p-type Mg.

The element active layer 33 may include a material having a single or multiple quantum well structure. As described above, the element active layer 33 may emit light by coupling of electron-hole pairs according to an electrical signal applied through the first semiconductor layer 31 and the second semiconductor layer 32.

In an embodiment, the element active layer 33 may have a structure in which semiconductor materials having large band gap energy and semiconductor materials having small band gap energy may be alternately stacked each other, and may include other group III to V semiconductor materials according to the wavelength band of the emitted light.

The light emitted from the element active layer 33 may be projected through both side surfaces as well as the outer surface of the light emitting element ED in a longitudinal direction. For example, the directionality of light emitted from the element active layer 33 is not limited to one direction.

The light emitting element ED may further include an element electrode layer 37 disposed on the second semiconductor layer 32. The element electrode layer 37 may be in contact with the second semiconductor layer 32. The element electrode layer 37 may be an Ohmic contact electrode. However, the element electrode layer 37 is not limited thereto, and may be a Schottky contact electrode.

In case that both ends of the light emitting element ED are electrically connected to the contact electrodes 700 to apply an electrical signal to the first and second semiconductor layers 31 and 32, the element electrode layer 37 may be disposed between the second semiconductor layer 32 and the electrode to reduce resistance. The element electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). The element electrode layer 37 may include an n-type or p-type doped semiconductor material.

The light emitting element ED may further include an element insulating layer 38 surrounding the outer peripheral surfaces of the first semiconductor layer 31, the second semiconductor layer 32, and the element active layer 33 and/or the element electrode layer 37. The element insulating layer 38 may be disposed to surround at least the outer surface of the element active layer 33 and may extend in one direction in which the light emitting element ED extends. The element insulating layer 38 may function to protect the members. Since the element insulating layer 38 is made of materials having insulating properties, it is possible to prevent an electrical short circuit that may occur in case that the element active layer 33 contacts or directly contacts an electrode through which an electrical signal is transmitted to the light emitting element ED. Further, since the element insulating layer 38 may include the element active layer 33 to protect the outer peripheral surfaces of the first and second semiconductor layers 31 and 32, it is possible to prevent degradation in light emission efficiency.

Figure 13:
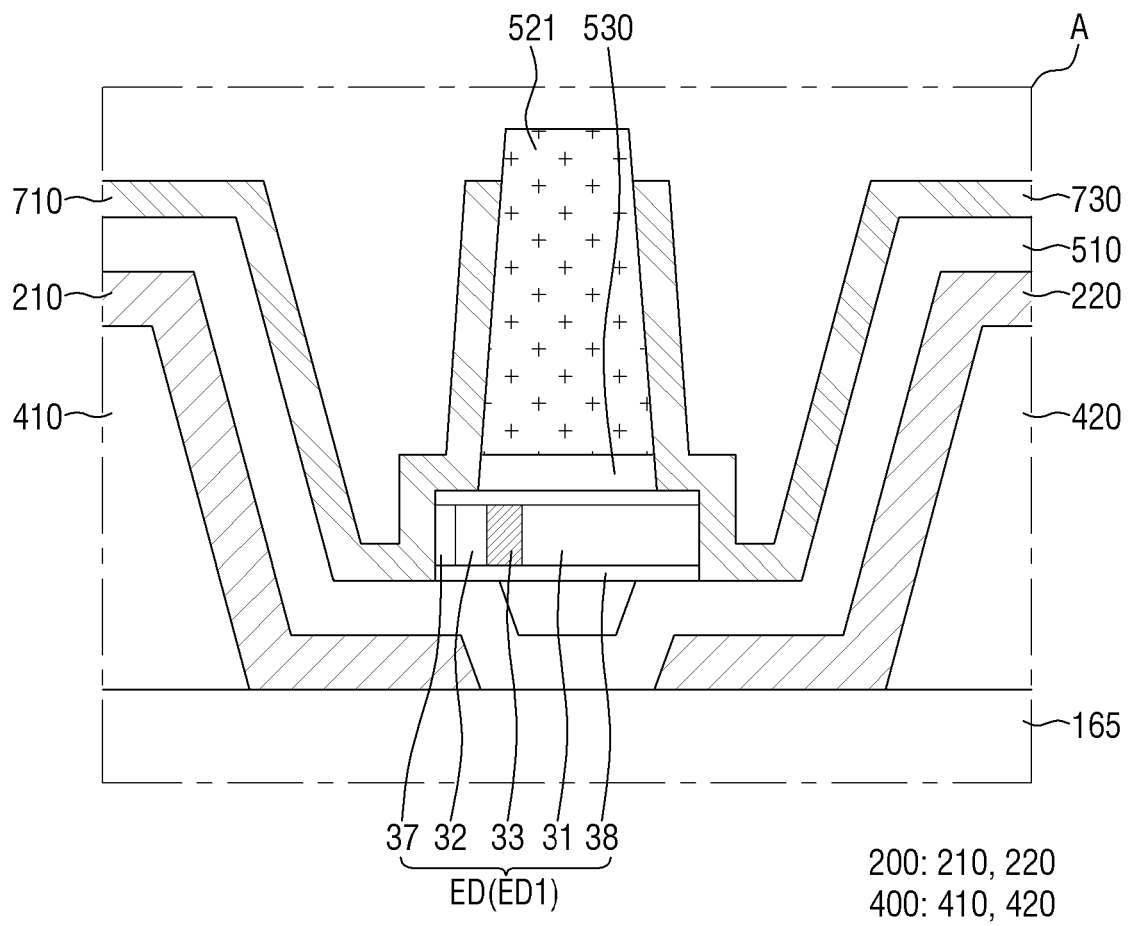
FIG. 13 is an enlarged schematic cross-sectional view of area A of FIG. 7.

FIG. 13 is an enlarged schematic cross-sectional view of area A of FIG. 7.

Referring to FIGS. 12 and 13, the light emitting element ED may extend in parallel to the top surface of the substrate SUB (or the via layer 165). The semiconductor layers included in the light emitting element ED may be sequentially arranged along the direction parallel to the top surface of the substrate SUB. For example, the first semiconductor layer 31, the element active layer 33, and the second semiconductor layer 32 of the light emitting element ED may be sequentially arranged in the direction parallel to the top surface of the substrate SUB.

For example, in the light emitting element ED, the first semiconductor layer 31, the element active layer 33, the second semiconductor layer 32, and the element electrode layer 37 may be sequentially formed in the direction parallel to the top surface of the substrate SUB in a schematic cross-sectional view across both ends of the light emitting element ED.

The light emitting element ED may be disposed such that the first end is located on the first electrode 210 and the second end is located on the second electrode 220. However, the disclosure is not limited thereto, and the light emitting element ED may be disposed such that the first end is located on the second electrode 220 and the second end is located on the first electrode 210.

The third insulating layer 530 and the fixing pattern 521 of the first insulating layer 520 may be arranged on the light emitting element ED in the alignment area AA, and the third insulating layer 530 and the fixing pattern 521 may be arranged to expose both ends of the light emitting element ED on the light emitting element ED.

The widths of the third insulating layer 530 and the fixing pattern 521 in the first direction DR1 may be smaller than the width of the fixing pattern 521 in the first direction DR1, for example, the extension length of the light emitting element ED. Since the widths of the third insulating layer 530 and the fixing pattern 521 in the first direction DR1 is smaller than the extension length of the light emitting element ED, the third insulating layer 530 and the fixing pattern 521 may expose both ends of the light emitting element ED.

The first contact electrode 710 may be in contact with the light emitting element ED, for example, the first end of the first light emitting element ED1. The first contact electrode 710 may be disposed on the side surfaces of the third insulating layer 530 and the fixing pattern 521 arranged on the first light emitting element ED1. The third contact electrode 730 may be in contact with the second end of the first light emitting element ED1. The third contact electrode 730 may be disposed on the side surfaces of the third insulating layer 530 and the fixing pattern 521 arranged on the first light emitting element ED1. The first contact electrode 710 and the third contact electrode 730 may be spaced apart from each other with the third insulating layer 530 and the fixing pattern 521 arranged on the first light emitting element ED1 interposed therebetween.

Figure 14:
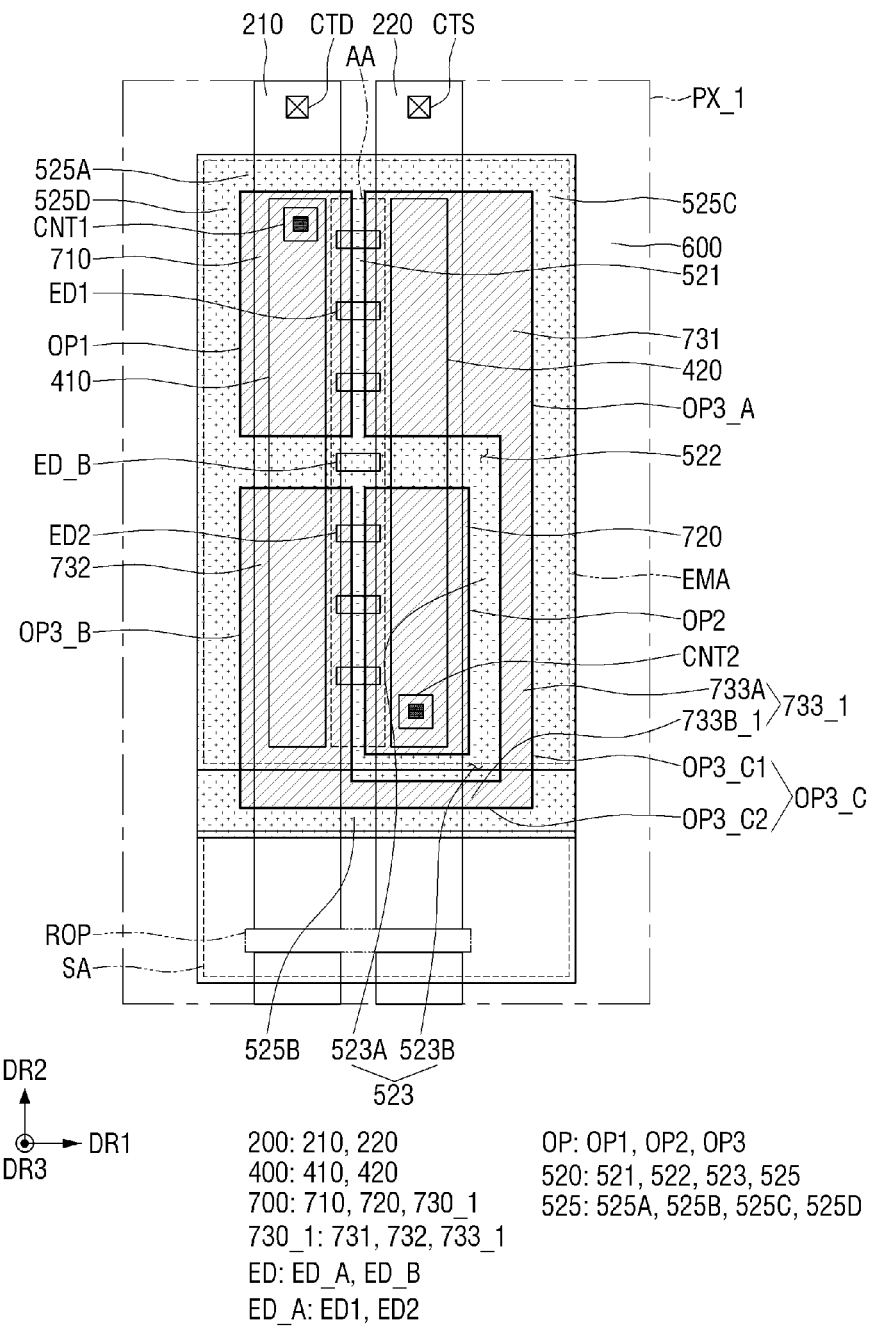
FIG. 14 is a schematic plan view illustrating one pixel of a display device according to an embodiment.

FIG. 14 is a plan view illustrating one pixel of a display device according to an embodiment.

Referring to FIG. 14, one pixel PX_1 of the display device 10 according to an embodiment may be different from an embodiment of FIG. 3 in that the area OP3_C2 of the third opening third area OP3_C of the first insulating layer 520, where the second base portion 525B and the second sub-connection pattern 523B face each other while being spaced apart from each other, may be disposed on the second bank 600.

For example, the third opening third area OP3_C may include the area OP3_C1 where the third base portion 525C and the first sub-connection pattern 523A face each other while being spaced apart from each other and the area OP3_C2 where the second base portion 525B and the second sub-connection pattern 523B face each other while being spaced apart from each other. The second base portion 525B may be disposed on the second bank 600 disposed between the emission area EMA and the first sub-area SA. Therefore, the partial area OP3_C2 of the third opening third area OP3_C, where the second base portion 525B and the second sub-connection pattern 523B face each other while being spaced apart from each other, may be formed on the second bank 600. Therefore, a second portion 733B_1 of a third contact electrode third area 733_1 may be disposed on the second bank 600 located between the emission area EMA and the first sub-area SA.

In accordance with the display device 10 according to an embodiment, although the second portion 733B_1 of the third contact electrode third area 733_1 is disposed on the second bank 600, the fixing pattern 521 may be formed to extend in the second direction DR2 in the alignment area AA. Therefore, the light emitting elements ED arranged in the alignment area AA are fixed by the fixing pattern 521 and the division pattern 522, which makes it possible to prevent the light emitting elements ED from being separated from the alignment area AA. Accordingly, it is possible to improve the reliability of the display device 10 by preventing damage, contamination, or the like of other members that may occur due to the separation of the light emitting elements ED of the display device 10.

Figure 15:
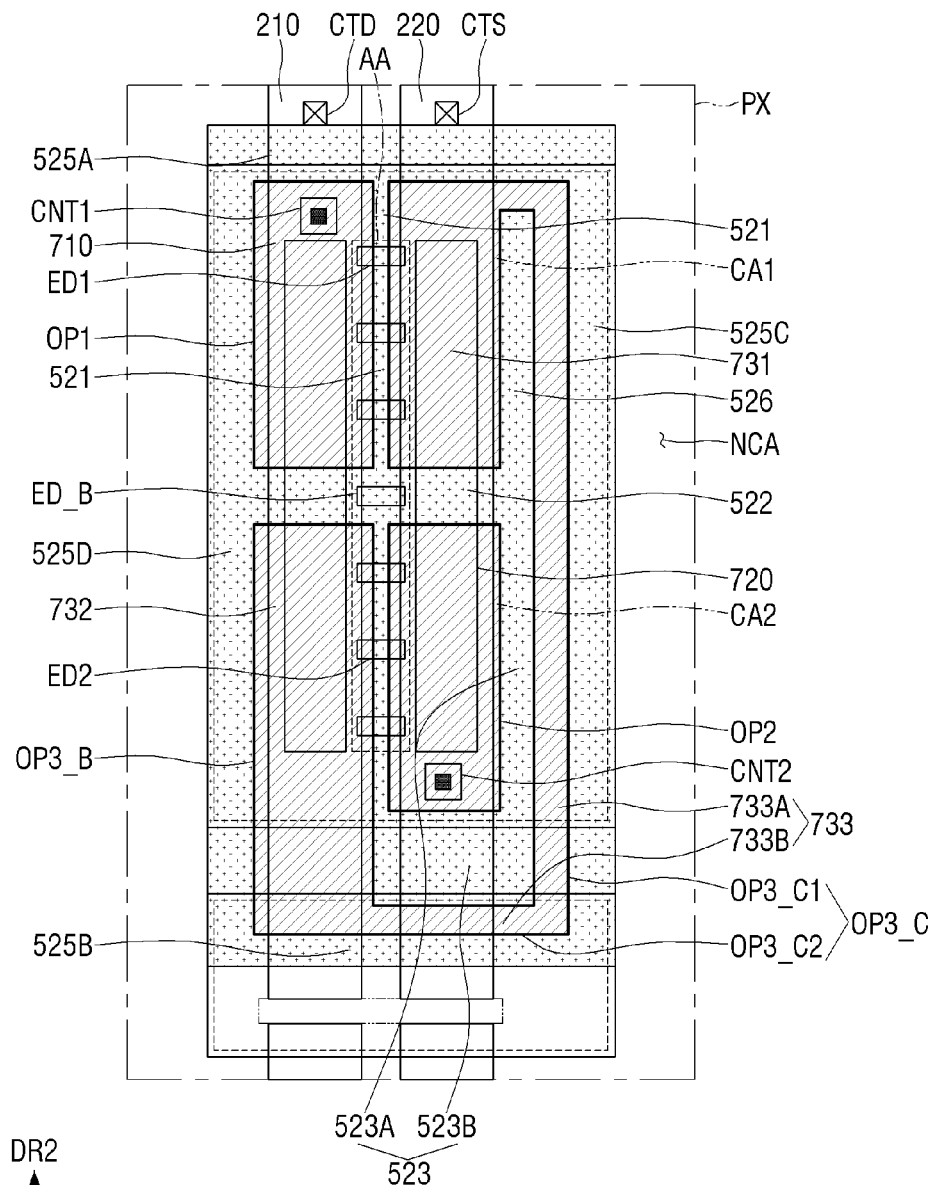
FIG. 15 is a schematic plan view illustrating one pixel of a display device according to an embodiment.

FIG. 15 is a plan view illustrating one pixel of a display device according to an embodiment.

Referring to FIG. 15, one pixel PX of the display device 10 according to an embodiment may be different from an embodiment of FIG. 3 in that a first auxiliary pattern 526 extending from the division pattern 522 and the connection pattern 523 may be further included.

For example, the first insulating layer 520 may include the first auxiliary pattern 526 extending from the first end of the division pattern 522 and the first sub-connection pattern 523A of the connection pattern 523 in the second direction DR2. The first auxiliary pattern 526 may extend in the second direction DR2 and may be spaced apart from the first base portion 525A. Therefore, the third contact electrode first area 731 in contact with the second end of the first light emitting element ED1 and the third contact electrode second area 732 in contact with the first end of the second light emitting element ED2 may be electrically connected to each other by the third contact electrode third area 733. Therefore, the first light emitting element ED1 and the second light emitting element ED2 may be electrically connected in series by the third contact electrode 730.

Figure 16:
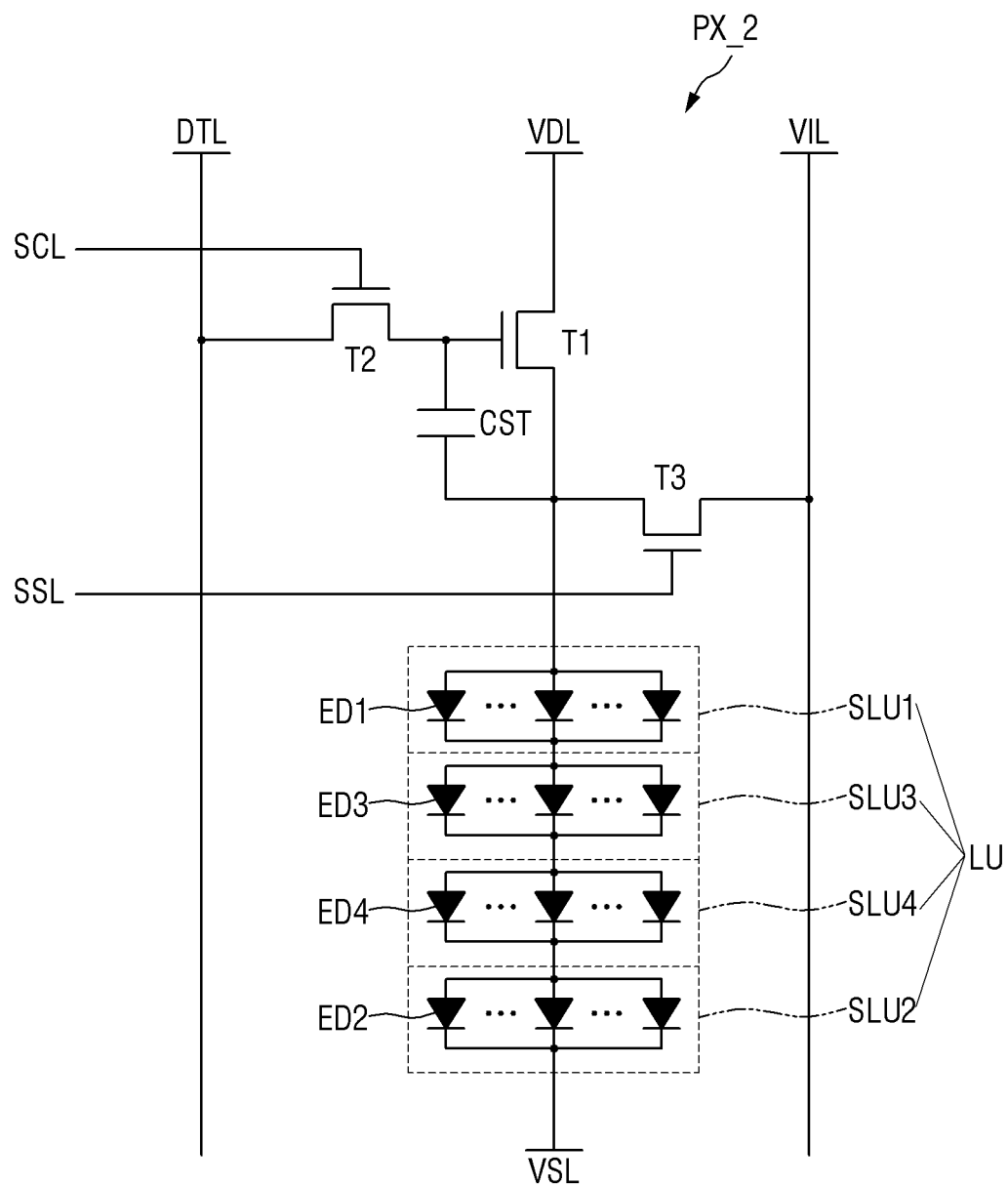
FIG. 16 is a schematic diagram of an equivalent circuit of a pixel of a display device according to an embodiment.

FIG. 16 is a schematic diagram of an equivalent circuit of a pixel of a display device according to an embodiment.

Referring to FIG. 16, one pixel PX_2 according to an embodiment may be different from an embodiment of FIG. 2 in that it may include the light source unit LU including first to fourth light emitting groups SLU1, SLU2, SLU3, and SLU4 electrically connected in series. On the other hand, one pixel PX_2 according to an embodiment may include a pixel driving circuit having the same structure as that of one pixel PX of FIG. 2 except that the light source unit LU may include the first to fourth light emitting groups SLU1, SLU2, SLU3, and SLU4. Hereinafter, in the schematic diagram of an equivalent circuit of a pixel PX_2 according to an embodiment, the differences from one pixel PX of FIG. 2 will be described, and the description of the same components will be replaced with the description of the schematic diagram of an equivalent circuit of a pixel of FIG. 2.

For example, the light source unit LU may include the first electrode, the second electrode, and the first to fourth light emitting groups SLU1, SLU2, SLU3, and SLU4 arranged therebetween and electrically connected in series. The first light emitting group SLU1 may be electrically connected to the source electrode of the first transistor T1 through the first electrode of the light source unit LU, and the second light emitting group SLU2 may be electrically connected to the second voltage line VSL through the second electrode of the light source unit LU. The third light emitting group SLU3 may be disposed between the first light emitting group SLU1 and the second light emitting group SLU2 and electrically connected in series with the first light emitting group SLU1. The fourth light emitting group SLU4 may be disposed between the third light emitting group SLU3 and the second light emitting group SLU2 and electrically connected in series with the third light emitting group SLU3 and the second light emitting group SLU2.

The first light emitting group SLU1 may include the first light emitting elements ED1 electrically connected in parallel, the second light emitting group SLU2 may include the second light emitting elements ED2 electrically connected in parallel, the third light emitting group SLU3 may include the third light emitting elements ED3 electrically connected in parallel, and the fourth light emitting group SLU4 may include the fourth light emitting elements ED4 electrically connected in parallel. The first to fourth light emitting elements ED1, ED2, ED3, and ED4 may be electrically connected in series.

For example, one end or an end of the first light emitting element ED1 included in the first light emitting group SLU1 may be electrically connected to the source electrode of the first transistor T1 through the first electrode of the light source unit LU, and the other end of the first light emitting element ED1 included in the first light emitting group SLU1 may be electrically connected to one end or an end of the third light emitting element ED3 included in the third light emitting group SLU3. Further, the other end or another end of the third light emitting element ED3 included in the third light emitting group SLU3 may be electrically connected to one end or an end of the fourth light emitting element ED4 included in the fourth light emitting group SLU4, and the other end or another end of the fourth light emitting element ED4 included in the fourth light emitting group SLU4 may be electrically connected to one end or an end of the second light emitting element ED2 included in the second light emitting group SLU2. The other end or another end of the second light emitting element ED2 included in the second light emitting group SLU2 may be electrically connected to the second voltage line VSL through the second electrode of the light source unit LU.

For example, each of the first to fourth light emitting groups SLU1, SLU2, SLU3, and SLU4 electrically connected in series may include one or more light emitting elements ED electrically connected in parallel, and the light emitting element ED included in each of the light emitting groups SLU1, SLU2, SLU3, and SLU4 may emit light of a wavelength band by the electrical signals transmitted from the first electrode and the second electrode.

Figure 17:
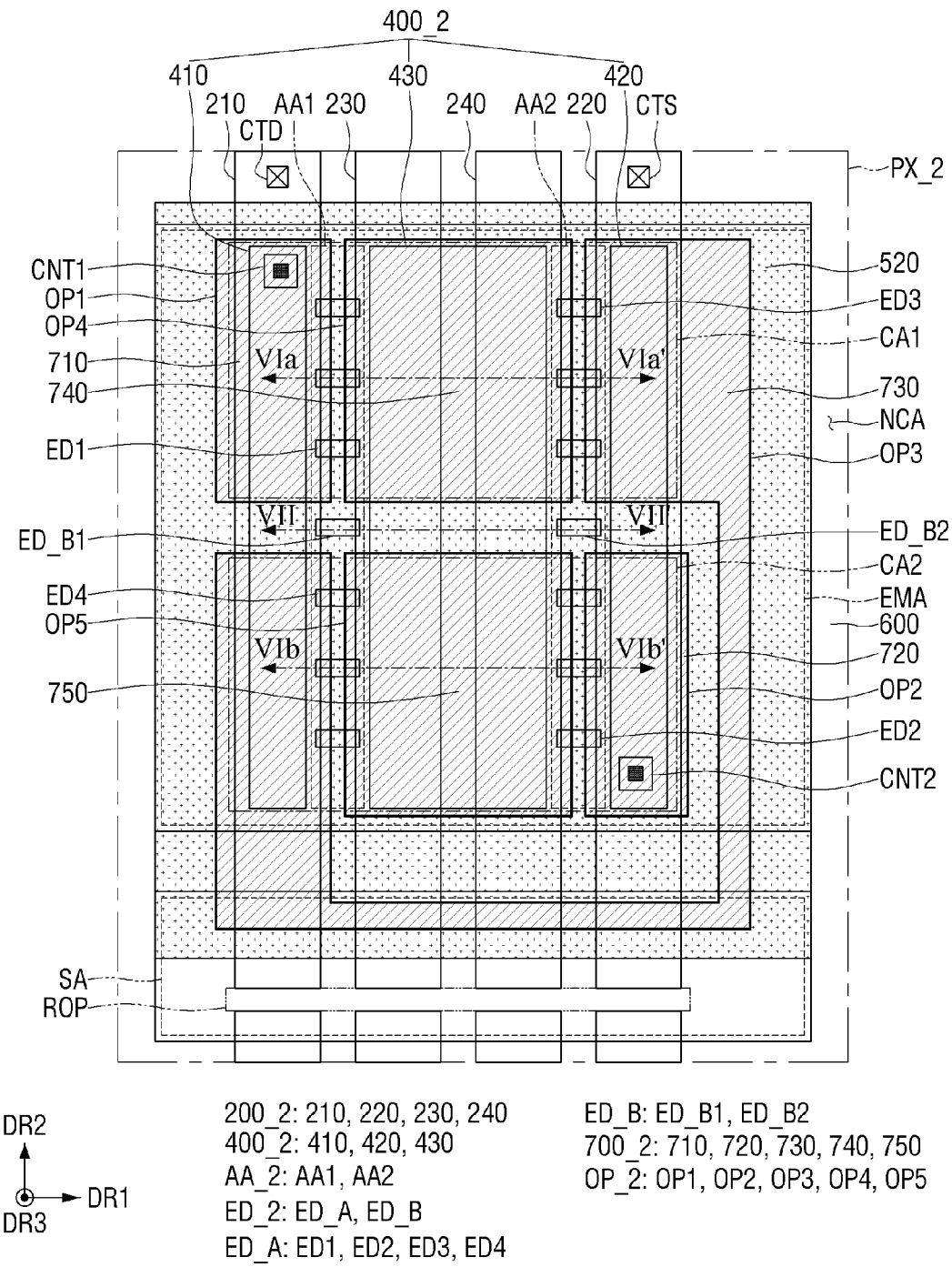
FIG. 17 is a schematic plan view showing one pixel of FIG. 16.
Figure 18:
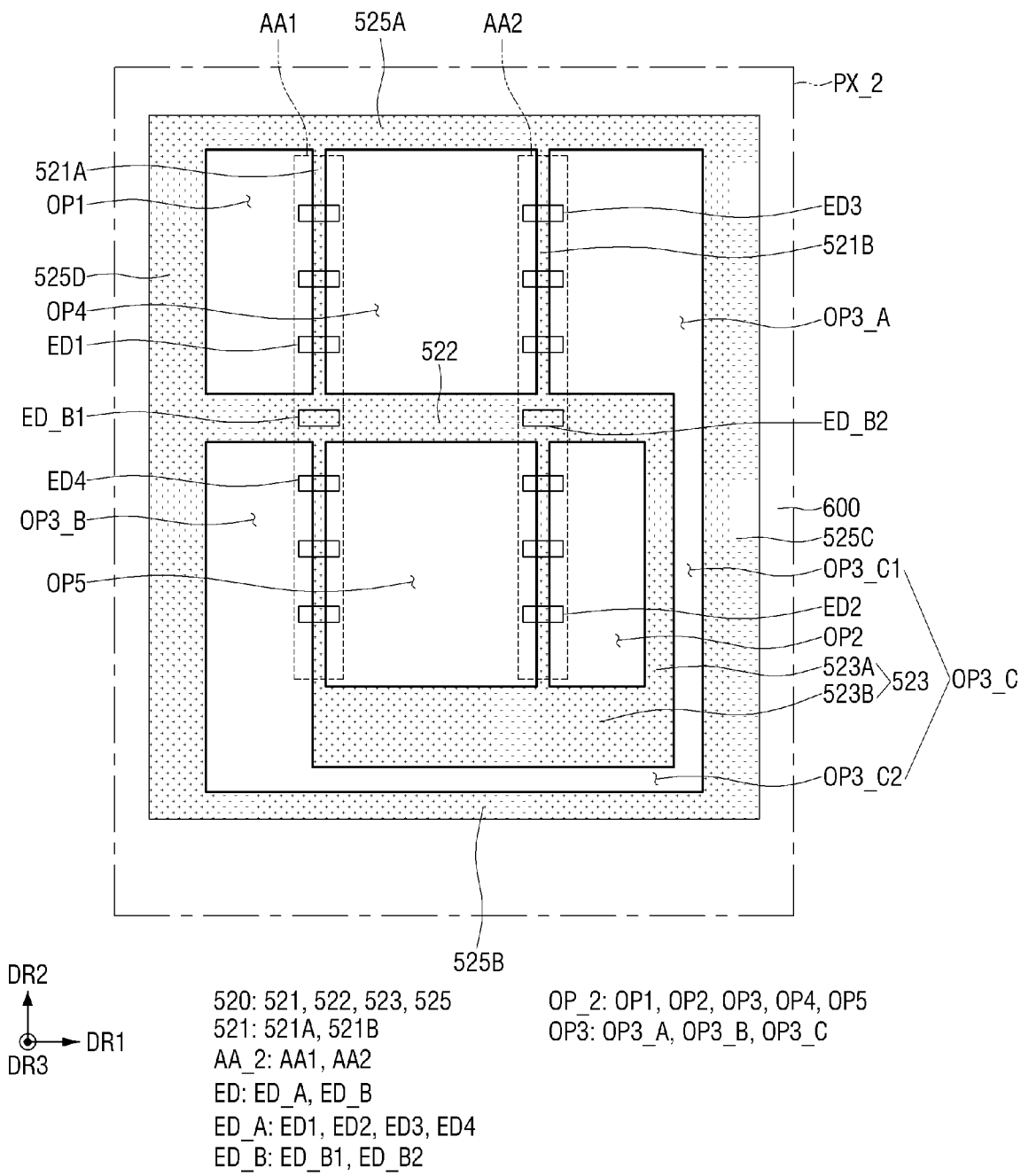
FIG. 18 is a schematic plan view illustrating the first insulating layer and the openings of the first insulating layer included in one pixel of the display device shown in FIG. 17.
Figure 19:
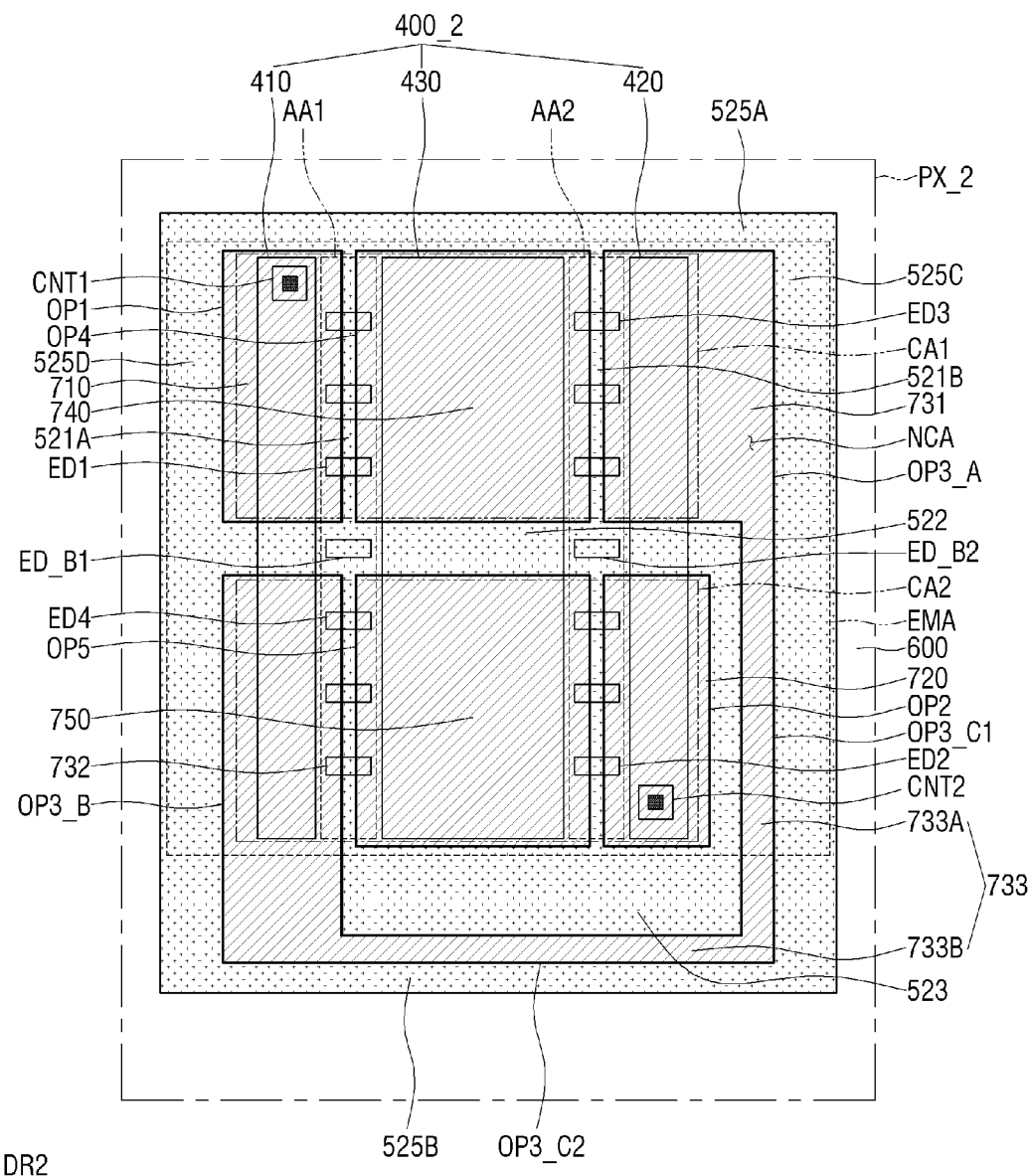
FIG. 19 is a schematic plan view illustrating the relative plan layout between the contact electrodes and the first insulating layer included in one pixel of the display device shown in FIG. 17.

FIG. 17 is a plan view showing one pixel of FIG. 16. FIG. 18 is a plan view illustrating the first insulating layer and the openings of the first insulating layer included in one pixel of the display device shown in FIG. 17. FIG. 19 is a plan view illustrating the relative plan layout between the contact electrodes and the first insulating layer included in one pixel of the display device shown in FIG. 17.

Referring to FIGS. 17 to 19, one pixel PX_2 of the display device 10 according to an embodiment may be different from an embodiment of FIGS. 3 to 6 in that an electrode layer 200_2 further may include a third electrode 230 and a fourth electrode 240, a contact electrode 700_2 further may include a fourth contact electrode 740 and a fifth contact electrode 750, the first insulating layer 520 further may include a fourth opening OP4 and a fifth opening OP5, a first bank 400_2 further may include a third sub-bank 430, and the first type light emitting elements ED_A may include the first to fourth light emitting elements ED1, ED2, ED3, and ED4 electrically connected in series in four stages.

Hereinafter, the plan layout of the electrode layer 200_2, the contact electrode 700_2, the first bank 400_2, the first insulating layer 520, and the light emitting elements ED_2 arranged in one pixel PX_2 of the display device 10 according to an embodiment will be described with reference to FIGS. 17 to 19. In the following description, a repeated description will be omitted and differences will be described.

The first bank 400_2 may further include the third sub-bank 430 disposed between the first sub-bank 410 and the second sub-bank 420 and extending in the second direction DR2. The third sub-bank 430 may be located at the center of the emission area EMA.

The third sub-bank 430 may be disposed between the first sub-bank 410 and the second sub-bank 420 and may be spaced apart from the first sub-bank 410 and the second sub-bank 420. The third sub-bank 430 may face the first sub-bank 410 and the second sub-bank 420 while being spaced apart therefrom in the first direction DR1, and the light emitting elements ED_2 may be arranged in the area where the third sub-bank 430 face the first sub-bank 410 and the second sub-bank 420 while being spaced apart therefrom. For example, the light emitting elements ED_2 may be arranged in the area where the first sub-bank 410 and the third sub-bank 430 face each other while being spaced apart from each other and in the area where the second sub-bank 420 and the third sub-bank 430 face each other while being spaced apart from each other.

Since an alignment area AA_2 is defined as an area between the sub-banks 410, 420, and 430 in the emission area EMA as described above, the substantially planar shape of the alignment area AA_2 may be substantially similar to the substantially planar shape of the area where the sub-banks 410, 420, and 430 face each other while being spaced apart from each other. Therefore, the alignment area AA_2 included in one pixel PX_2 according to an embodiment may include a first alignment area AA1 where the first sub-bank 410 and the third sub-bank 430 face each other while being spaced apart from each other and a second alignment area AA2 where the second sub-bank 420 and the third sub-bank 430 face each other while being spaced apart from each other. The first alignment area AA1 and the second alignment area AA2 may be spaced apart from each other in the first direction DR1. Therefore, the light emitting elements ED_2 may be aligned in two columns in the emission area EMA while being aligned in one row in the entire first alignment area AA1 and in one row in the entire second alignment area AA2.

The electrode layer 200_2 may include the first to fourth electrodes 210, 220, 230, and 240. The first to fourth electrodes 210, 220, 230, and 240 may extend in the second direction DR2 and may be spaced apart from each other in the first direction DR1.

For example, the first electrode 210 may extend in the second direction DR2 to be disposed across the emission area EMA and the first sub-area SA. The first electrode 210 may be located on the left side of each pixel PX in a plan view. The first electrode 210 may extend in the second direction DR2 in a plan view and may be separated from the first electrode 210 of the pixel PX adjacent thereto in the second direction DR2 at the separation portion ROP of the first sub-area SA. The first electrode 210 may be electrically connected to the first transistor of the circuit element layer CCL through the first electrode contact hole CTD.

The second electrode 220 may extend in the second direction DR2 to be disposed across the emission area EMA and the first sub-area SA. The second electrode 220 may be separated from the first electrode 210 in the first direction DR1. The second electrode 220 may be located on the right side of each pixel PX in a plan view. The second electrode 220 may extend in the second direction DR2 in a plan view and may be separated from the second electrode 220 of the pixel PX adjacent thereto in the second direction DR2 at the separation portion ROP of the first sub-area SA. The second electrode 220 may be electrically connected to the second voltage line VSL of the circuit element layer CCL through the second electrode contact hole CTS.

The third electrode 230 may extend in the second direction DR2 to be disposed across the emission area EMA and the first sub-area SA. The third electrode 230 may be disposed between the first electrode 210 and the second electrode 220. The third electrode 230 may be separated from each of the first electrode 210 and the second electrode 220 in the first direction DR1. The third electrode 230 may be located at the center of each pixel PX in a plan view. The third electrode 230 may extend in the second direction DR2 in a plan view and may be separated from the third electrode 230 of the pixel PX adjacent thereto in the second direction DR2 at the separation portion ROP of the first sub-area SA. The third electrode 230 may not be electrically connected to the circuit element layer CCL unlike the first electrode 210 and the second electrode 220.

The fourth electrode 240 may extend in the second direction DR2 to be disposed across the emission area EMA and the first sub-area SA. The fourth electrode 240 may be disposed between the third electrode 230 and the second electrode 220. The fourth electrode 240 may be separated from each of the third electrode 230 and the second electrode 220 in the first direction DR1. The fourth electrode 240 may be located at the center of each pixel PX in a plan view. The fourth electrode 240 may extend in the second direction DR2 in a plan view and may be separated from the fourth electrode 240 of the pixel PX adjacent thereto in the second direction DR2 at the separation portion ROP of the first sub-area SA. The fourth electrode 240 may not be electrically connected to the circuit element layer CCL unlike the first electrode 210 and the second electrode 220 but similarly to the third electrode 230.

The first electrode 210 may be disposed on the first sub-bank 410 in the emission area EMA, and the second electrode 220 may be disposed on the second sub-bank 420 in the emission area EMA. The third electrode 230 and the fourth electrode 240 may be arranged on the third sub-bank 430 in the emission area EMA, and the third electrode 230 and the third sub-bank 430 may face each other while being spaced apart from each other in the first direction DR1 on the third bank 430. The third electrode 230 may be disposed to cover or overlap one side surface or a side surface of the third sub-bank 430 facing the first sub-bank 410, and the fourth electrode 240 may be disposed to cover or overlap the other side surface or another side surface of the third sub-bank 430 facing the second sub-bank 420.

As described above, the electrode layer 200_2 may include the electrodes 210, 220, 230, and 240 spaced apart from each other, and the electrodes 210, 220, 230, and 240 may be used for generating an electric field in the pixel PX_2 to align the light emitting elements ED_2 in the manufacturing process of the display device 10. In an embodiment, the light emitting elements ED_2 may be arranged between the first electrode 210 and the third electrode 230 by the electric field generated between the first electrode 210 and the third electrode 230, and may be arranged between the fourth electrode 240 and the second electrode 220 by the electric field generated between the fourth electrode 240 and the second electrode 220. For example, the light emitting elements ED_2 may be arranged in the first alignment area AA1 where the first electrode 210 disposed on the first sub-bank 410 and the third electrode 230 disposed on the third sub-bank 430 face each other while being spaced apart from each other and the second alignment area AA2 where the second electrode 220 disposed on the second sub-bank 420 and the fourth electrode 240 disposed on the third sub-bank 430 face each other while being spaced apart from each other in the emission area EMA.

The first electrode 210 may be electrically connected to the first transistor T1 through the first electrode contact hole CTD, and the second electrode 220 may be electrically connected to the second voltage line VSL through the second electrode contact hole CTS. The third electrode 230 and the fourth electrode 240 may not be connected to the circuit element layer CCL as described above. The third electrode 230 and the fourth electrode 240 may be alignment lines used to generate an electric field in the alignment step of the light emitting elements ED_2, and may be floating electrodes that are not electrically connected to the light emitting elements ED_2 after the alignment step of the light emitting elements ED_2.

The light emitting elements ED_2 may be arranged in the alignment area AA_2. The light emitting elements ED_2 may be the first type light emitting element ED_A that is in contact with the contact electrode 700_2 and the second type light emitting element ED_B that is not in contact with the contact electrode 700_2. The first type light emitting element ED_A is disposed in the first and second sub-emission areas CA1 and CA2 where the light emitting elements ED_2 are in contact with the contact electrode 700_2, and the second type light emitting element ED_B may be disposed in the second sub-area NCA where the light emitting elements ED_2 are not in contact with the contact electrode 700_2. For example, the first type light emitting element ED_A may be disposed in the area where the alignment area AA_2 and the first and second sub-emission areas CA1 and CA2 overlap, and the second type light emitting element ED_B may be disposed in the area where the alignment area AA_2 and the second sub-area NCA overlap.

The first light emitting group SLU1 (see FIG. 16) and the third light emitting group SLU3 (see FIG. 16) may be arranged in the first sub-emission area CA1, and the second light emitting group SLU2 (see FIG. 16) and the fourth light emitting group SLU4 (see FIG. 16) may be arranged. in the second sub-emission area CA2.

The first type light emitting element ED_A may include the first to fourth light emitting elements ED1, ED2, ED3, and ED4. Among the first type light emitting elements ED_A, the first type light emitting element ED_A disposed between the first electrode 210 and the third electrode 230 in the first sub-emission area CA1 may be defined as the first light emitting element ED1. Among the first type light emitting elements ED_A, the first type light emitting element ED_A disposed between the fourth electrode 240 and the second electrode 220 in the first sub-emission area CA1 may be defined as the third light emitting element ED3. Among the first type light emitting elements ED_A, the first type light emitting element ED_A disposed between the first electrode 210 and the third electrode 230 in the second sub-emission area CA2 may be defined as the fourth light emitting element ED4. Among the first type light emitting elements ED_A, the first type light emitting element ED_A disposed between the fourth electrode 240 and the second electrode 220 in the second sub-emission area CA2 may be defined as the second light emitting element ED2. For example, the first light emitting element ED1 may be disposed in the area where the first alignment area AA1 and the first sub-emission area CAL overlap, the fourth light emitting element ED4 may be disposed in the area where the first alignment area AA1 and the second sub-emission area CA2 overlap, the third light emitting element ED3 may be disposed in the area where the second alignment area AA2 and the first sub-emission area CA1 overlap, and the second light emitting element ED2 may be disposed in the area where the second alignment area AA2 and the second sub-emission area CA2 overlap.

The first light emitting element ED1 may be the light emitting element ED_2 disposed in the first alignment area AA1 and having both ends in contact with the first contact electrode 710 and the fourth contact electrode 740 to be described later. The third light emitting element ED3 may be the light emitting element ED_2 disposed in the second alignment area AA2 and having both ends in contact with the fourth contact electrode 740 and the third contact electrode 730 (or the third contact electrode first area 731. The fourth light emitting element ED4 may be the light emitting element ED_2 disposed in the first alignment area AA1 and having both ends in contact with the third contact electrode 730 (or the third contact electrode second area 732 and the fifth contact electrode 750 to be described later. The second light emitting element ED2 may be the light emitting element ED_2 disposed in the second alignment area AA2 and having both ends in contact with the fifth contact electrode 750 and the second contact electrode 720. The first light emitting element ED1 and the third light emitting element ED3 arranged in the first sub-emission area CA1 may be electrically connected in series through the fourth contact electrode 740. The third light emitting element ED3 disposed in the first sub-emission area CA1 and the fourth light emitting element ED4 disposed in the second sub-emission area CA2 may be electrically connected in series through the third contact electrode 730. The fourth light emitting element ED4 and the second light emitting element ED2 arranged in the second sub-emission area CA2 may be electrically connected in series through the fifth contact electrode 750. For example, the first to fourth light emitting elements ED1, ED2, ED3, and ED4 may be electrically connected in series through the third to fifth contact electrodes 730, 740, and 750.

The second type light emitting element ED_B may include a fifth light emitting element ED_B1 and a sixth light emitting element ED_B2. Among the second type light emitting elements ED_B, the second type of light emitting element ED_B disposed between the first electrode 210 and the third electrode 230 in the second sub-area NCA may be defined as the fifth light emitting element ED_B1. Among the second type light emitting elements ED_B, the second type light emitting element ED_B disposed between the fourth electrode 240 and the second electrode 220 in the second sub-area NCA may be defined as the sixth light emitting element ED_B2. For example, the fifth light emitting element ED_B1 may be disposed in the area where the first alignment area AA1 and the second sub-area NCA overlap, and the sixth light emitting element ED_B2 may be disposed in the area where the second alignment area AA2 and the second sub-area NCA overlap.

As described above, the first insulating layer 520 may include the fixing pattern 521, the division pattern 522, the connection pattern 523, and the base portion 525.

The fixing pattern 521 of the first insulating layer 520 according to an embodiment may include a first fixing pattern 521A disposed in the first alignment area AA1 and a second fixing pattern 521B disposed in the alignment area AA2. The first fixing pattern 521A has a shape extending in the second direction DR2 in the first alignment area AA1, and the second fixing pattern 521B may have a shape extending in the second direction DR2 in the second alignment area AA2. The first fixing pattern 521A and the second fixing pattern 521B may extend in the second direction DR2 without disconnection in the first alignment area AA1 and the second alignment area AA2, respectively. The first fixing pattern 521A may be disposed across the first sub-emission area CA1, the second sub-emission area CA2, and the second sub-area NCA located between the first sub-emission area CA1 and the second sub-emission area CA2 that overlap the first alignment area AA1. The second fixing pattern 521B may be disposed across the first sub-emission area CA1, the second sub-emission area CA2, and the second sub-area NCA located between the first sub-emission area CA1 and the second sub-emission area CA2 that overlap the second alignment area AA2. The first fixing pattern 521A and the second fixing pattern 521B may be spaced apart from each other in the first direction DR1.

The first fixing pattern 521A may be disposed on the light emitting elements ED_2 and the via layer 165 (see FIG. 7) exposed by the light emitting elements ED_2 in the first alignment area AA1. The first fixing pattern 521A may serve to fix the light emitting elements ED_2 arranged in the first alignment area AA1 to prevent the light emitting elements ED_2 from being separated from the first alignment area AA1 in a subsequent step of the alignment step of the light emitting elements ED_2.

For example, the first fixing pattern 521A may be disposed on the first light emitting element ED1, the fourth light emitting element ED4, and the fifth light emitting element ED_B1 in the first alignment area AA1 to partially surround the outer surfaces thereof. The first fixing pattern 521A may be disposed in the first alignment area AA1 to expose both ends of the first light emitting element ED1 and the fourth light emitting element ED4 that are the first type light emitting elements ED_A and to cover or overlap the fifth light emitting element ED_B1 that is the second type light emitting element ED_B.

Similarly, the second fixing pattern 521B may be disposed on the light emitting elements ED_2 and the second insulating layer 510 exposed by the light emitting elements ED_2 in the second alignment area AA2. The second fixing pattern 521B may serve to fix the light emitting elements ED_2 arranged in the second alignment area AA2 to prevent the light emitting elements ED_2 from being separated from the second alignment area AA2 in a subsequent step of the alignment step of the light emitting elements ED_2.

For example, the second fixing pattern 521B may be disposed on the third light emitting element ED3, the second light emitting element ED2, and the sixth light emitting element ED_B2 in the second alignment area AA2 to partially surround the outer surfaces thereof. The second fixing pattern 521B may be disposed in the second alignment area AA2 to expose both ends of the second light emitting element ED2 and the third light emitting element ED3 that are the first type light emitting elements ED_A and to cover or overlap the sixth light emitting element ED_B2 that is the second type light emitting element ED_B.

The division pattern 522 may be disposed between the first sub-emission area CA1 and the second sub-emission area CA2 in the emission area EMA. The first sub-emission area CA1 and the second sub-emission area CA2 may face each other while being spaced apart from each other with the division pattern 522 interposed therebetween.

The division pattern 522 may extend in the first direction DR1 intersecting the second direction DR2 between the first sub-emission area CA1 and the second sub-emission area CA2. The division pattern 522 may extend in the first direction DR1 to be disposed in the first alignment area AA1 and the second alignment area AA2 overlapping the second sub-area NCA. The division pattern 522 may intersect the first and second fixing patterns 521A and 521B in a plan view, and the division pattern 522 and the first and second fixing patterns 521A and 521B may be formed as one integrated pattern.

The division pattern 522 may completely cover or overlap the second type light emitting element ED_B disposed in the second sub-area NCA. For example, the division pattern 522 may completely cover or overlap the fifth light emitting element ED_B1 and the sixth light emitting element ED_B2 arranged in the second sub-area NCA. Since the fifth light emitting element ED_B1 and the sixth light emitting element ED_B2 arranged in the second sub-area NCA are completely covered or overlapped by the division pattern 522, the second type light emitting element ED_B may be stably fixed to the alignment area AA_2 by the first insulating layer 520 in a subsequent step of the alignment step of the light emitting elements ED_2.

The connection pattern 523 may be disposed between one end or an end of the first and second fixing patterns 521A and 521B and one end or an end of the division pattern 522 to connect one end or an end of the first and second fixing patterns 521A and 521B to one end or an end of the division pattern 522. For example, the connection pattern 523 may be connected to the first end of the first fixing pattern 521A, the first end of the second fixing pattern 521B, and the first end of the division pattern 522.

The connection pattern 523 may be connected to the first fixing pattern 521A, the second fixing pattern 521B, and the division pattern 522 to form a closed loop in a plan view together with them. For example, the connection pattern 523 may be connected to the first ends (lower ends in the drawing) of the first and second fixing patterns 521A and 521B and the first end (right end in the drawing) of the division pattern 522 in a plan view to form a closed loop together with the first and second fixing patterns 521A and 521B and the division pattern 522.

The connection pattern 523 may include the first sub-connection pattern 523A and the second sub-connection pattern 523B. The first sub-connection pattern 523A may have a shape connected to the first end of the division pattern 522 and extending in the second direction DR2. The second sub-connection pattern 523B may have a shape connected to the first end (lower end in the drawing) of the first fixing pattern 521A and the first end (lower end in the drawing) of the second fixing pattern 521B and extending in the first direction DR1. The first sub-connection pattern 523A may extend from the first end of the division pattern 522 in the second direction DR2, and the second sub-connection pattern 523B may extend from the first ends of the first and second fixing patterns 521A and 521B in the first direction DR1. The first sub-connection pattern 523A extending in the second direction DR2 may face the second fixing pattern 521B while being spaced apart therefrom, and the second sub-connection pattern 523B extending in the first direction DR1 may face the division pattern 522 while being spaced apart therefrom.

The first and second fixing patterns 521A and 521B, the division pattern 522, the first sub-connection pattern 523A, and the second sub-connection pattern 523B may form a closed loop in a plan view. The areas partitioned by the closed loop formed by the first and second fixing patterns 521A and 521B, the division pattern 522, the first sub-connection pattern 523A, and the second sub-connection pattern 523B may be the second opening OP2 and the fifth opening OP5 among the openings OP_2 to be described later. For example, the second opening OP2 and the fifth opening OP5 may be defined by the first and second fixing patterns 521A and 521B, the division pattern 522, the first sub-connection pattern 523A, and the second sub-connection pattern 523B.

The base portion 525 may be disposed to surround the first and second fixing patterns 521A and 521B, the division pattern 522, and the connection pattern 523 in a substantially closed loop shape. The base portion 525 may be connected to the first and second fixing patterns 521A and 521B and the division pattern 522, but may be spaced apart from the connection pattern 523. Each of the first fixing pattern 521A, the second fixing pattern 521B, and the division pattern 522 may be branched from a part of the base portion 525, and the connection pattern 523 may be disposed in the closed loop formed by the base portion 525 to face the base portion 525 while being spaced apart therefrom.

The first insulating layer 520 may include the first to fifth openings OP1, OP2, OP3, OP4, and OP5 penetrating the first insulating layer 520 and spaced apart from each other. For example, the first insulating layer 520 according to an embodiment may further include the fourth opening OP4 and the fifth opening OP5, compared to the first insulating layer 520 of FIG. 3.

The first opening OP1 may be formed to overlap the first electrode 210 in the third direction DR3 in the first sub-emission area CA1. The first opening OP1 may expose the end (hereinafter, referred to as "first end") located on the first electrode 210 side between both ends of the first light emitting elements ED1 in the first sub-emission area CA1.

The first opening OP1 may be an area partitioned by the first base portion 525A, the fourth base portion 525D, the first fixing pattern 521A, and the division pattern 522. As shown in the drawing, the inner walls of the first base portion 525A, the fourth base portion 525D, the first fixing pattern 521A, and the division pattern 522 may form a closed loop in a plan view, and the first opening OP1 may be defined by the inner walls of the first base portion 525A, the fourth base portion 525D, the first fixing pattern 521A, and the division pattern 522.

The second opening OP2 may be spaced apart from the first opening OP1. The second opening OP2 may be spaced apart from the first opening OP1 in a diagonal direction. The second opening OP2 may be formed to overlap the second electrode 220 in the third direction DR3 in the second sub-emission area CA2. The second opening OP2 may expose the end (hereinafter, referred to as "second end") located on the second electrode 220 side that is the opposite end of the end (hereinafter, referred to as "first end") located on the fourth electrode 240 side between both ends of the second light emitting elements ED2 in the second sub-emission area CA2.

The second opening OP2 may be an area partitioned by the second fixing pattern 521B, the division pattern 522 and the connection pattern 523. As shown in the drawing, the inner walls of the second fixing pattern 521B, the division pattern 522, and the connection pattern 523 may form a closed loop in a plan view, and the second opening OP2 may be defined by the inner walls of the second fixing pattern 521B, the division pattern 522, and the connection pattern 523.

The third opening OP3 may be spaced apart from the first opening OP1 and the second opening OP2. The third opening OP3 may be formed to surround parts of the second opening OP2 and the fifth opening OP5.

The third opening first area OP3_A may be spaced apart from the first opening OP1 and the second opening OP2. The third opening first area OP3_A may be located on the right side of the first opening OP1 and on the upper side of the second opening OP2 in a plan view. The third opening first area OP3_A may be formed to overlap the second electrode 220 and the third direction DR3 in the first sub-emission area CA1. The third opening OP3 may expose the end (hereinafter, referred to as "second end") located on the second electrode 220 side that is the opposite end of the end (hereinafter, referred to as "first end") located on the fourth electrode 240 side between both ends of the third light emitting elements ED3 in the first sub-emission area CA1.

The third opening first area OP3_A may be an area partitioned by the first base portion 525A, the third base portion 525C, the second fixing pattern 521B, and the division pattern 522. The third opening first area OP3_A may be defined by the inner walls of the first base portion 525A, the third base portion 525C, the second fixing pattern 521B, and the division pattern 522.

The third opening second area OP3_B may be spaced apart from the first opening OP1 and the second opening OP2. The third opening second area OP3_B may be located on the lower side of the first opening OP1 and on the left side of the second opening OP2. The third opening second area OP3_B may be formed to overlap the first electrode 210 in the third direction DR3 in the second sub-emission area CA2. The third opening second area OP3_B may expose the end ("first end") located on the first electrode 210 side between both ends of the fourth light emitting element ED4 in the second sub-emission area CA2.

The third opening second area OP3_B may be an area partitioned by the second base portion 525B, the fourth base portion 525D, the first fixing pattern 521A, and the division pattern 522. The third opening second area OP3_B may be defined by the inner walls of the second base portion 525B, the fourth base portion 525D, the first fixing pattern 521A, and the division pattern 522.

The third opening third area OP3_C may connect the third opening first area OP3_A to the third opening second area OP3_B. The third opening third area OP3_C may be formed to surround the outsides of the second opening OP2 and the fifth opening OP5. The third opening third area OP3_C may be spaced apart from the second opening OP2 and the fifth opening OP5. The third opening third area OP3_C may be disposed in the second sub-area NCA. The third opening third area OP3_C may be formed across the second sub-area NCA of the emission area EMA and the non-emission area. The third opening third area OP3_C may not overlap the first alignment area AA1 and the second alignment area AA2.

The third opening third area OP3_C may be an area partitioned by the second base portion 525B, the third base portion 525C, and the connection pattern 523. The third opening third area OP3_C may be defined by the inner walls of the second base portion 525B, the third base portion 525C, and the connection pattern 523.

The third opening first area OP3_A, the third opening second area OP3_B, the third opening third area OP3_C may be integrated to form one closed loop. The third opening first area OP3_A, the third opening second area OP3_B, the third opening third area OP3_C forming one closed loop may constitute the third opening OP3.

The fourth opening OP4 may be disposed between the first opening OP1 and the third opening first area OP3_A. The fourth opening OP4 may be spaced apart from the first opening OP1 and the third opening first area OP3_A. The fourth opening OP4 may be formed to overlap the third electrode 230 and the fourth electrode 240 in the third direction DR3 in the first sub-emission area CA1. The fourth opening OP4 may be formed to overlap the third sub-bank 430 in the third direction DR3 in the first sub-emission area CA1. The fourth opening OP4 may expose the second end located on the third electrode 230 side between both ends of the first light emitting elements ED1 in the first sub-emission area CA1 and the first end located on the fourth electrode 240 side between both ends of the third light emitting elements ED3.

The fourth opening OP4 may be an area partitioned by the first fixing pattern 521A, the second fixing pattern 521B, the division pattern 522, and the first base portion 525A. As shown in the drawing, the inner walls of the first fixing pattern 521A, the second fixing pattern 521B, the division pattern 522, and of the first base portion 525A may form a closed loop in a plan view, and the fourth opening OP4 may be defined by the inner walls of the first fixing pattern 521A, the second fixing pattern 521B, the division pattern 522, and the first base portion 525A.

The fifth opening OP5 may be disposed between the second opening OP2 and the third opening second area OP3_B. The fifth opening OP5 may be spaced apart from the second opening OP2 and the third opening second area OP3_B. The fifth opening OP5 may be formed to overlap the third electrode 230 and the fourth electrode 240 in the third direction DR3 in the second sub-emission area CA2. The fifth opening OP5 may be formed to overlap the third sub-bank 430 in the third direction DR3 in the second sub-emission area CA2. The fifth opening OP5 may expose the second end located on the third electrode 230 side between both ends of the fourth light emitting elements ED4 and the first end located on the fourth electrode 240 side between both ends of the second light emitting elements ED2 in the second sub-emission area CA2.

The fifth opening OP5 may be an area partitioned by the first fixing pattern 521A, the second fixing pattern 521B, the division pattern 522, and the connection pattern 523. As shown in the drawing, the inner walls of the first fixing pattern 521A, the second fixing pattern 521B, the division pattern 522, and the connection pattern 523 may form a closed loop in a plan view, and the fifth opening OP5 may be defined by the inner walls of the first fixing pattern 521A, the second fixing pattern 521B, the division pattern 522, and the connection pattern 523.

The contact electrode 700_2 may be disposed in the openings OP of the first insulating layer 520. The contact electrode 700_2 may include first to fifth contact electrodes 710, 720, 730, 740, and 750 spaced apart from each other.

The first contact electrode 710 may be disposed in the first opening OP1. The first contact electrode 710 may be in contact with the inner wall of the first insulating layer 520 that defines the first opening OP1. For example, the first contact electrode 710 may be disposed in contact with the inner walls of the first fixing pattern 521A, the division pattern 522, and the base portion 525 that define the first opening OP1.

The first contact electrode 710 may overlap the first electrode 210 in the third direction DR3 in the first sub-emission area CA1. The first contact electrode 710 may be electrically connected to the first electrode 210 while being in contact with a part of the top surface of the first electrode 210 through the first contact hole CNT1 in the first sub-emission area CA1. The first contact electrode 710 may be in contact with the first end of the first light emitting element ED1 exposed by the first fixing pattern 521A in the first sub-emission area CA1.

The second contact electrode 720 may be disposed in the second opening OP2. The second contact electrode 720 may be in contact with the inner wall of the first insulating layer 520 that defines the second opening OP2. For example, the second contact electrode 720 may be disposed in contact with the inner walls of the second fixing pattern 521B, the division pattern 522, and the connection pattern 523 that define the second opening OP2.

The second contact electrode 720 may overlap the second electrode 220 in the third direction DR3 in the second sub-emission area CA2. The second contact electrode 720 may be electrically connected to the second electrode 220 while being in contact with a part of the top surface of the second electrode 220 through the second contact hole CNT2 in the second sub-emission area CA2. The second contact electrode 720 may be in contact with the second end of the second light emitting element ED2 exposed by the second fixing pattern 521B in the second sub-emission area CA2.

The third contact electrode 730 may be disposed in the third opening OP3. The third contact electrode 730 may be in contact with the inner wall of the first insulating layer 520 that defines the third opening OP3.

The third contact electrode first area 731 may be disposed in the third opening first area OP3_A. The third contact electrode first area 731 may be in contact with the inner wall of the first insulating layer 520 that defines the third opening first area OP3_A. For example, the third contact electrode first area 731 may be disposed in contact with the inner walls of the second fixing pattern 521B, the division pattern 522, and the base portion 525 that define the third opening first area OP3_A.

The third contact electrode first area 731 may overlap the second electrode 220 in the third direction DR3 in the first sub-emission area CA1. The third contact electrode first area 731 may be in contact with the second end of the third light emitting element ED3 exposed by the second fixing pattern 521B in the first sub-emission area CA1.

The third contact electrode second area 732 may be disposed in the third opening second area OP3_B. The third contact electrode second area 732 may be in contact with the inner wall of the first insulating layer 520 that defines the third opening second area OP3_B. For example, the third contact electrode second area 732 may be disposed in contact with the inner walls of the first fixing pattern 521A, the division pattern 522, and the base portion 525 that define the third opening second area OP3_B.

The third contact electrode second area 732 may be disposed to overlap the first electrode 210 in the third direction DR3 in the second sub-emission area CA2. The third contact electrode second area 732 may be in contact with the first end of the fourth light emitting element ED4 exposed by the first fixing pattern 521A in the second sub-emission area CA2.

The third contact electrode third area 733 may be disposed in the third opening third area OP3_C. The third contact electrode third area 733 may be disposed between the third contact electrode first area 731 and the third contact electrode second area 732 to electrically connect them. The third contact electrode third area 733 may be in contact with the inner wall of the first insulating layer 520 that defines the third opening third area OP3_C. For example, the third contact electrode third area 733 may be disposed in contact with the inner walls of the connection pattern 523 and the base portion 525 that define the third opening third area OP3_C.

The third contact electrode third area 733 may be disposed to surround the second contact electrode 720 and the fifth contact electrode 750. The third contact electrode third area 733 may be formed across the second sub-area NCA of the emission area EMA and the non-emission area. The third contact electrode third area 733 may not be disposed in the first alignment area AA1 and the second alignment area AA2.

The fourth contact electrode 740 may be disposed in the fourth opening OP4. The fourth contact electrode 740 may be in contact with the inner wall of the first insulating layer 520 that defines the fourth opening OP4. For example, the fourth contact electrode 740 may be disposed in contact with the inner walls of the first fixing pattern 521A, the second fixing pattern 521B, the division pattern 522, and the first base portion 525A that define the fourth opening OP4.

The fourth contact electrode 740 may overlap the third electrode 230 and the fourth electrode 240 in the third direction DR3 in the first sub-emission area CA1. The fourth contact electrode 740 may be in contact with the second end of the first light emitting element ED1 exposed by the first fixing pattern 521A and the first end of the third light emitting element ED3 exposed by the second fixing pattern 521B in the first sub-emission area CA1.

The fifth contact electrode 750 may be disposed in the fifth opening OP5. The fifth contact electrode 750 may be in contact with the inner wall of the first insulating layer 520 that defines the fifth opening OP5. For example, the fifth contact electrode 750 may be disposed in contact with the inner walls of the first fixing pattern 521A, the second fixing pattern 521B, the division pattern 522, and the connection pattern 523 that define the fifth opening OP5.

The fifth contact electrode 750 may overlap the third electrode 230 and the fourth electrode 240 in the third direction DR3 in the second sub-emission area CA2. The fifth contact electrode 750 may be in contact with the second end of the fourth light emitting element ED4 exposed by the first fixing pattern 521A and the first end of the second light emitting element ED2 exposed by the second fixing pattern 521B in the second sub-emission area CA2.

The first to fifth contact electrodes 710, 720, 730, 740, and 750 may be spaced apart from each other with a part of the first insulating layer 520 interposed therebetween.

For example, the first contact electrode 710 and the fourth contact electrode 740 may be spaced apart from each other with the first fixing pattern 521A interposed therebetween in the first sub-emission area CA1. The third contact electrode first area 731 and the fourth contact electrode 740 may be spaced apart from each other with the second fixing pattern 521B interposed therebetween in the first sub-emission area CA1.

The third contact electrode second area 732 and the fifth contact electrode 750 may be spaced apart from each other with the first fixing pattern 521A interposed therebetween in the second sub-emission area CA2. The fifth contact electrode 750 and the second contact electrode 720 may be spaced apart from each other with the second fixing pattern 521B interposed therebetween in the second sub-emission area CA2.

The third contact electrode third area 733 surrounding the second contact electrode 720 and the fifth contact electrode 750 may be spaced apart from the second contact electrode 720 and the fifth contact electrode 750 with the connection pattern 523 interposed therebetween.

The first contact electrode 710 and the third contact electrode second area 732 may be spaced apart from each other with the division pattern 522 interposed therebetween. The fourth contact electrode 740 and the fifth contact electrode 750 may be spaced apart from each other with the division pattern 522 interposed therebetween. The second contact electrode 720 and the third contact electrode first area 731 may be spaced apart from each other with the division pattern 522 interposed therebetween.

Figure 20:
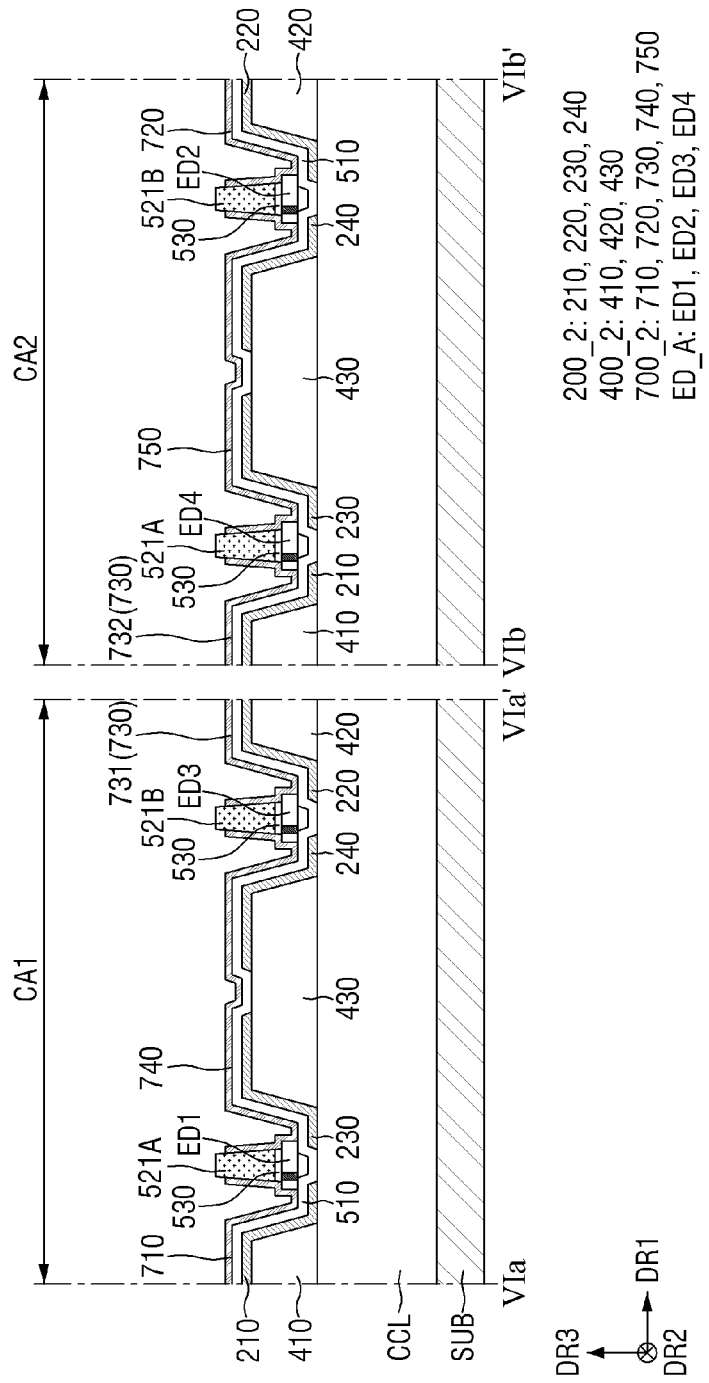
FIG. 20 is a schematic cross-sectional view taken along lines VIa-VIa' and VIb-VIb' of FIG. 17.
Figure 21:
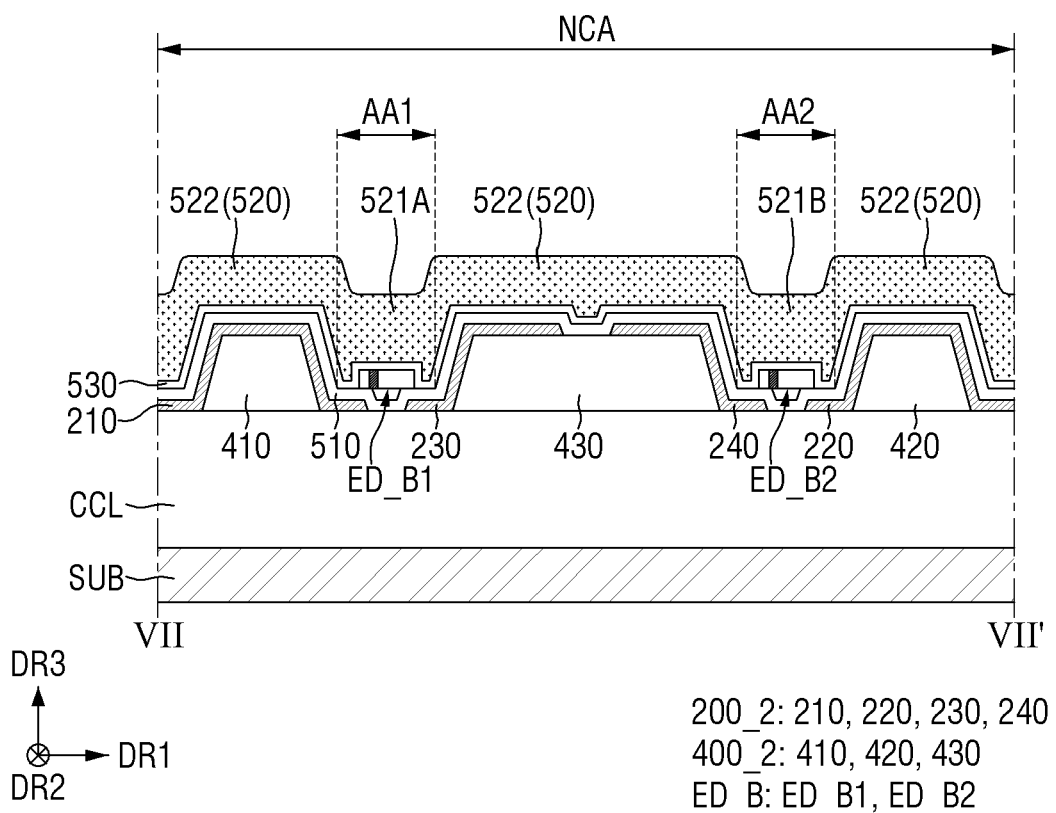
FIG. 21 is a schematic cross-sectional view taken along line VII-VII' of FIG. 17.

FIG. 20 is a schematic cross-sectional view taken along lines VIa-VIa' and VIb-VIb' of FIG. 17. FIG. 21 is a schematic cross-sectional view taken along line VII-VII' of FIG. 17.

Referring to FIGS. 17, 20 and 21, the third insulating layer 530 interposed between the light emitting elements ED_2 and the first insulating layer 520 may be substantially the same as the pattern of the first insulating layer 520. Therefore, the third insulating layer 530 may be disposed between the first and second fixing patterns 521A and 521B and the first type light emitting element ED_A in the first sub-emission area CA1 and the second sub-emission area CA2 to expose both ends of the first type light emitting element ED_A. On the other hand, the third insulating layer 530 may be disposed between the division pattern 522 and the second type light emitting element ED_B in the second sub-area NCA to completely cover or overlap the second type light emitting element ED_B.

The first contact electrode 710 may be in contact with the first end of the first light emitting element ED1 exposed by the third insulating layer 530 and the first fixing pattern 521A in the first sub-emission area CA1. The first contact electrode 710 may be disposed on the side surface of the first fixing pattern 521A but may not be disposed on the top surface of the first fixing pattern 521A.

The fourth contact electrode 740 may be in contact with the second end of the first light emitting element ED1 exposed by the third insulating layer 530 and the first fixing pattern 521A and the first end of the third light emitting element ED3 exposed by the third insulating layer 530 and the second fixing pattern 521B in the first sub-emission area CA1. The fourth contact electrode 740 may be disposed on the side surfaces of the first fixing pattern 521A and the second fixing pattern 521B, but may not be disposed on the top surfaces of the first fixing pattern 521A and the second fixing pattern 521B. One end of the fourth contact electrode 740 may face the first contact electrode 710 while being spaced apart therefrom with the first fixing pattern 521A interposed therebetween, and the other end of the fourth contact electrode 740 may face the third contact electrode 730 (or the third contact electrode first area 731) while being spaced apart therefrom with the second fixing pattern 521B interposed therebetween.

The second insulating layer 510 may be interposed between the fourth contact electrode 740 and the electrode layer 200_2. The fourth contact electrode 740 may be insulated from the third electrode 230 and the fourth electrode 240 by the second insulating layer 510. The fourth contact electrode 740 may be a connection electrode that electrically connects the first light emitting element ED1 and the first light emitting element ED1 in series while being in contact with the second end of the first light emitting element ED1 and the first end of the third light emitting element ED3.

The third contact electrode first area 731 may be in contact with the second end of the third light emitting element ED3 exposed by the third insulating layer 530 and the second fixing pattern 521B in the first sub-emission area CA1. The third contact electrode first area 731 may be disposed on the side surface of the second fixing pattern 521B, but may not be disposed on the top surface of the second fixing pattern 521B. The third contact electrode first area 731 may face the fourth contact electrode 740 while being spaced apart therefrom with the second fixing pattern 521B interposed therebetween.

The third contact electrode second area 732 may be in contact with the first end of the fourth light emitting element ED4 exposed by the third insulating layer 530 and the first fixing pattern 521A in the second sub-emission area CA2. The third contact electrode second area 732 may be disposed on the side surface of the first fixing pattern 521A, but may not be disposed on the top surface of the first fixing pattern 521A.

The second insulating layer 510 may be interposed between the third contact electrode 730 and the electrode layer 200_2. The third contact electrode 730 may be insulated from the first electrode 210 and the second electrode 220 by the second insulating layer 510. The third contact electrode 730 may be a connection electrode that electrically connects the third light emitting element ED3 and the fourth light emitting element ED4 in series while being in contact with the second end of the third light emitting element ED3 and the first end of the fourth light emitting element ED4.

The fifth contact electrode 750 may be in contact with the second end of the fourth light emitting element ED4 exposed by the third insulating layer 530 and the first fixing pattern 521A and the first end of the second light emitting element ED2 exposed by the third insulating layer 530 and the second fixing pattern 521B in the second sub-emission area CA2. The fifth contact electrode 750 may be disposed on the side surfaces of the first fixing pattern 521A and the second fixing pattern 521B, but may not be disposed on the top surfaces of the first fixing pattern 521A and the second fixing pattern 521B. One end of the fifth contact electrode 750 may face the third contact electrode second area 732 while being spaced apart therefrom with the first fixing pattern 521A interposed therebetween, and the other end of the fifth contact electrode 750 may face the second contact electrode 720 while being spaced apart therefrom with the second fixing pattern 521B interposed therebetween.

The second insulating layer 510 may be interposed between the fifth contact electrode 750 and the electrode layer 200_2. The fifth contact electrode 750 may be insulated from the third electrode 230 and the fourth electrode 240 by the second insulating layer 510. The fifth contact electrode 750 may be a connection electrode that electrically connects the fourth light emitting element ED4 and the second light emitting element ED2 in series while being in contact with the second end of the fourth light emitting element ED4 and the first end of the second light emitting element ED2.

The second contact electrode 720 may be in contact with the second end of the second light emitting element ED2 exposed by the third insulating layer 530 and the second fixing pattern 521B in the second sub-emission area CA2. The second contact electrode 720 may be disposed on the side surface of the second fixing pattern 521B but may not be disposed on the top surface of the second fixing pattern 521B. The second contact electrode 720 may face the fifth contact electrode 750 while being spaced apart therefrom with the second fixing pattern 521B interposed therebetween.

The first insulating layer 520 and the third insulating layer 530 may be arranged to extend in the first direction DR1 in the second sub-area NCA located between the first sub-emission area CA1 and the second sub-emission area CA2. The first insulating layer 520 and the third insulating layer 530 may be arranged to cover or overlap the member disposed therebelow in the second sub-area NCA located between the first sub-emission area CA1 and the second sub-emission area CA2. Therefore, the first insulating layer 520 and the third insulating layer 530 may completely cover or overlap the second type light emitting element ED_B disposed in the first alignment area AA1 and the second alignment area AA2 overlapping the second sub-area NCA. For example, the first and second fixing patterns 521A and 521B of the first insulating layer 520 may extend in the second direction DR2 without disconnection in the first and second alignment areas AA1 and AA2 to fix the light emitting elements ED_2 arranged in the first and second alignment areas AA1 and AA2, respectively. Further, since the division pattern 522 of the first insulating layer 520 is formed to extend in the first direction DR1 between the first sub-emission area CA1 and the second sub-emission area CA2, the division pattern 522 distinguishes the first sub-emission area CA1 and the second sub-emission area CA2 and completely covers or overlaps the second type light emitting element ED_B disposed in the second sub-area NCA to prevent the contact between the second type light emitting element ED_B and the contact electrode 700_2.

In the display device 10 according to an embodiment, the fixing pattern 521 is disposed without disconnection in the alignment area AA_2 where the light emitting elements ED_2 are arranged, so that it is possible to prevent the light emitting elements ED_2 from being separated from the alignment area AA_2. Further, although the fixing pattern 521 is disposed without disconnection in the alignment area AA_2, the light emitting elements ED_2 may be electrically connected in series in four stages by forming a part of the third contact electrode 730 that electrically connects the light emitting element ED_2 disposed in the first sub-emission area CA1 located on the upper side in the emission area EMA in a plan view to the light emitting element ED_2 disposed in the second sub-emission area CA2 located on the lower side in the emission area EMA in a plan view to bypass the outside of the sub-emission area CA. Therefore, it is possible to improve the quality of the display device 10 by preventing the separation of the light emitting elements ED_2 arranged in the alignment area AA_2 while maintaining the number of series connections of the light emitting elements ED_2.

Figure 22:
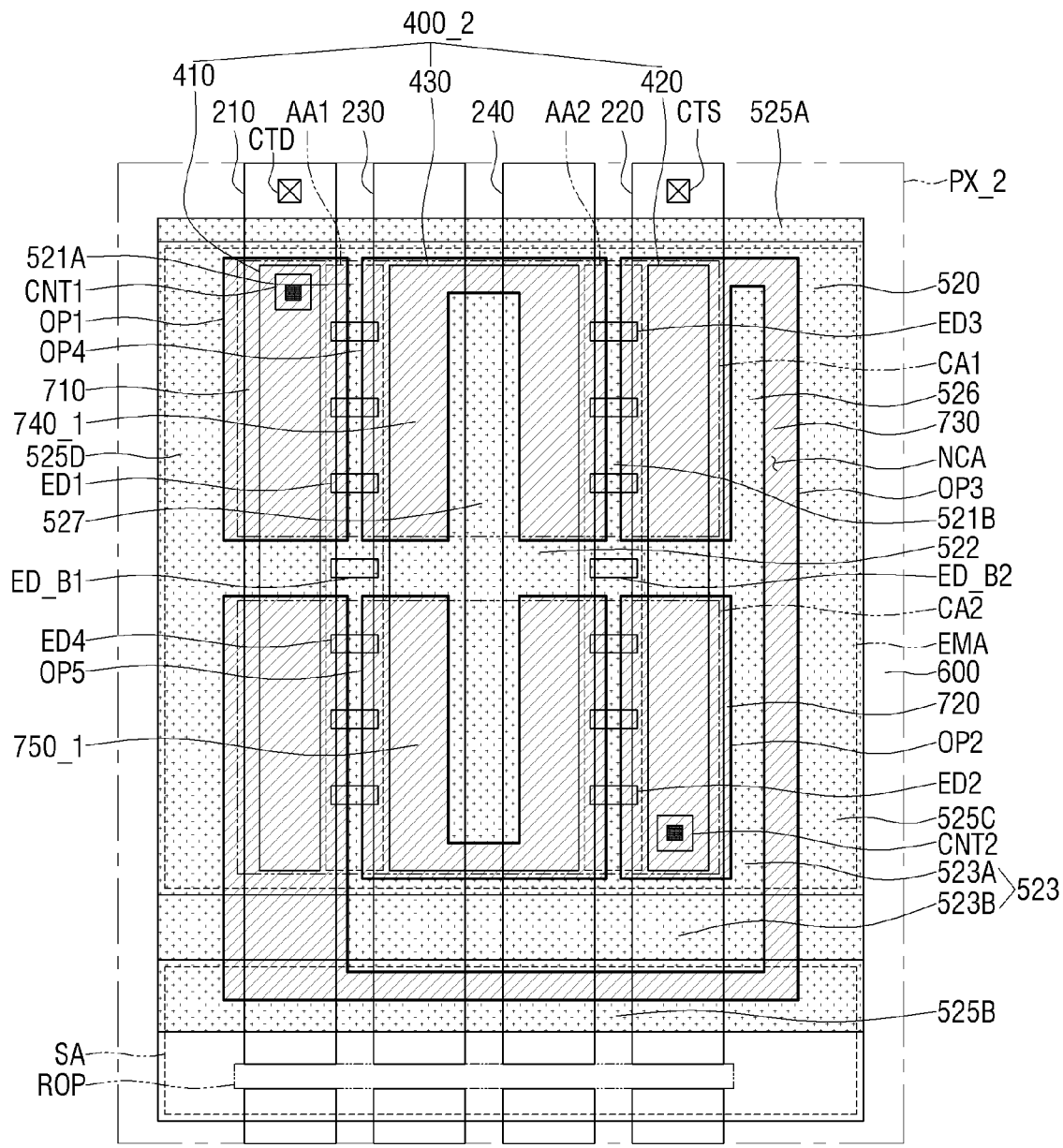
FIG. 22 is a schematic plan view illustrating one pixel of a display device according to an embodiment.

FIG. 22 is a plan view illustrating one pixel of a display device according to an embodiment.

Referring to FIG. 22, one pixel PX_2 of the display device 10 according to embodiment may be different from an embodiment of FIG. 17 in that a first auxiliary pattern 526 and a second auxiliary pattern 527 branched from the division pattern 522 may be further included.

For example, the first insulating layer 520 may include the first auxiliary pattern 526 and the second auxiliary pattern 527 branched from the division pattern 522 in the second direction DR2. The first auxiliary pattern 526 may include the first auxiliary pattern 526 extending in the second direction DR2 from the first end of the division pattern 522 and the first sub-connection pattern 523A of the connection pattern 523. The first auxiliary pattern 526 may extend in the second direction DR2 and may be spaced apart from the first base portion 525A.

The second auxiliary pattern 527 may be branched from the division pattern 522 in the second direction DR2. The second auxiliary pattern 527 may be disposed between the first fixing pattern 521A and the second fixing pattern 521B. The second auxiliary pattern 527 may be branched from the division pattern 522 to extend in the second direction DR2, and may be spaced apart from the first base portion 525A and the second sub-connection pattern 523B of the connection pattern 523. Therefore, due to the second auxiliary pattern 527, a fourth contact electrode 740_1 and a fifth contact electrode 750_1 may have a "U" shape or substantially "U" shape in a plan view. The first light emitting element ED1 and the third light emitting element ED3 may be electrically connected in series through the fourth contact electrode 740_1, and the fourth light emitting element ED4 and the second light emitting element ED2 may be electrically connected in series through the fifth contact electrode 750_1.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
   an electrode layer including:
      a first electrode; and
      a second electrode, wherein
         the first electrode and the second electrode extend in a first direction and are spaced apart from each other in a second direction intersecting the first direction;
      light emitting elements disposed on the electrode layer in an area where the first electrode and the second electrode face each other;
   an insulating layer disposed on the light emitting elements and including openings exposing at least one of ends of a part of the light emitting elements; and
   contact electrodes each contact electrode of the contact electrodes being at least partially disposed in a respective opening of the openings,
   wherein the insulating layer includes:
      a fixing pattern extending in the first direction between the first electrode and the second electrode;
      a division pattern intersecting the fixing pattern and extending in the second direction;
      a connection pattern connecting a first end of the fixing pattern to a first end of the division pattern; and
      a base portion surrounding the fixing pattern, the division pattern, and the connection pattern, and
   wherein
      the base portion is connected to a second end of the fixing pattern and a second end of the division pattern and spaced apart from the connection pattern, and
      at least one opening of the openings is at least partially bounded by each of the fixing pattern, the division pattern, the connection pattern, and the base portion.

2. The display device of claim 1, wherein the openings include:
   a first opening formed by a sidewall of the fixing pattern, a sidewall of the division pattern, and a sidewall of the base portion;
   a second opening formed by the sidewall of the fixing pattern, the sidewall of the division pattern, and a sidewall of the connection pattern; and
   a third opening surrounding the second opening and formed by the sidewall of the fixing pattern, the sidewall of the division pattern, the sidewall of the connection pattern, and the sidewall of the base portion.

3. The display device of claim 2, wherein the contact electrodes include:
   a first contact electrode disposed in the first opening;
   a second contact electrode disposed in the second opening; and
   a third contact electrode disposed in the third opening of the insulating layer.

4. The display device of claim 3, wherein
the first contact electrode contacts a sidewall of the insulating layer forming the first opening,
the second contact electrode contacts a sidewall of the insulating layer forming the second opening, and
the third contact electrode contacts a sidewall of the insulating layer forming the third opening.

5. The display device of claim 2, wherein
the first opening is disposed at a side in the first direction with respect to the division pattern and overlaps the first electrode,
the second opening is disposed at an other side in the first direction with respect to the division pattern and overlaps the second electrode, and
the third opening includes:
  a first area disposed at the side in the first direction with respect to the division pattern and overlaps the second electrode;
  a second area disposed at the other side in the first direction with respect to the division pattern and overlaps the first electrode; and
  a third area connecting the first area of the third opening to the second area of the third opening of the insulating layer.

6. The display device of claim 5, wherein
the contact electrodes include:
  a first contact electrode disposed in the first opening and electrically contacting a first end of a light emitting element of the light emitting elements;
  a second contact electrode disposed in the second opening and electrically contacting a second end of an other light emitting element of the light emitting elements; and
  a third contact electrode disposed in the third opening, and
the third contact electrode includes:
  a first area disposed in the first area of the third opening and electrically contacting a second end of the light emitting element of the light emitting elements;
  a second area disposed in the second area of the third opening and electrically contacting a first end of the other light emitting element of the light emitting elements; and
  a third area electrically connecting the first area of the third contact electrode to the second area of the third contact electrode.

7. The display device of claim 6, wherein the light emitting elements include:
  a first type light emitting element having ends electrically contacting one of the contact electrodes; and
  a second type light emitting element having ends not electrically contacting the one of the contact electrodes.

8. The display device of claim 7, wherein
the fixing pattern exposes ends of the first type light emitting element,
the first type light emitting element includes:
  a first light emitting element having a first end electrically contacting the first contact electrode; and
  a second light emitting element having a second end electrically contacting the second contact electrode, and
  the second type light emitting element completely overlaps the fixing pattern and the division pattern.

9. The display device of claim 8, wherein the first light emitting element and the second light emitting element are electrically connected in series.

10. The display device of claim 8, wherein
a second end of the first light emitting element electrically contacts the first area of the third contact electrode, and
a first end of the second light emitting element electrically contacts the second area of the third contact electrode.

11. A display device comprising:
pixels disposed on a substrate, each pixel including:
  a sub-emission area including a first sub-emission area and a second sub-emission area spaced apart from the first sub-emission area in a first direction; and
  a sub-area surrounding the sub-emission area, wherein
each of the pixels includes:
  an electrode layer including a first electrode and a second electrode spaced apart from each other in a second direction intersecting the first direction, wherein the first electrode and the second electrode each extend in the first direction and traverse the first sub-emission area and the second sub-emission area;
  light emitting elements disposed between the first electrode and the second electrode in an alignment area extending in the first direction and traversing the first sub-emission area and the second sub-emission area;
  an insulating layer disposed on the light emitting elements and including openings spaced apart from each other; and
  contact electrodes, each contact electrode of the contact electrodes being at least partially disposed in a respective opening of the openings,
the insulating layer includes:
  a fixing pattern extending in the first direction in the alignment area;
  a division pattern disposed in the sub-area between the first sub-emission area and the second sub-emission area and extending in the second direction;
  a connection pattern connecting a first end of the fixing pattern to a first end of the division pattern in the sub-area; and
  a base portion surrounding the fixing pattern, the division pattern, and the connection pattern, connected to a second end of the fixing pattern and a second end of the division pattern, and spaced apart from the connection pattern, and
the openings include a third opening, the third opening including:
  a third opening first area overlapping the second electrode in the first sub-emission area and exposing a second end of a light emitting element of the light emitting elements,
  a third opening second area overlapping the first electrode in the second sub-emission area and exposing a first end of an other light emitting element of the light emitting elements, and
  a third opening third area connecting the third opening first area to the third opening second area.

12. The display device of claim 11, wherein the fixing pattern is continuous in the first direction in the alignment area.

13. The display device of claim 11, wherein the third opening third area does not overlap the alignment area.

14. The display device of claim 11, wherein
the openings further include:
  a first opening overlapping the first electrode in the first sub-emission area and exposing a first end of the light emitting element of the light emitting elements;
  a second opening overlapping the second electrode in the second sub-emission area and exposing a second end of the other light emitting element of the light emitting elements.

15. The display device of claim 14, wherein the third opening third area surrounds an outside of the second opening of the insulating layer.

16. The display device of claim 14, wherein
the contact electrodes include:
- a first contact electrode disposed in the first opening and electrically contacting the first end of the light emitting element of the light emitting elements;
- a second contact electrode disposed in the second opening and electrically contacting the second end of the other light emitting element of the light emitting elements; and
- a third contact electrode disposed in the third opening, and the third contact electrode includes:
- a third contact electrode first area disposed in the third opening first area and electrically contacting the second end of the light emitting element of the light emitting elements;
- a third contact electrode second area disposed in the third opening second area and electrically contacting the first end of the other light emitting element of the light emitting elements; and
- a third contact electrode third area disposed in the third opening third area and electrically connecting the third contact electrode first area to the third contact electrode second area.

17. The display device of claim 16, wherein the third contact electrode third area is not disposed in the alignment area.

18. The display device of claim 16, wherein
the electrode layer includes:
- a third electrode disposed between the first electrode and the second electrode; and
- a fourth electrode disposed between the second electrode and the third electrode, and the alignment area includes:
- a first alignment area disposed between the first electrode and the third electrode; and
- a second alignment area disposed between the fourth electrode and the second electrode.

19. The display device of claim 18, wherein
the light emitting elements include:
- a first type light emitting element having ends electrically contacting one of the contact electrodes; and
- a second type light emitting element having ends not electrically contacting the one of the contact electrodes, and the first type light emitting element includes:
- a first light emitting element disposed in the first alignment area in the first sub-emission area;
- a second light emitting element disposed in the second alignment area in the second sub-emission area;
- a third light emitting element disposed in the second alignment area in the first sub-emission area; and
- a fourth light emitting element disposed in the first alignment area in the second sub-emission area.

20. The display device of claim 19, wherein the openings include:
- a fourth opening disposed between the first opening and the third opening first area in the first sub-emission area, and exposing a second end of the first light emitting element and a first end of the third light emitting element; and
- a fifth opening disposed between the second opening and the third opening second area in the second sub-emission area and exposing a second end of the fourth light emitting element and a first end of the second light emitting element.

21. The display device of claim 20, wherein
the contact electrode includes:
- a fourth contact electrode disposed in the fourth opening and electrically contacting the second end of the first light emitting element and the first end of the third light emitting element; and
- a fifth contact electrode disposed in the fifth opening and electrically contacting the second end of the fourth light emitting element and the first end of the second light emitting element.

22. The display device of claim 19, wherein the first light emitting element, the second light emitting element, the third light emitting element, and the fourth light emitting element are electrically connected in series.

23. The display device of claim 18, wherein the fixing pattern includes:
- a first fixing pattern disposed in the first alignment area; and
- a second fixing pattern disposed in the second alignment area.

24. The display device of claim 11, wherein
the fixing pattern and the division pattern intersect each other,
ends of the light emitting elements disposed in the sub-emission area are exposed by the fixing pattern, and
light emitting elements disposed in the sub-area completely overlap the fixing pattern and the division pattern.

* * * * *